(12) United States Patent
Chou et al.

(10) Patent No.: US 9,601,402 B2
(45) Date of Patent: Mar. 21, 2017

(54) PACKAGE APPARATUS AND MANUFACTURING METHOD THEREOF

(71) Applicant: PHOENIX PIONEER TECHNOLOGY CO., LTD., Hsinchu County (TW)

(72) Inventors: E-Tung Chou, Hsinchu County (TW); Chu-Chin Hu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 252 days.

(21) Appl. No.: 14/505,973

(22) Filed: Oct. 3, 2014

(65) Prior Publication Data
US 2015/0235916 A1 Aug. 20, 2015

(30) Foreign Application Priority Data

Feb. 14, 2014 (TW) .............................. 103104896 A
Feb. 14, 2014 (TW) .............................. 103104900 A
Feb. 14, 2014 (TW) .............................. 103104902 A

(51) Int. Cl.
*H01L 23/31* (2006.01)
*H01L 21/56* (2006.01)
(Continued)

(52) U.S. Cl.
CPC ........ *H01L 23/3128* (2013.01); *H01L 21/561* (2013.01); *H01L 21/565* (2013.01);
(Continued)

(58) Field of Classification Search
CPC .......... H05K 1/186; H05K 3/007; H05K 3/32; H05K 2201/10015; H05K 2203/06; H05K 2203/1305; H01L 23/3128; H01L 23/49827; H01L 23/49822; H01L 23/49838; H01L 21/4857; H01L 23/4952; H01L 21/4825; H01L 23/49534; H01L 21/565; H01L 2224/73204; H01L 2924/181; H01L 2224/81; H01L 2224/16145; H01L 25/50; H01L 25/0657; H01L 23/481; H01L 23/3114; H01L 21/563; H01L 2224/12105; H01L 2224/11
See application file for complete search history.

(56) References Cited

U.S. PATENT DOCUMENTS 8,786,062 B2 * 7/2014 Su ....................... H01L 21/6835
257/669

* cited by examiner

*Primary Examiner* — Roy Potter
(74) *Attorney, Agent, or Firm* — WPAT, PC; Justin King

(57) ABSTRACT

A package apparatus comprises a first wiring layer, a metal layer, a conductive pillar layer, a passive component, a first molding compound layer, a second wiring layer, and a protection layer. The first wiring layer has a first surface and a second surface opposite to each other. The metal layer is disposed on the first surface of the first wiring layer. The conductive pillar layer is disposed on the second surface of the first wiring layer. The passive component is disposed on the second surface of the first wiring layer. The first molding compound layer is disposed within a part of the zone of the first wiring layer and the conductive pillar layer. The second wiring layer is disposed on the first molding compound layer and one end of the conductive pillar layer. The protection layer is disposed on the first molding compound layer and the second wiring layer.

34 Claims, 53 Drawing Sheets

(51) Int. Cl.
*H01L 23/538* (2006.01)
*H01L 25/065* (2006.01)
*H05K 1/18* (2006.01)

(52) U.S. Cl.
CPC ...... *H01L 23/5389* (2013.01); *H01L 25/0657* (2013.01); *H01L 2224/18* (2013.01); *H05K 1/185* (2013.01); *H05K 2201/1053* (2013.01)

--PRIOR ART--

302   300   304

320   302   300   304

320   302   300   304

PACKAGE APPARATUS AND MANUFACTURING METHOD THEREOF

FIELD OF THE INVENTION

The present invention relates to a package apparatus and manufacturing method thereof, and more particularly, to a semiconductor package apparatus and method for manufacturing the same.

BACKGROUND OF THE INVENTION

With the design trend in electronic devices is toward lighter, smaller, thinner but more functional devices with performance requirements continuing to increase, device manufacturers increasingly need specialty integrated circuit (IC) solutions for allowing billions of miniature electronic components to be densely packed in a small area. Thus, device manufacturers come up with innovative packaging techniques for embedding electronic components in a substrate while allowing shorter traces between the electronic components and the substrate. In addition, the layout area is increased by the use of built-up technique as the technology advances for achieving lighter, smaller, thinner and more functional high-performance devices.

Please refer to FIG. 1, which shows a conventional fiberglass substrate packaging structure. In FIG. 1, the fiberglass substrate packaging structure 1 has a fiberglass substrate 100, which can be made of a FR-4 or FR-5 fiberglass epoxy resin copper clad laminate. In addition, the fiberglass substrate 100 is formed with a groove 110 and a plurality of via holes 120 by a laser via method, by that the groove 110 can be used for receiving and holding an electronic component 130, while a portion of the plural via holes 120 can be provided for receiving a conductive metal pillar 140. As shown in FIG. 1, the two first conductive metal layers 142, 144 are respectively disposed on the fiberglass substrate 100 while allowing the two to connected electrically to the conductive metal pillar 140; the groove 110 is covered and sealed by an insulation layer 150, whereas the electronic component 130, the plural via holes 120, two second conductive metal layers 146, 148 to be disposed on the insulation layer 150 while being connected electrically to the electronic component 130 and the two first conductive metal layers 142, 144.

However, the aforesaid conventional fiberglass substrate packaging structure is disadvantageous in that: it can be very costly for using a fiberglass substrate as its substrate; and as the blind/buried vias in the aforesaid four-layered metal laminated structure are formed by the repetition of a laser via method, such repetition can be a complex and time consuming process and also the cost for fabricating the four-layered metal laminated structure can be costly. Therefore, the aforesaid conventional fiberglass substrate packaging structure does not have industrial advantages.

SUMMARY OF THE INVENTION

The present invention provides a package apparatus, by which a molding compound layer can be used as the major material in the manufacturing of a coreless substrate, whereas passive components can be embedded into the coreless substrate in the manufacturing process during the formation of via holes in a plating conductive layer and using a molded interconnection substrate (MIS). Thereby, a simple two-layered metal laminated structure with embedded passive components can be achieved.

The present invention provides a method for manufacturing a package apparatus, using which not only a less expensive molding compound substrate can be used for replacing the costly conventional fiberglass substrate, but also the conventional expensive and time consuming laser blind/buried hole formation process on four-layered structure can be replaced by a faster and simpler electroplating conductive pillar process on less costly two-layered structure.

The present invention provides a package apparatus, by which a molding compound layer can be used as the major material in the manufacturing of a coreless substrate, whereas passive components can be embedded into the coreless substrate in the manufacturing process during the formation of via holes in a plating conductive layer and using a molded interconnection substrate (MIS). Thereby, a simple three-layered metal laminated structure with embedded passive components can be achieved.

The present invention provides a method for manufacturing a package apparatus, using which not only a less expensive molding compound substrate can be used for replacing the costly conventional fiberglass substrate, but also the conventional expensive and time consuming laser blind/buried hole formation process on four-layered structure can be replaced by a faster and simpler electroplating conductive pillar process on less costly three-layered structure.

In a first embodiment, the present invention provides a package apparatus, which comprises: a first wiring layer, a metal layer, a conductive pillar layer, a passive component, a first molding compound layer, a second wiring layer, and a protection layer. The first wiring layer has a first surface and a second surface that are arranged opposite to each other. The metal layer is disposed on the first surface of the first wiring layer. The conductive pillar layer is disposed on the second surface of the first wiring layer, forming a concave structure with the first wiring layer. The passive component is disposed on and electrically connected to the second surface of the first wiring layer in the concave structure. The first molding compound layer is disposed on a portion of the first wiring layer and the conductive pillar layer while allowing the same to cover the passive component in a manner that the first molding compound layer is not exposed on the first surface of the first wiring layer and one end of the conductive pillar layer. The second wiring layer is disposed on the first molding compound layer and the end of the conductive pillar layer. The protection layer is disposed on the first molding compound layer and the second wiring layer.

Corresponding to the first embodiment, the present invention provides a method for manufacturing a package apparatus, which comprises the steps of: providing a metal carrier composed of a first side and a second side that are arranged opposite to each other; forming a first wiring layer on the second side; forming a conductive pillar layer on the first wiring layer while allowing the conductive pillar layer to form a concave structure with the first wiring layer; providing a passive component to be disposed on and electrically connected to the first wiring layer in the concave structure; forming a first molding compound layer while allowing the same to cover the first wiring layer, the passive component, the conductive pillar layer and the second side of the metal carrier; enabling one end of the conductive pillar layer to be exposed; forming a second wiring layer on the first molding compound layer and the exposed end of the conductive pillar layer; forming a protection layer on the first molding compound layer and the second wiring layer; and removing a portion of the metal carrier so as to form a window while allowing the first wiring layer and the first molding compound layer to be exposed therefrom.

In a second embodiment, the present invention provides a package apparatus, which comprises: a first wiring layer, a metal layer, a first dielectric material layer, a conductive pillar layer, a passive component, a first molding compound layer, a second wiring layer, and a protection layer. The first wiring layer has a first surface and a second surface that are arranged opposite to each other. The metal layer is disposed on the first surface of the first wiring layer. The first dielectric material layer is disposed on a specific portion of the first wiring layer in a manner that the first dielectric material layer is not to be exposed on the first surface of the first wiring layer while being positioned not lower than the second surface of the first wiring layer. The conductive pillar layer is disposed on the second surface of the first wiring layer, forming a concave structure with the first wiring layer. The passive component is disposed on and electrically connected to the second surface of the first wiring layer in the concave structure. The first molding compound layer is disposed on a portion of the conductive pillar layer while allowing the same to cover the passive component in a manner that the first molding compound layer is not exposed on one end of the conductive pillar layer. The second wiring layer is disposed on the first molding compound layer and the end of the conductive pillar layer. The protection layer is disposed on the first molding compound layer and the second wiring layer.

Corresponding to the second embodiment, the present invention provides a method for manufacturing a package apparatus, which comprises the steps of: providing a metal carrier composed of a first side and a second side that are arranged opposite to each other; forming a first dielectric material layer on the second side of the metal carrier; forming a first wiring layer on the second side of the metal carrier while allowing the first dielectric material layer to be disposed on a specific portion of the first wiring layer in a manner that the first dielectric material layer is not lower than the first wiring layer; forming a conductive pillar layer on the first wiring layer while allowing the conductive pillar layer to form a concave structure with the first wiring layer; providing a passive component to be disposed on and electrically connected to the first wiring layer in the concave structure; forming a first molding compound layer while allowing the same to cover the first dielectric material layer, the first wiring layer, the passive component, the conductive pillar layer and the second side of the metal carrier; enabling one end of the conductive pillar layer to be exposed; forming a second wiring layer on the first molding compound layer and the exposed end of the conductive pillar layer; forming a protection layer on the first molding compound layer and the second wiring layer; and removing a portion of the metal carrier so as to form a window while allowing the first wiring layer and the first dielectric material layer to be exposed therefrom.

In a third embodiment, the present invention provides a package apparatus, which comprises: a first wiring layer, a metal layer, a first dielectric material layer, a second dielectric material layer, a conductor layer, a conductive pillar layer, a passive component, a first molding compound layer, a second wiring layer, and a protection layer. The first wiring layer has a first surface and a second surface that are arranged opposite to each other. The metal layer is disposed on the first surface of the first wiring layer. The first dielectric material layer is disposed on a specific portion of the first wiring layer in a manner that the first dielectric material layer is not to be exposed on the first surface of the first wiring layer while being positioned not lower than the second surface of the first wiring layer. The second dielectric material layer is disposed on the first dielectric material layer. The conductor layer is disposed on the first wiring layer. The conductive pillar layer is disposed on the conductor layer, forming a concave structure with the conductor layer.

The passive component is disposed on and electrically connected to the second surface of the first wiring layer in the concave structure. The first molding compound layer is disposed on a portion of the second dielectric material layer, the conductor layer and the conductive pillar layer while allowing the same to cover the passive component in a manner that the first molding compound layer is not exposed on one end of the conductive pillar layer. The second wiring layer is disposed on the first molding compound layer and the end of the conductive pillar layer. The protection layer is disposed on the first molding compound layer and the second wiring layer.

Corresponding to the third embodiment, the present invention provides a method for manufacturing a package apparatus, which comprises the steps of: providing a metal carrier composed of a first side and a second side that are arranged opposite to each other; forming a first dielectric material layer on the second side of the metal carrier; forming a first wiring layer on the second side of the metal carrier while allowing the first dielectric material layer to be disposed on a specific portion of the first wiring layer in a manner that the first dielectric material layer is not lower than the first wiring layer; forming a second dielectric material layer on the first dielectric material layer; forming a conductor layer on the first wiring layer; forming a conductive pillar layer on the conductor layer while allowing the conductive pillar layer to form a concave structure with the conductor layer; providing a passive component to be disposed on and electrically connected to the first wiring layer in the concave structure; forming a first molding compound layer while allowing the same to cover the first dielectric material layer, the second dielectric material layer, the first wiring layer, the conductor layer, the passive component, the conductive pillar layer and the second side of the metal carrier; enabling one end of the conductive pillar layer to be exposed; forming a second wiring layer on the first molding compound layer and the exposed end of the conductive pillar layer; forming a protection layer on the first molding compound layer and the second wiring layer; and removing a portion of the metal carrier so as to form a window while allowing the first wiring layer and the first dielectric material layer to be exposed therefrom.

In a fourth embodiment, the present invention provides a package apparatus, which comprises: a first wiring layer, a metal layer, a first dielectric material layer, a second wiring layer, a conductive pillar layer, a passive component, a first molding compound layer, a third wiring layer, and a protection layer. The first wiring layer has a first surface and a second surface that are arranged opposite to each other. The metal layer is disposed on the first surface of the first wiring layer. The first dielectric material layer is disposed on a specific portion of the first wiring layer in a manner that the first dielectric material layer is not to be exposed on the first surface of the first wiring layer. The second wiring layer is disposed on the first wiring layer and the first dielectric material layer. The conductive pillar layer is disposed on the second wiring layer, forming a concave structure with the second wiring layer. The passive component is disposed on and electrically connected to the second wiring layer in the concave structure. The first molding compound layer is disposed on a specific portion of the second wiring layer and the conductive pillar layer and covering over the passive component, while enabling the first molding compound layer to be not exposed on one end of the conductive pillar layer. The third wiring layer is disposed on the first molding compound layer and the end of the conductive pillar layer. The protection layer is disposed on the first molding compound layer and the third wiring layer.

Corresponding to the fourth embodiment, the present invention provides a method for manufacturing a package apparatus, which comprises the steps of: providing a metal carrier composed of a first side and a second side that are arranged opposite to each other; forming a first wiring layer on the second side of the metal carrier; forming a first dielectric material layer on the second side of the metal carrier and the first wiring layer; forming a second wiring layer on the first wiring layer and the first dielectric material layer; forming a conductive pillar layer on the second wiring layer while allowing the conductive pillar layer to form a concave structure with the second wiring layer; providing a passive component to be disposed on and electrically connected to second wiring layer in the concave structure; forming a first molding compound layer while allowing the same to cover the first dielectric material layer, the second wiring layer, the passive component, the conductive pillar layer and the second side of the metal carrier; enabling one end of the conductive pillar layer to be exposed; forming a third wiring layer on the first molding compound layer and the exposed end of the conductive pillar layer; forming a protection layer on the first molding compound layer and the third wiring layer; and removing a portion of the metal carrier so as to form a window while allowing the first wiring layer and the first dielectric material layer to be exposed therefrom.

In a fifth embodiment, the present invention provides a package apparatus, which comprises: a first wiring layer, a metal layer, a first dielectric material layer, a second dielectric material layer, a second wiring layer, a conductive pillar layer, a passive component, a first molding compound layer, a third wiring layer, and a protection layer. The first wiring layer has a first surface and a second surface that are arranged opposite to each other. The metal layer is disposed on the first surface of the first wiring layer. The first dielectric material layer is disposed on a specific portion of the first wiring layer in a manner that the first dielectric material layer is not to be exposed on the first surface of the first wiring layer while being positioned not lower than the second surface of the first wiring layer. The second dielectric material layer is disposed on the first wiring layer and the first dielectric material layer. The second wiring layer is disposed on the first wiring layer and the second dielectric material layer. The conductive pillar layer is disposed on the second wiring layer, forming a concave structure with the second wiring layer. The passive component is disposed on and electrically connected to the first wiring layer in the concave structure. The first molding compound layer is disposed on a specific portion of the first dielectric material layer, the second dielectric material layer, the second wiring layer and the conductive pillar layer, while covering over the passive component and enabling the first molding compound layer to be not exposed on one end of the conductive pillar layer. The third wiring layer is disposed on the first molding compound layer and the end of the conductive pillar layer. The protection layer is disposed on the first molding compound layer and the third wiring layer.

Corresponding to the fifth embodiment, the present invention provides a method for manufacturing a package apparatus, which comprises the steps of: providing a metal carrier composed of a first side and a second side that are arranged opposite to each other; forming a first dielectric material layer on the second side of the metal carrier; forming a first wiring layer on the second side of the metal carrier while allowing the first dielectric material layer to be disposed on a specific portion of the first wiring layer in a manner that the first dielectric material layer is positioned not lower than the first wiring layer; forming a second dielectric material layer on the first wiring layer and the first dielectric material layer; forming a second wiring layer on the first wiring layer and the second dielectric material layer; forming a conductive pillar layer on the second wiring layer while allowing the conductive pillar layer to form a concave structure with the second wiring layer; providing a passive component to be disposed on and electrically connected to the first wiring layer in the concave structure; forming a first molding compound layer while allowing the same to cover the first dielectric material layer, the first wiring layer, the second dielectric material layer, the second wiring layer, the passive component, the conductive pillar layer and the second side of the metal carrier; enabling one end of the conductive pillar layer to be exposed; forming a third wiring layer on the first molding compound layer and the exposed end of the conductive pillar layer; forming a protection layer on the first molding compound layer and the third wiring layer; and removing a portion of the metal carrier so as to form a window while allowing the first wiring layer and the first dielectric material layer to be exposed therefrom.

In a sixth embodiment, the present invention provides a package apparatus, which comprises: a first wiring layer, a metal layer, a dielectric material layer, a conductive pillar layer, an adhesive layer, a passive component, a first molding compound layer, a second wiring layer, and a protection layer. The first wiring layer has a first surface and a second surface that are arranged opposite to each other. The metal layer is disposed on the first surface of the first wiring layer. The dielectric material layer is disposed on a specific portion of the first wiring layer in a manner that the first dielectric material layer is not to be exposed on the first surface of the first wiring layer while being positioned not lower than the second surface of the first wiring layer. The conductive pillar layer is disposed on the second surface of the first wiring layer, forming a concave structure with the first wiring layer. The adhesive layer is disposed on the first wiring layer and the dielectric material layer in the concave structure. The passive component is disposed on the adhesive layer in the concave structure. The first molding compound layer is disposed on a portion of the conductive pillar layer while allowing the same to cover the passive component in a manner that the first molding compound layer is not exposed on one end of the conductive pillar layer. The second wiring layer is disposed on the first molding compound layer, the end of the conductive pillar layer and the passive component. The protection layer is disposed on the first molding compound layer and the second wiring layer.

Corresponding to the sixth embodiment, the present invention provides a method for manufacturing a package apparatus, which comprises the steps of: providing a metal carrier composed of a first side and a second side that are arranged opposite to each other; forming a dielectric material layer on the second side of the metal carrier; forming a first wiring layer on the second side of the metal carrier while allowing the dielectric material layer to be disposed on a specific portion of the first wiring layer in a manner that the dielectric material layer is not lower than the first wiring layer; forming a conductive pillar layer on the first wiring layer while allowing the conductive pillar layer to form a concave structure with the first wiring layer; forming an adhesive layer on the first wiring layer and the dielectric material layer in the concave structure; providing a passive component to be disposed on the adhesive layer in the concave structure; forming a first molding compound layer while allowing the same to cover the dielectric material layer, the first wiring layer, the adhesive layer, the passive component, the conductive pillar layer and the second side of the metal carrier; enabling one end of the conductive pillar layer and the passive component to be exposed; forming a second wiring layer on the first molding compound layer, the exposed end of the conductive pillar layer and the passive component; forming a protection layer on the first molding compound layer and the second wiring layer; and removing a portion of the metal carrier so as to form a window while allowing the first wiring layer and the dielectric material layer to be exposed therefrom.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
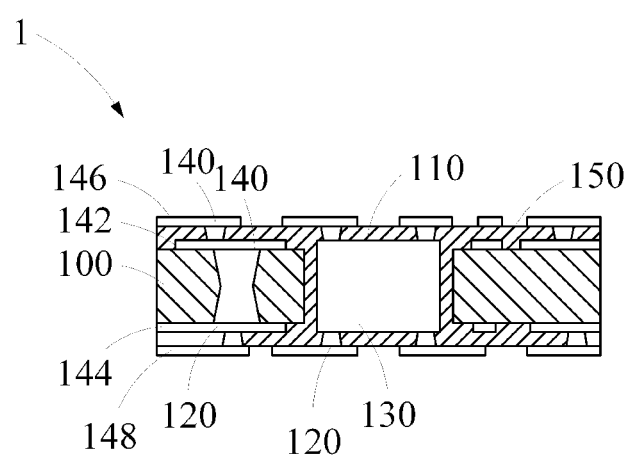
FIG. 1 shows a conventional fiberglass substrate packaging structure.
Figure 2:
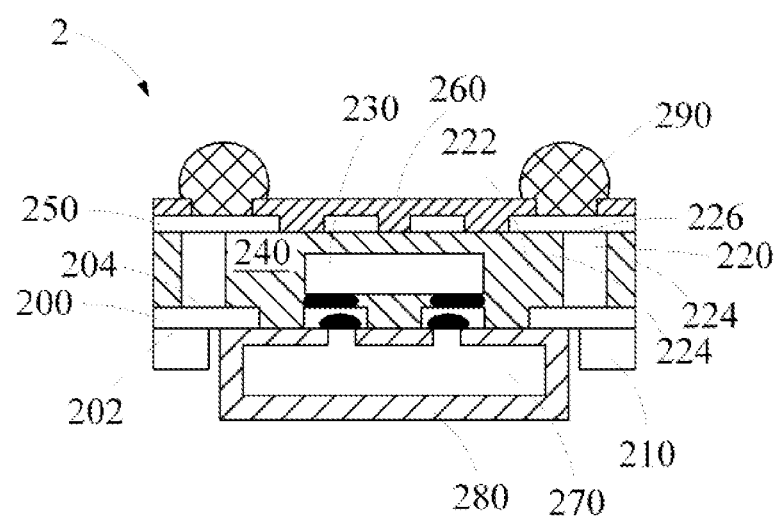
FIG. 2 is a schematic diagram showing a package apparatus according to a first embodiment of the present invention.

Please refer to FIG. 2, which is a schematic diagram showing a package apparatus according to a first embodiment of the present invention. In the embodiment shown in FIG. 2, the package apparatus 2 comprises: a first wiring layer 200, a metal layer 210, a conductive pillar layer 220, a passive component 230, a first molding compound layer 240, a second wiring layer 250, and a protection layer 260. The first wiring layer 200 has a first surface 202 and a second surface 204 that are arranged opposite to each other. The metal layer 210 is disposed on the first surface 202 of the first wiring layer 200. The conductive pillar layer 220 is disposed on the second surface 204 of the first wiring layer 200, forming a concave structure 222 with the first wiring layer 200. The passive component 230 is disposed on and electrically connected to the second surface 204 of the first wiring layer 200 in the concave structure 222. The first molding compound layer 240 is disposed on a portion of the first wiring layer 200 and the conductive pillar layer 220 while allowing the same to cover the passive component 230 in a manner that the first molding compound layer 240 is not exposed on the first surface 202 of the first wiring layer 200 and one end 226 of the conductive pillar layer 220. It is noted that although the first molding compound layer 240 is formed covering on every portion of the first wiring layer 200 and the conductive pillar layer 220, but it is not limited thereby. Moreover, the first molding compound layer 240 can be composed of a material selected from the group consisting of novolac-based resin, epoxy-based resin, silicon-based resign and other molding compounds, but it is also not limited thereby. The second wiring layer 250 is disposed on the first molding compound layer 240 and the end 226 of the conductive pillar layer 220. The protection layer 260 is disposed on the first molding compound layer 240 and the second wiring layer 250.

In addition, the package apparatus 2 can further comprises: an external component 270, a second molding compound layer 280 and a plurality of metal balls 290, in which the external component 270 is disposed on and electrically connected to the first surface 202 of the first wiring layer 200; the second molding compound layer 280 is disposed on the external component 270 and the first surface 202 of the first wiring layer 200; and the plural metal balls 290 are disposed on the second wiring layer 250. It is noted that the external component is a unit selected from the group consisting of: an active component, a passive component, a semiconductor chip and a flexible circuit board, but is not limited thereby.

Figure 3:
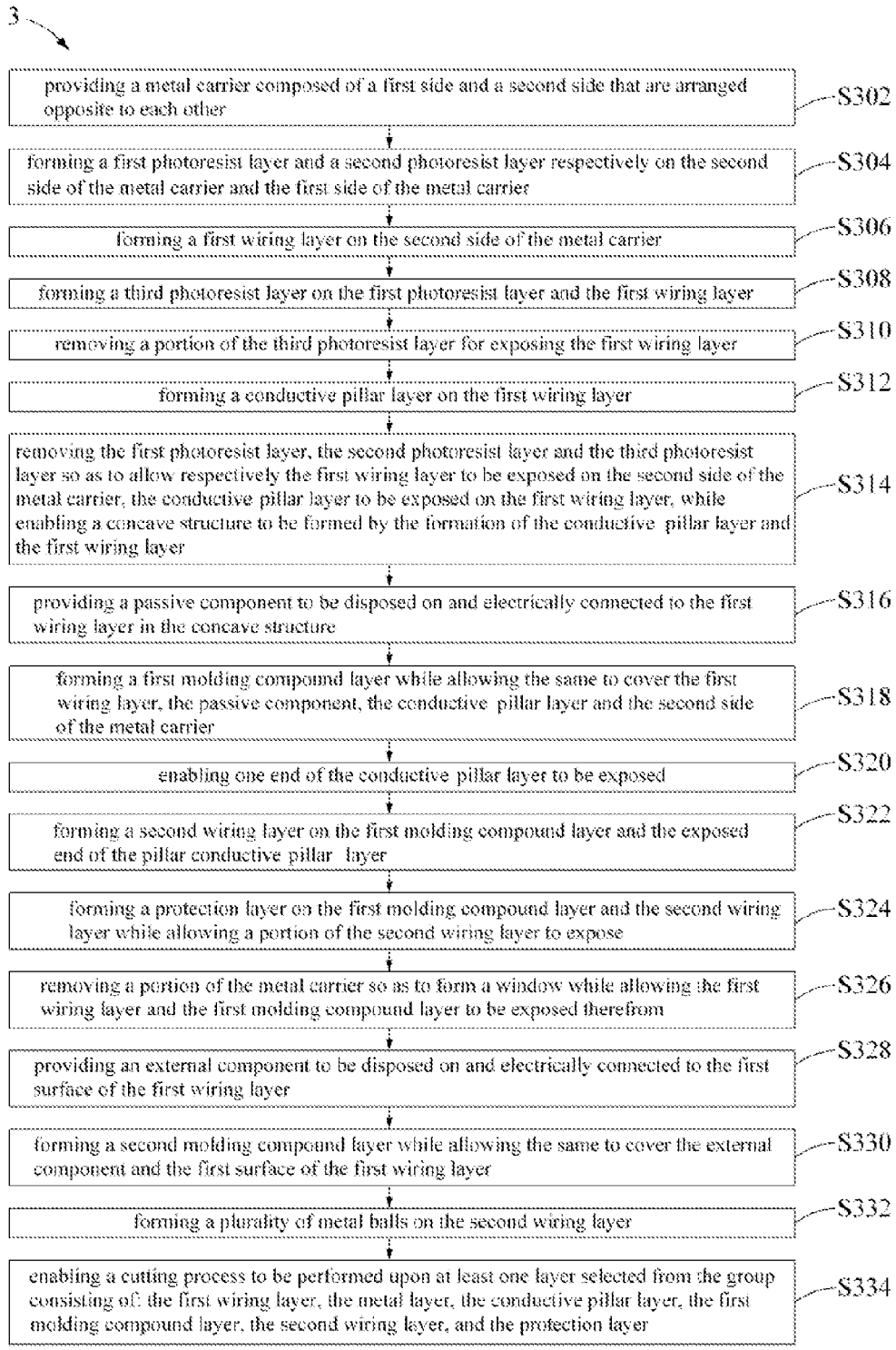
FIG. 3 is a flow chart depicting steps performing in a method for manufacturing a package apparatus of the first embodiment.
Figure 4A:
FIG. 4A to FIG. 4Q are schematic diagrams illustrating the manufacturing of a package apparatus of the first embodiment.
Figure 4B:
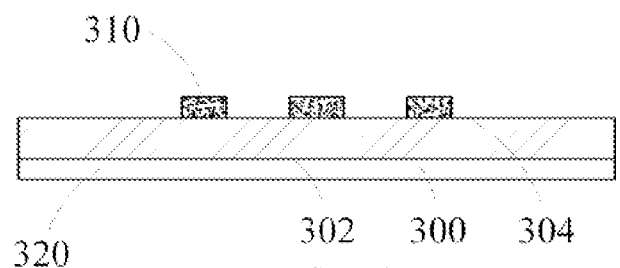
Figure 4C:
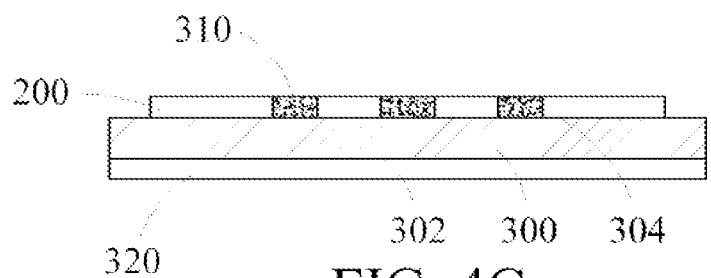
Figure 4D:
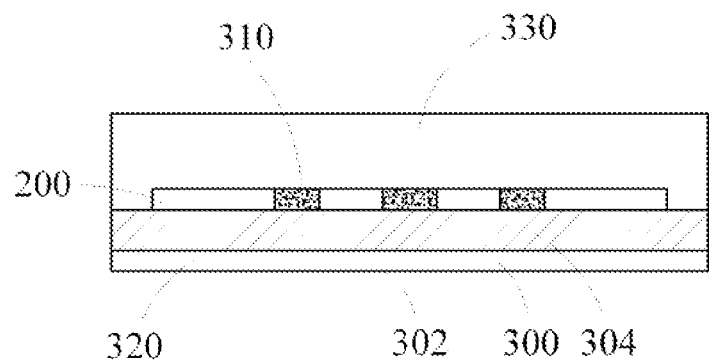
Figure 4E:
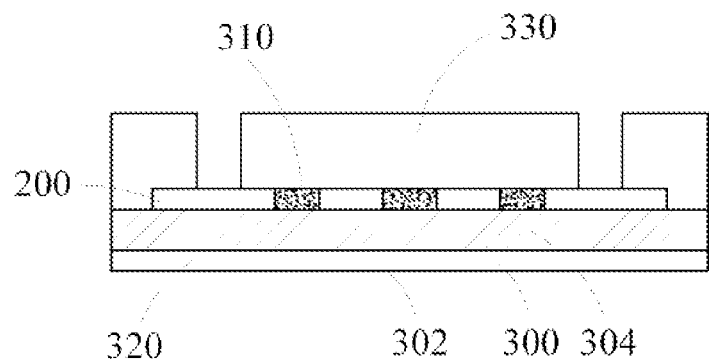
Figure 4F:
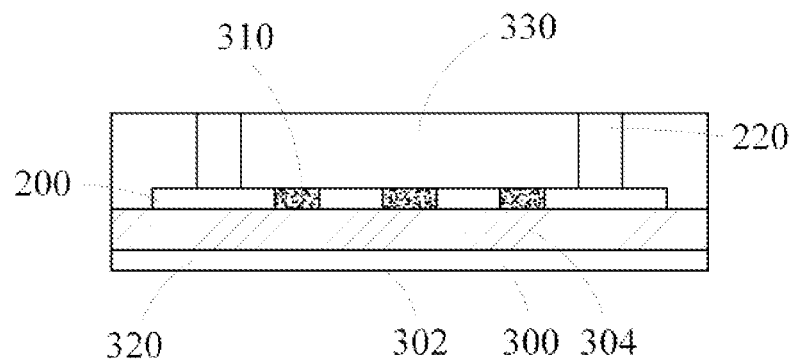
Figure 4G:
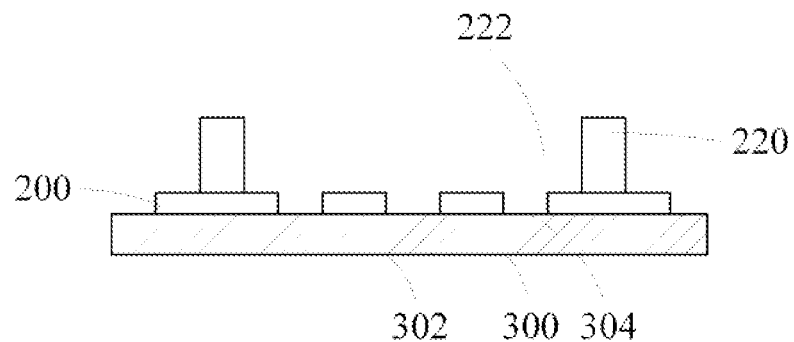
Figure 4H:
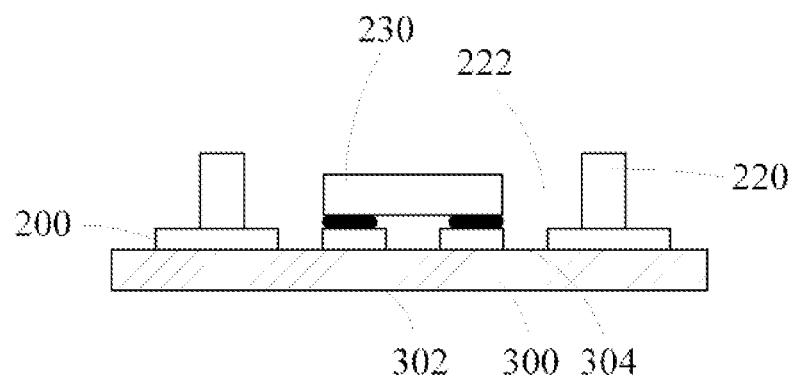
Figure 4I:
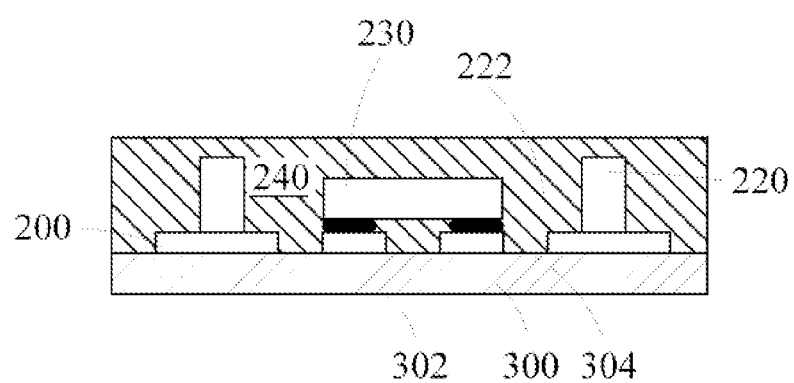
Figure 4J:
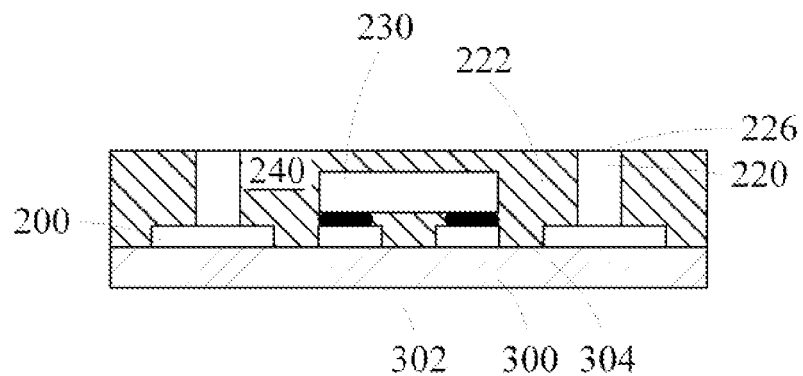
Figure 4K:
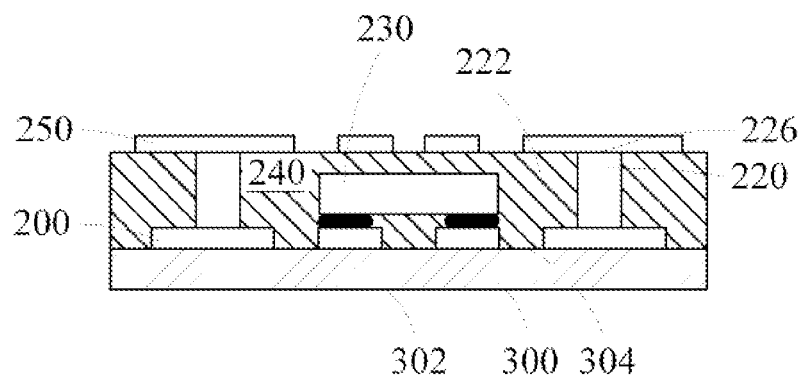
Figure 4L:
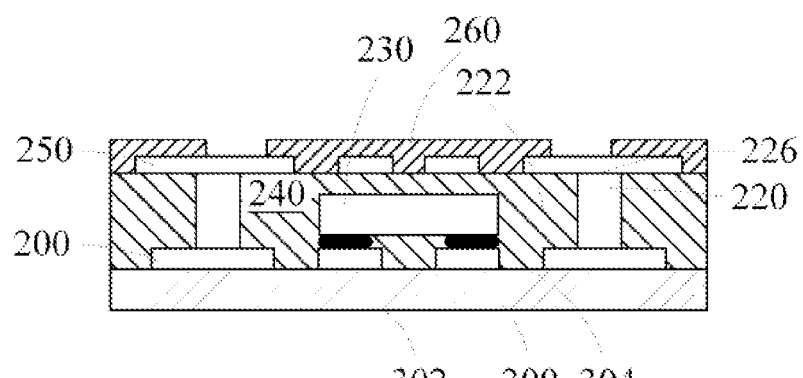
Figure 4M:
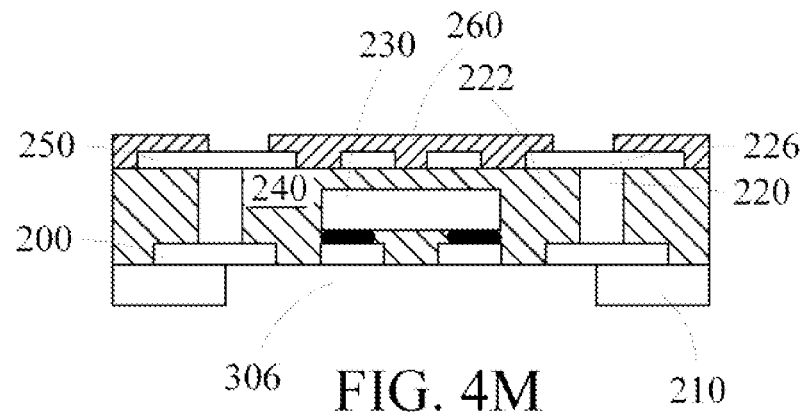
Figure 4N:
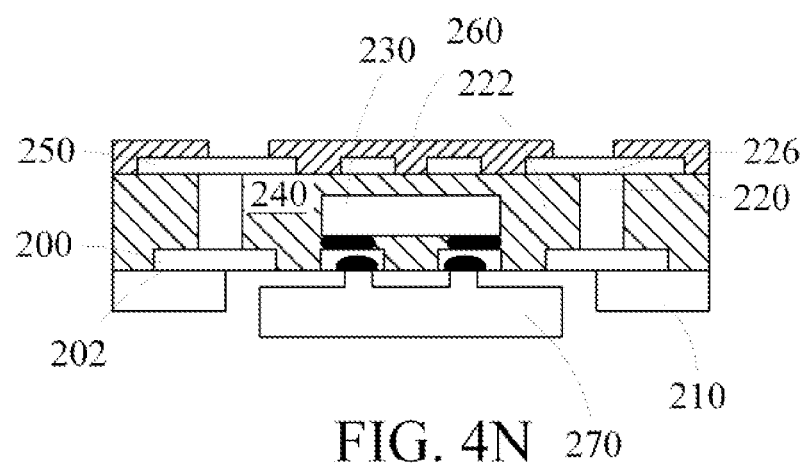
Figure 4O:
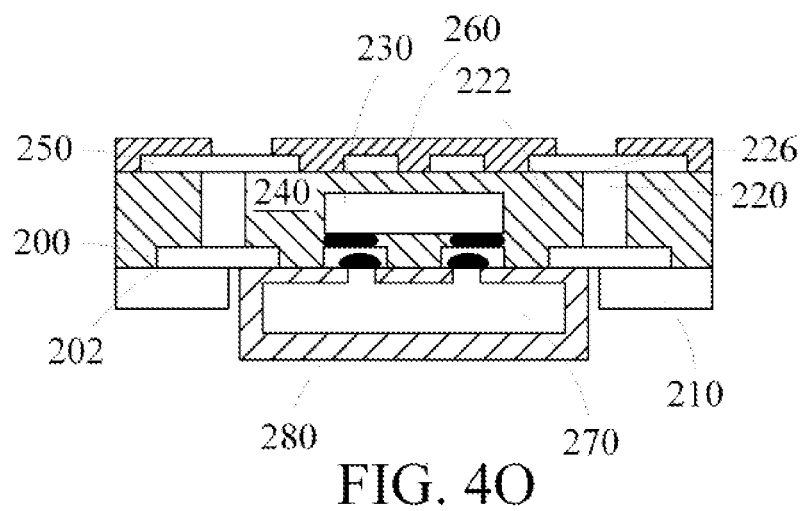
Figure 4P:
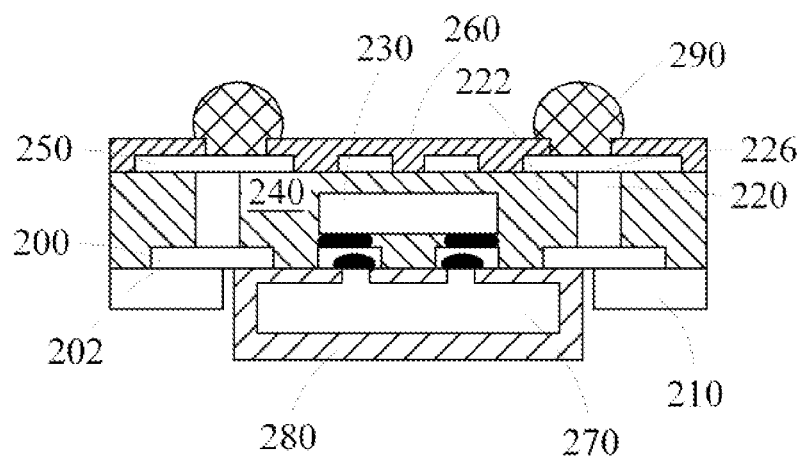
Figure 4Q:
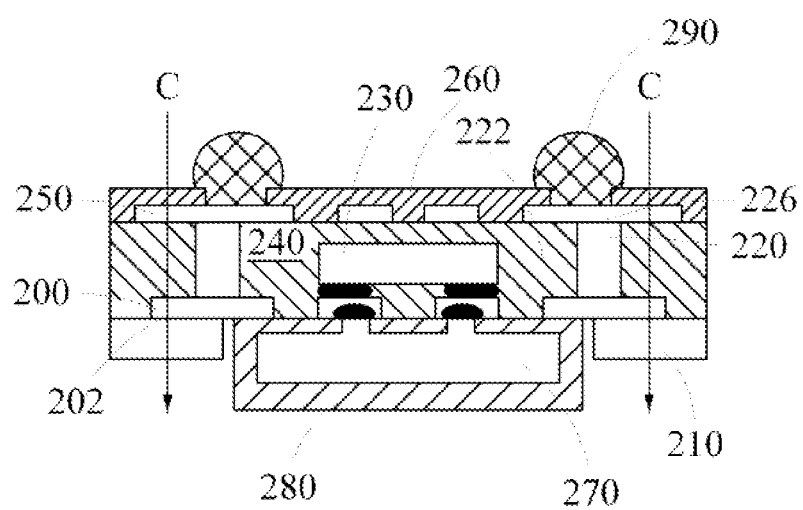

FIG. 3 is a flow chart depicting steps performing in a method for manufacturing a package apparatus of the first embodiment, and FIG. 4A to FIG. 4Q are schematic diagrams illustrating the manufacturing of a package apparatus of the first embodiment. As shown in FIG. 3, a method 3 for manufacturing the package apparatus 2 of FIG. 2 comprises the following steps:

step S302: providing a metal carrier 300 composed of a first side 302 and a second side 304 that are arranged opposite to each other, as shown in FIG. 4A;

step S304: forming a first photoresist layer 310 and a second photoresist layer 320 respectively on the second side 304 of the metal carrier 300 and the first side 302 of the metal carrier 300, as shown in FIG. 4B, whereas the first photoresist layer 310 is formed using a photolithography process in this embodiment, but is not limited thereby;

step S306: forming a first wiring layer 200 on the second side 304 of the metal carrier 300, as shown in FIG. 4C, whereas the first wiring layer 200 is formed using an electrolytic plating process in this embodiment, but is not limited thereby, and moreover, the first wiring layer 200 can be a wiring layer with patterns which includes at least one wire and a chip seat, and the first wiring layer 200 can be made of a metal, such as copper;

step S308: forming a third photoresist layer 330 on the first photoresist layer 310 and the first wiring layer 200, as shown in FIG. 4D, whereas the third photoresist layer 330 can be formed using a dry-film lamination process in this embodiment, but is not limited thereby;

step S310: removing a portion of the third photoresist layer 330 for exposing the first wiring layer 300, as shown in FIG. 4E, whereas the removal of a portion of the third photoresist layer 330 is performed using a photolithography process, but is not limited thereby;

step S312: forming a conductive pillar layer 220 on the first wiring layer 200, as shown in FIG. 4F, whereas the conductive pillar layer 220 is formed using an electrolytic plating process in this embodiment, but is not limited thereby, and moreover, the conductive pillar layer 220 includes at least one conductive pillar that can be made of a metal, such as copper and is formed at a position corresponding to the wires and the chip seat of the first wiring layer 200;

step S314: removing the first photoresist layer 310, the second photoresist layer 320 and the third photoresist layer 330 so as to allow respectively the first wiring layer 200 to be exposed on the second side 304 of the metal carrier 300, the conductive pillar layer 220 to be exposed on the first wiring layer 200, while enabling a concave structure 222 to be formed by the formation of the conductive pillar layer 220 and the first wiring layer 200, as shown in FIG. 4G;

step S316: providing a passive component 230 to be disposed on and electrically connected to the first wiring layer 200 in the concave structure 222, as shown in FIG. 4H;

step S318: forming a first molding compound layer 240 while allowing the same to cover the first wiring layer 200, the passive component 230, the conductive pillar layer 220 and the second side 304 of the metal carrier 300, as shown in FIG. 4I, whereas, in this embodiment, the first molding compound layer 240 is formed by a transfer molding process, and can be made from a material selected from the group consisting of novolac-based resin, epoxy-based resin, silicon-based resign and other molding compounds, whichever can be heated to a liquid state so as to be poured on the second side 304 of the metal carrier 300 for allowing the same to cover the first wiring layer 200, the passive component 230 and the conductive pillar layer 220 under a high-temperature and high-pressure condition, and thereafter, to be cured into the first molding compound layer 240, and moreover the first molding compound layer 240 can be composed of a kind of filler, such as a powder silicon dioxide; and in another embodiment, the first molding compound layer 240 can be formed by the use of an injection molding process or a compression molding process, and the formation of the first molding compound layer 240 can include the steps of: providing a molding compound to be heated to a liquid state, whereas the molding compound is composed of a resin and powder silicon dioxide; pouring the liquefied molding compound on the second side 304 of the metal carrier 300 while allowing the molding compound to cover the first wiring layer 200, the passive component 230 and the conductive pillar layer 220 under a high-temperature and high-pressure condition; and curing the molding compound for enabling the same to form the first molding compound layer 240, but is not limited thereby;

step S320: enabling one end 226 of the conductive pillar layer 220 to be exposed, as shown in FIG. 4J, whereas in this embodiment, the exposing of the end 226 of the conductive pillar layer 220 is enabled by grinding and removing a portion of the first molding compound layer 240, however, under ideal condition, the end 226 of the conductive pillar layer 220 is positioned coplanar with the first molding compound layer 240, by that the exposing of the end 226 of the conductive pillar layer 220 can be achieved simultaneously with the formation of the first molding compound layer 240, and thus the process for grinding and removing of the first molding compound layer 240 can be avoided;

step S322: forming a second wiring layer 250 on the first molding compound layer 240 and the exposed end 226 of the conductive pillar layer 220, as shown in FIG. 4K, whereas the second wiring layer 250 can be formed by the use of an electroless plating process, a sputtering coating process, or a thermal coating process, but is not limited thereby, and moreover, the second wiring layer 250 can be a wiring layer with patterns which includes at least one wire and is a layer formed at a position corresponding to the end 226 of the conductive pillar layer 220, moreover, the second wiring layer 250 can be made of a metal, such as copper;

step S324: forming a protection layer 260 on the first molding compound layer 240 and the second wiring layer 250 while allowing a portion of the second wiring layer 250 to expose, as shown in FIG. 4L, whereas the protection layer 260 is used for insulating wires in the second wiring layer 250;

step S326: removing a portion of the metal carrier 300 so as to form a window 306 while allowing the first wiring layer 200 and the first molding compound layer 240 to be exposed therefrom, as shown in FIG. 4M, whereas the removal of the metal carrier 300 can be performed using a photolithography and etching process, and moreover, the wires and the chip seat of the first wiring layer 200 is also exposed from the window 306, and thus the portion of the metal carrier 300 that is not removed is substantially being formed into a metal layer 210;

step S328: providing an external component 270 to be disposed on and electrically connected to the first surface 202 of the first wiring layer 200, as shown in FIG. 4N, whereas, in an embodiment, the external component 270 can be an active component, a passive component, a semiconductor chip or a flexible circuit board, but is not limited thereby;

step S330: forming a second molding compound layer 280 while allowing the same to cover the external component 270 and the first surface 202 of the first wiring layer 200, as shown in FIG. 4O, whereas, in this embodiment, the second molding compound layer 280 is formed by a transfer molding process, and can be made from a material selected from the group consisting of novolac-based resin, epoxy-based resin, silicon-based resign and other molding compounds, whichever can be heated to a liquid state so as to be poured on the second side 304 of the metal carrier 300 for allowing the same to cover the external component 270 and the first surface 202 of the first wiring layer 200, under a high-temperature and high-pressure condition, and thereafter, to be cured into the second molding compound layer 280, and moreover the second molding compound layer 280 can be composed of a kind of filler, such as a powder silicon dioxide; and in another embodiment, the second molding compound layer 280 can be formed by the use of an injection molding process or a compression molding process;

step S332: forming a plurality of metal balls 290 on the second wiring layer 250, as shown in FIG. 4P, whereas each of the metal balls 290 can be made of a metal, such as copper;

step S334: enabling a cutting process C to be performed upon at least one layer selected from the group consisting of: the first wiring layer 200, the metal layer 210, the conductive pillar layer 220, the first molding compound layer 240, the second wiring layer 250, and the protection layer 260, as shown in FIG. 4Q, by that a package apparatus 2 of FIG. 2 can be achieved.

It is noted that the package apparatus 2 in this first embodiment uses the first molding compound layer as a coreless substrate so that the conventional expensive fiberglass substrate is not required, and also the conventional expensive and time consuming laser blind/buried hole formation process on four-layered structure can be replaced by a faster and simpler electroplating conductive pillar process on less costly two-layered structure.

Figure 5:
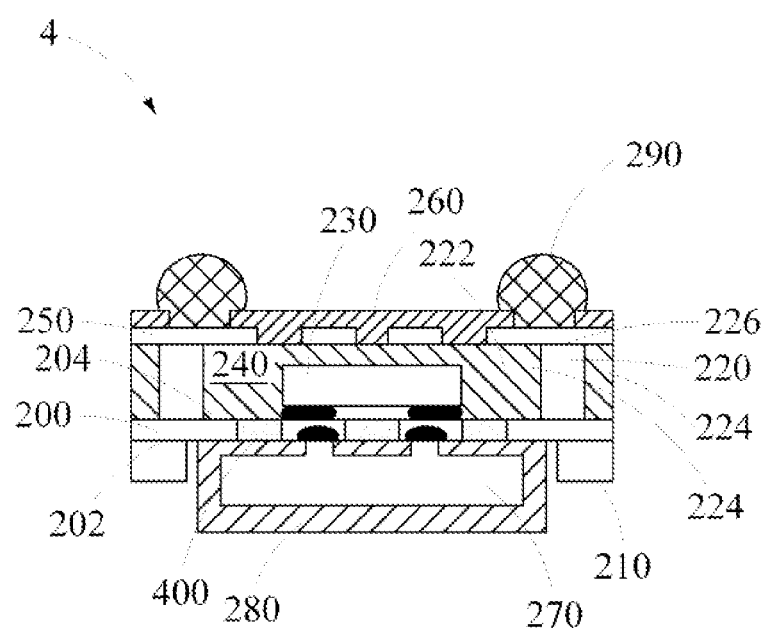
FIG. 5 is a schematic diagram showing a package apparatus according to a second embodiment of the present invention.

Please refer to FIG. 5, which is a schematic diagram showing a package apparatus according to a second embodiment of the present invention. In the second embodiment shown in FIG. 5, the package apparatus 4, that is formed basically the same as the package apparatus 2 shown in the first embodiment, comprises: a first wiring layer 200, a metal layer 210, a first dielectric material layer 400, a conductive pillar layer 220, a passive component 230, a first molding compound layer 240, a second wiring layer 250, and a protection layer 260. The first wiring layer 200 has a first surface 202 and a second surface 204 that are arranged opposite to each other. The first dielectric material layer 400 is disposed on a specific portion of the first wiring layer 200 in a manner that the first dielectric material layer 400 is not to be exposed on the first surface 202 of the first wiring layer 200 while being positioned not lower than the second surface 204 of the first wiring layer 200. The metal layer 210 is disposed on the first surface 202 of the first wiring layer 200. The conductive pillar layer 220 is disposed on the second surface 204 of the first wiring layer 200, forming a concave structure 222 with the first wiring layer 200. The passive component 230 is disposed on and electrically connected to the second surface 204 of the first wiring layer 200 in the concave structure 222. The first molding compound layer 240 is disposed on a portion of the first wiring layer 200 and the conductive pillar layer 220 while allowing the same to cover the passive component 230 in a manner that the first molding compound layer 240 is not exposed on the first surface 202 of the first wiring layer 200 and one end 226 of the conductive pillar layer 220. It is noted that although the first molding compound layer 240 is formed covering on every portion of the first wiring layer 200 and the conductive pillar layer 220, but it is not limited thereby. Moreover, the first molding compound layer 240 can be composed of a material selected from the group consisting of novolac-based resin, epoxy-based resin, silicon-based resign and other molding compounds, but it is also not limited thereby. The second wiring layer 250 is disposed on the first molding compound layer 240 and the end 226 of the conductive pillar layer 220. The protection layer 260 is disposed on the first molding compound layer 240 and the second wiring layer 250.

Similarly, the package apparatus 4 can further comprises: an external component 270, a second molding compound layer 280 and a plurality of metal balls 290, in which the external component 270 is disposed on and electrically connected to the first surface 202 of the first wiring layer 200; the second molding compound layer 280 is disposed on the external component 270 and the first surface 202 of the first wiring layer 200; and the plural metal balls 290 are disposed on the second wiring layer 250. It is noted that the external component is a unit selected from the group consisting of: an active component, a passive component, a semiconductor chip and a flexible circuit board, but is not limited thereby.

Figure 6:
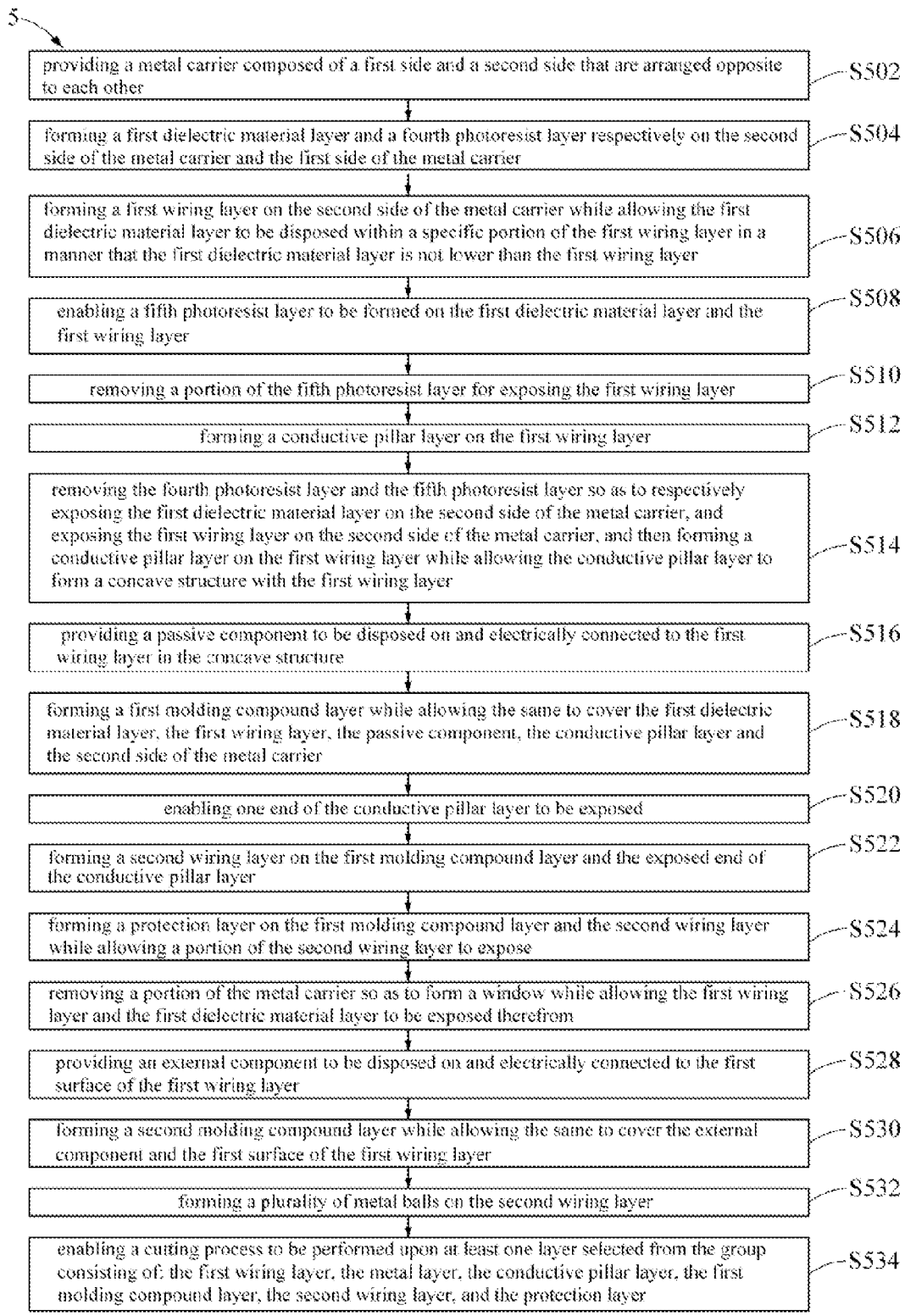
FIG. 6 is a flow chart depicting steps performing in a method for manufacturing a package apparatus of the second embodiment.
Figure 7A:
FIG. 7A to FIG. 7Q are schematic diagrams illustrating the manufacturing of a package apparatus of the second embodiment.
Figure 7B:
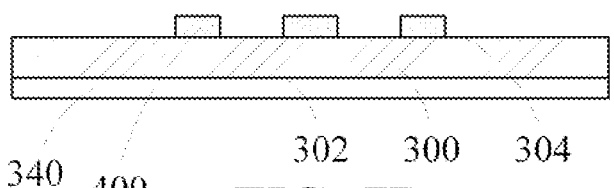
Figure 7C:
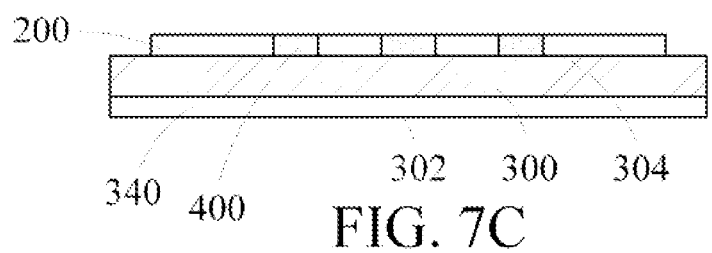
Figure 7D:
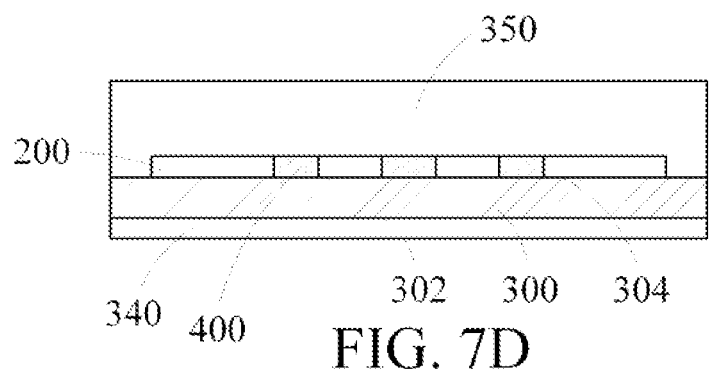
Figure 7E:
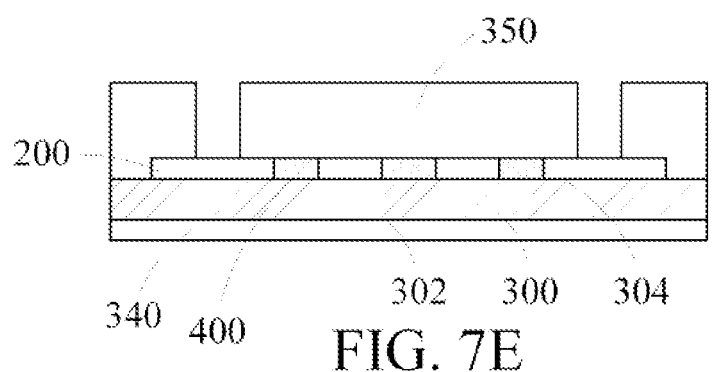
Figure 7F:
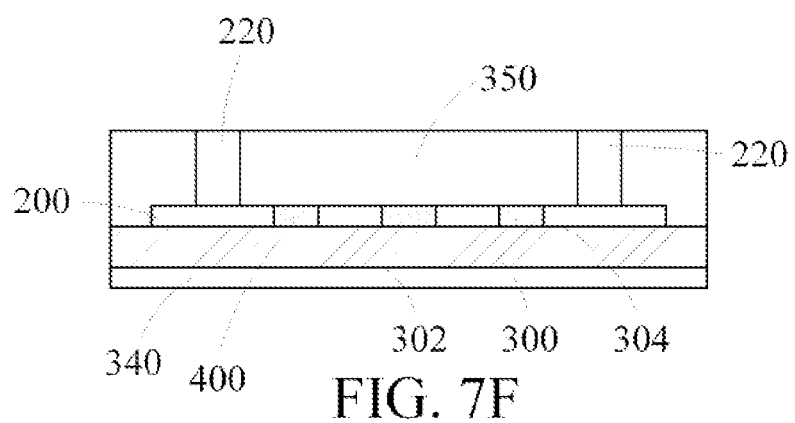
Figure 7G:
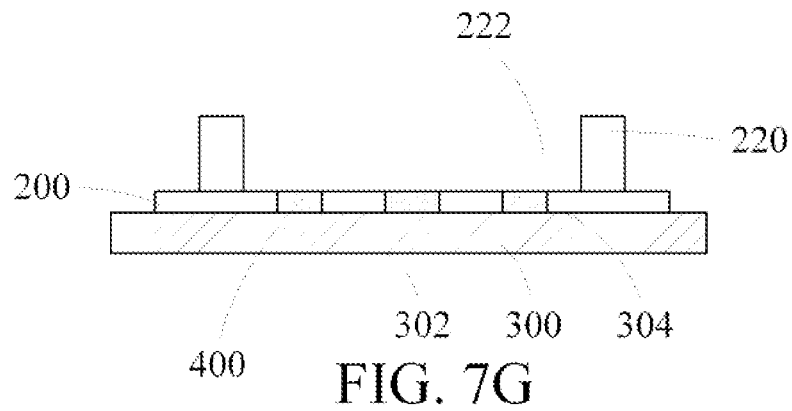
Figure 7H:
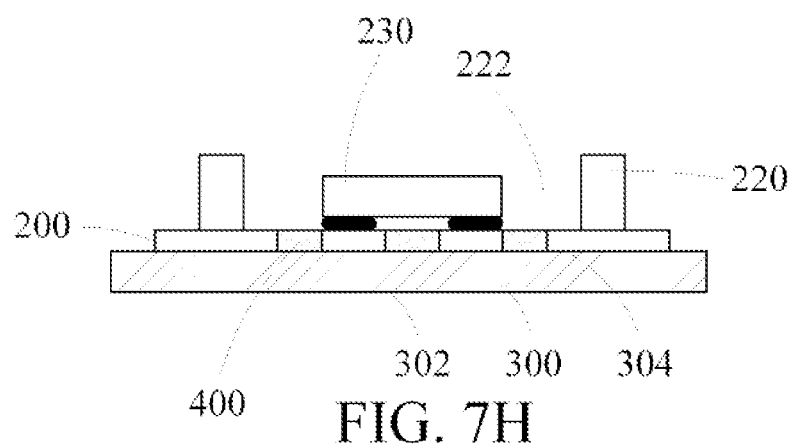
Figure 7I:
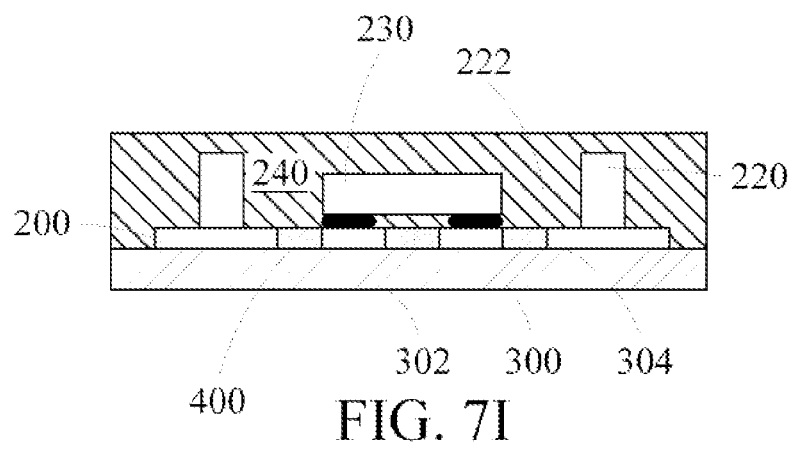
Figure 7J:
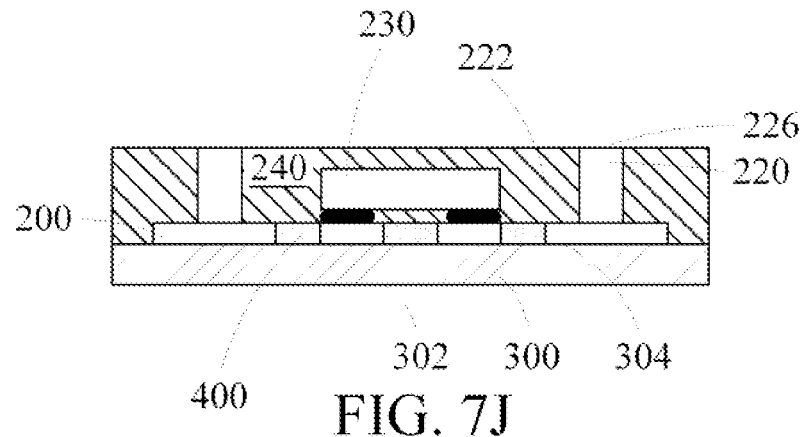
Figure 7K:
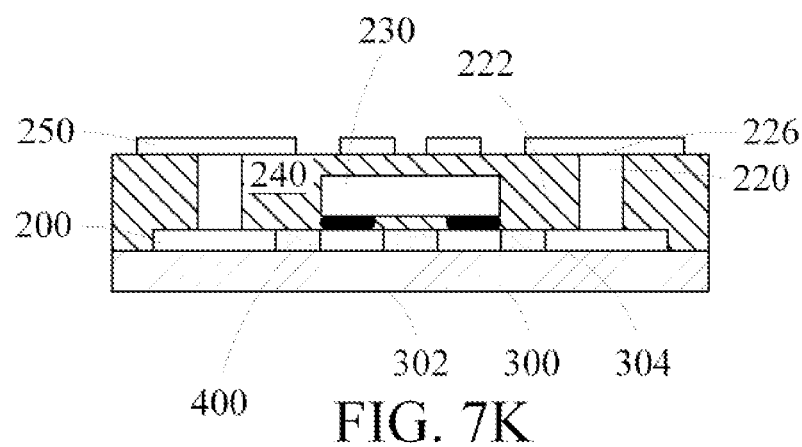
Figure 7L:
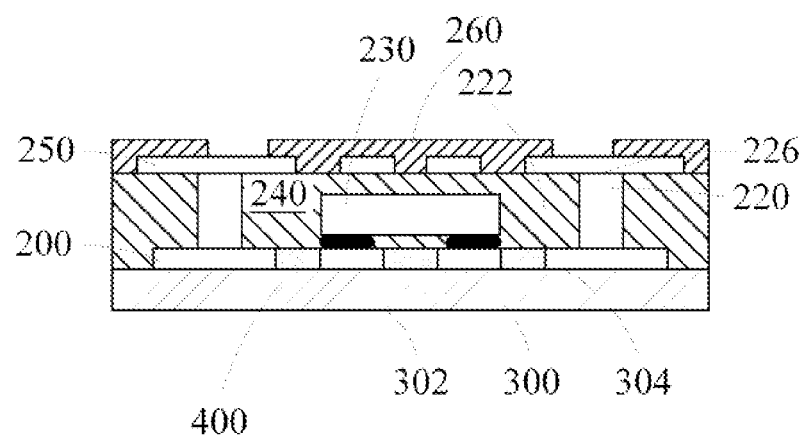
Figure 7M:
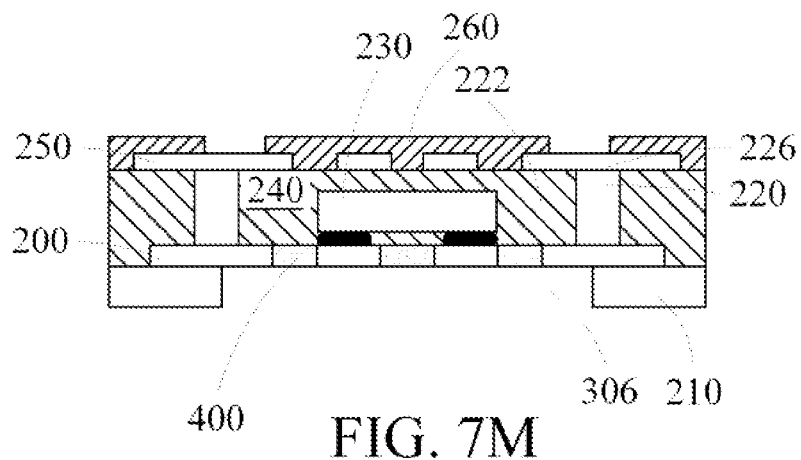
Figure 7N:
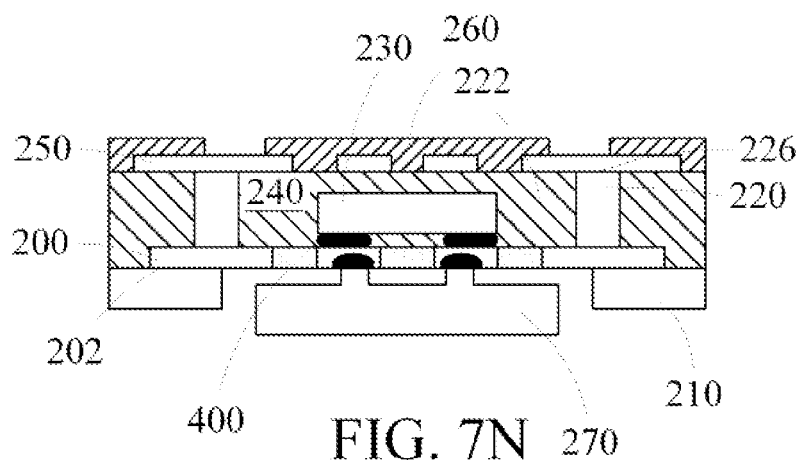
Figure 7O:
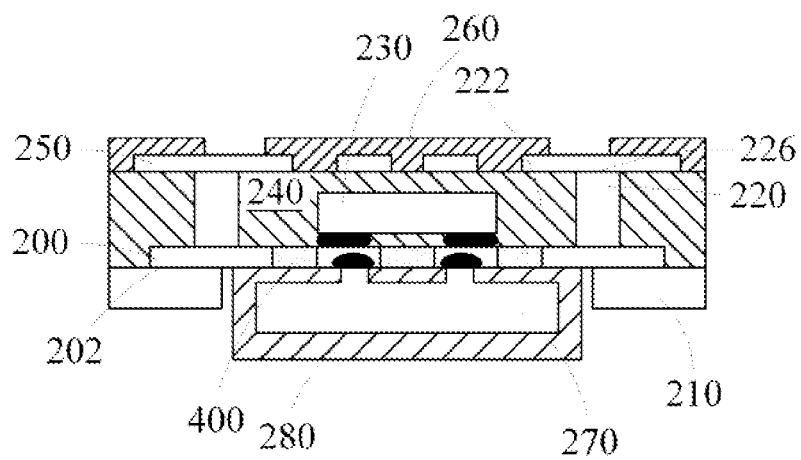
Figure 7P:
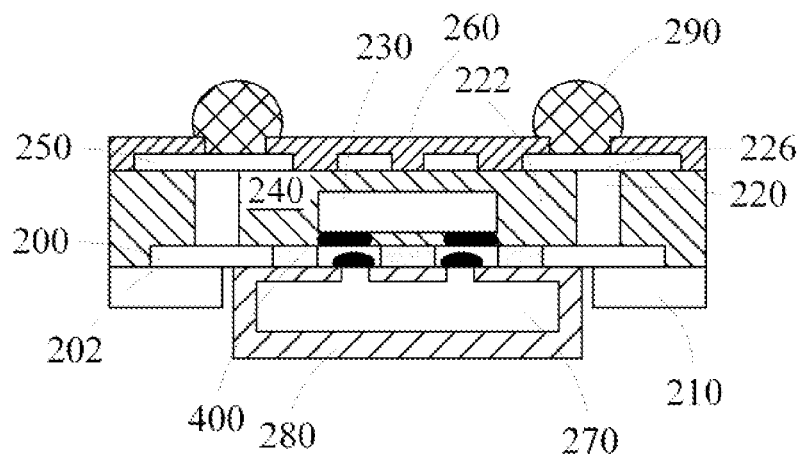
Figure 7Q:
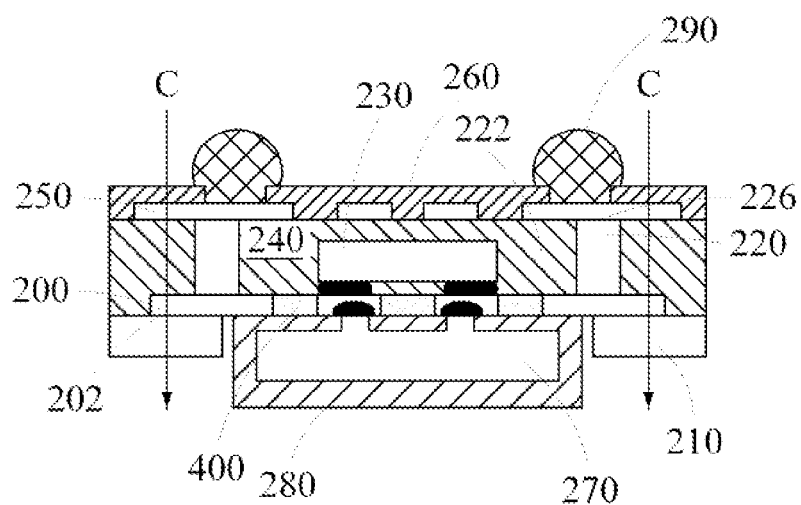

FIG. 6 is a flow chart depicting steps performing in a method for manufacturing a package apparatus of the second embodiment, and FIG. 7A to FIG. 7Q are schematic diagrams illustrating the manufacturing of a package apparatus of the second embodiment. As shown in FIG. 6, a method 5 for manufacturing the package apparatus 4 of FIG. 5 comprises the following steps:

step S502: providing a metal carrier 300 composed of a first side 302 and a second side 304 that are arranged opposite to each other, as shown in FIG. 7A;

step S504: forming a first dielectric material layer 400 and a fourth photoresist layer 340 respectively on the second side 304 of the metal carrier 300 and the first side 302 of the metal carrier 304, as shown in FIG. 7B, whereas the first dielectric material layer 400 is formed by first a coating process and then a photolithography and etching process, and the fourth photoresist layer 340 is formed by a dry-film lamination process in this embodiment, but is not limited thereby;

step S506: forming a first wiring layer 200 on the second side 304 of the metal carrier 300 while allowing the first dielectric material layer 400 to be disposed within a specific portion of the first wiring layer 200 in a manner that the first dielectric material layer 400 is not lower than the first wiring layer 200, as shown in FIG. 7C, whereas the first wiring layer 200 is formed using an electrolytic plating process in this embodiment, but is not limited thereby, and moreover, the first wiring layer 200 can be a wiring layer with patterns which includes at least one wire and a chip seat, and the first wiring layer 200 can be made of a metal, such as copper;

step S508: enabling a fifth photoresist layer 350 to be formed on the first dielectric material layer 400 and the first wiring layer 200, as shown in FIG. 7D, whereas the fifth photoresist layer 350 is formed by a dry-film lamination process in this embodiment, but is not limited thereby;

step S510: removing a portion of the fifth photoresist layer 350 for exposing the first wiring layer 200, as shown in FIG. 7E, whereas the removal of the fifth photoresist layer 350 is achieved using a photography process in this embodiment, but it is not limited thereby;

step S512: forming a conductive pillar layer 220 on the first wiring layer 200, as shown in FIG. 7F, whereas the conductive pillar layer 220 is formed using an electrolytic plating process in this embodiment, but is not limited thereby, and moreover, the conductive pillar layer 220 includes at least one conductive pillar that can be made of a metal, such as copper and is formed at a position corresponding to the wires and the chip seat of the first wiring layer 200;

step S514: removing the fourth photoresist layer 340 and the fifth photoresist layer 350 so as to respectively exposing the first dielectric material layer 400 on the second side 304 of the metal carrier 300, and exposing the first wiring layer 200 on the second side 304 of the metal carrier 300, and then forming a conductive pillar layer 200 on the first wiring layer while allowing the conductive pillar layer 220 to form a concave structure 222 with the first wiring layer 200, as shown in FIG. 7G, whereas the first dielectric material layer 400 is disposed within a specific portion of the first wiring layer 200 in a manner that the first dielectric material layer 400 is positioned not lower than the first wiring layer 200;

step S516: providing a passive component 230 to be disposed on and electrically connected to the first wiring layer 200 in the concave structure 222, as shown in FIG. 7H;

step S518: forming a first molding compound layer 240 while allowing the same to cover the first dielectric material layer 400, the first wiring layer 200, the passive component 230, the conductive pillar layer 220 and the second side 304 of the metal carrier 300, as shown in FIG. 7I, whereas, in this embodiment, the first molding compound layer 240 is formed by a transfer molding process, and can be made from a material selected from the group consisting of novolac-based resin, epoxy-based resin, silicon-based resign and other molding compounds, whichever can be heated to a liquid state so as to be poured on the second side 304 of the metal carrier 300 for allowing the same to cover the first dielectric material layer 400, the first wiring layer 200, the passive component 230 and the conductive pillar layer 220 under a high-temperature and high-pressure condition, and thereafter, to be cured into the first molding compound layer 240, and moreover the first molding compound layer 240 can be composed of a kind of filler, such as a powder silicon dioxide; and in another embodiment, the first molding compound layer 240 can be formed by the use of an injection molding process or a compression molding process, and the formation of the first molding compound layer 240 can include the steps of: providing a molding compound to be heated to a liquid state, whereas the molding compound is composed of a resin and powder silicon dioxide; pouring the liquefied molding compound on the second side 304 of the metal carrier 300 while allowing the molding compound to cover the first dielectric material layer 400, the first wiring layer 200, the passive component 230 and the conductive pillar layer 220 under a high-temperature and high-pressure condition; and curing the molding compound for enabling the same to form the first molding compound layer 240, but is not limited thereby;

step S520: enabling one end 226 of the conductive pillar layer 220 to be exposed, as shown in FIG. 7J, whereas in this embodiment, the exposing of the end 226 of the conductive pillar layer 220 is enabled by grinding and removing a portion of the first molding compound layer 240, however, under ideal condition, the end 226 of the conductive pillar layer 220 is positioned coplanar with the first molding compound layer 240, by that the exposing of the end 226 of the conductive pillar layer 220 can be achieved simultaneously with the formation of the first molding compound layer 240, and thus the process for grinding and removing of the first molding compound layer 240 can be avoided;

step S522: forming a second wiring layer 250 on the first molding compound layer 240 and the exposed end 226 of the conductive pillar layer 220, as shown in FIG. 7K, whereas the second wiring layer 250 can be formed by the use of an electroless plating process, a sputtering coating process, or a thermal coating process, but is not limited thereby, and moreover, the second wiring layer 250 can be a wiring layer with patterns which includes at least one wire and is a layer formed at a position corresponding to the end 226 of the conductive pillar layer 220, moreover, the second wiring layer 250 can be made of a metal, such as copper;

step S524: forming a protection layer 260 on the first molding compound layer 240 and the second wiring layer 250 while allowing a portion of the second wiring layer 250 to expose, as shown in FIG. 7L, whereas the protection layer 260 is used for insulating wires in the second wiring layer 250;

step S526: removing a portion of the metal carrier 300 so as to form a window 306 while allowing the first wiring layer 200 and the first dielectric material layer 400 to be exposed therefrom, as shown in FIG. 7M, whereas the removal of the metal carrier 300 can be performed using a photolithography and etching process, and moreover, the wires and the chip seat of the first wiring layer 200 is also exposed from the window 306, and thus the portion of the metal carrier 300 that is not removed is substantially being formed into a metal layer 210;

step S528: providing an external component 270 to be disposed on and electrically connected to the first surface 202 of the first wiring layer 200, as shown in FIG. 7N, whereas, in an embodiment, the external component 270 can be an active component, a passive component, a semiconductor chip or a flexible circuit board, but is not limited thereby;

step S530: forming a second molding compound layer 280 while allowing the same to cover the external component 270 and the first surface 202 of the first wiring layer 200, as shown in FIG. 7O, whereas, in this embodiment, the second molding compound layer 280 is formed by a transfer molding process, and can be made from a material selected from the group consisting of novolac-based resin, epoxy-based resin, silicon-based resign and other molding compounds, whichever can be heated to a liquid state so as to be poured on the second side 304 of the metal carrier 300 for allowing the same to cover the external component 270 and the first surface 202 of the first wiring layer 200, under a high-temperature and high-pressure condition, and thereafter, to be cured into the second molding compound layer 280, and moreover the second molding compound layer 280 can be composed of a kind of filler, such as a powder silicon dioxide; and in another embodiment, the second molding compound layer 280 can be formed by the use of an injection molding process or a compression molding process;

step S532: forming a plurality of metal balls 290 on the second wiring layer 250, as shown in FIG. 7P, whereas each of the metal balls 290 can be made of a metal, such as copper;

step S534: enabling a cutting process C to be performed upon at least one layer selected from the group consisting of: the first wiring layer 200, the metal layer 210, the conductive pillar layer 220, the first molding compound layer 240, the second wiring layer 250, and the protection layer 260, as shown in FIG. 4Q, by that a package apparatus 4 of FIG. 5 can be achieved.

It is noted that, different from the package apparatus 2 shown in the first embodiment, the package apparatus 4 of the second embodiment uses the first dielectric material layer to replace the use of the first photoresist layer in the first embodiment, by that two dry-film lamination processes and one film removal process can be saved and avoided in the method for forming the package apparatus 4 of the second embodiment, and thus the risk of incomplete film removal can be avoided. In addition, since gaps between wires in the first wiring layer can be filled by the first dielectric material layer at the same time when the first molding compound layer is being formed, the risk of having air bubbles in wire gaps due to insufficient filling of the first molding compound layer can also be avoided.

Figure 8:
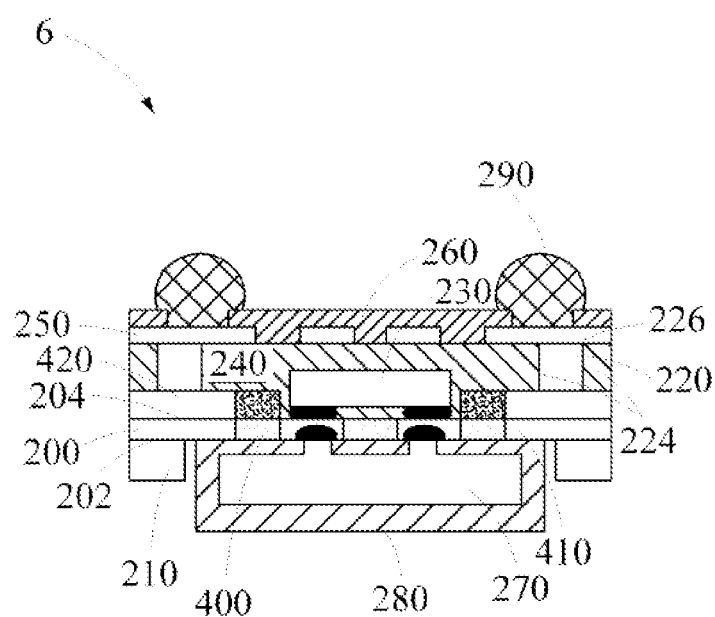
FIG. 8 is a schematic diagram showing a package apparatus according to a third embodiment of the present invention.

Please refer to FIG. 8, which is a schematic diagram showing a package apparatus according to a third embodiment of the present invention. In the second embodiment shown in FIG. 8, the package apparatus 6, that is formed basically the same as the package apparatus 4 shown in the second embodiment, comprises: a first wiring layer 200, a metal layer 210, a first dielectric material layer 400, a second dielectric material layer 410, a conductor layer 420, a conductive pillar layer 220, a passive component 230, a first molding compound layer 240, a second wiring layer 250, and a protection layer 260. The first wiring layer 200 has a first surface 202 and a second surface 204 that are arranged opposite to each other. The metal layer 210 is disposed on the first surface 202 of the first wiring layer 200. The first dielectric material layer 400 is disposed on a specific portion of the first wiring layer 200 in a manner that the first dielectric material layer 400 is not to be exposed on the first surface 202 of the first wiring layer 200 while being positioned not lower than the second surface 204 of the first wiring layer 200. The second dielectric material layer is disposed on the first dielectric material layer 400. The conductor layer 420 is disposed on the first wiring layer 200. The conductive pillar layer 220 is disposed on conductor layer 420, forming a concave structure 222 with the conductor layer 420. The passive component 230 is disposed on and electrically connected to the second surface 204 of the first wiring layer 200 in the concave structure 222. The first molding compound layer 240 is disposed on a portion 224 of the second dielectric material layer 410, the conductor layer 420 and the conductive pillar layer 220 while allowing the same to cover the passive component 230 in a manner that the first molding compound layer 240 is not exposed on one end 226 of the conductive pillar layer 220. It is noted that although the first molding compound layer 240 is formed covering on every portion of the second dielectric material layer 410, the conductor layer 420 and the conductive pillar layer 220, but it is not limited thereby. Moreover, the first molding compound layer 240 can be composed of a material selected from the group consisting of novolac-based resin, epoxy-based resin, silicon-based resign and other molding compounds, but it is also not limited thereby. The second wiring layer 250 is disposed on the first molding compound layer 240 and the end 226 of the conductive pillar layer 220. The protection layer 260 is disposed on the first molding compound layer 240 and the second wiring layer 250.

Similarly, the package apparatus 6 can further comprises: an external component 270, a second molding compound layer 280 and a plurality of metal balls 290, in which the external component 270 is disposed on and electrically connected to the first surface 202 of the first wiring layer 200; the second molding compound layer 280 is disposed on the external component 270 and the first surface 202 of the first wiring layer 200; and the plural metal balls 290 are disposed on the second wiring layer 250. It is noted that the external component is a unit selected from the group consisting of: an active component, a passive component, a semiconductor chip and a flexible circuit board, but is not limited thereby.

Figure 9A:
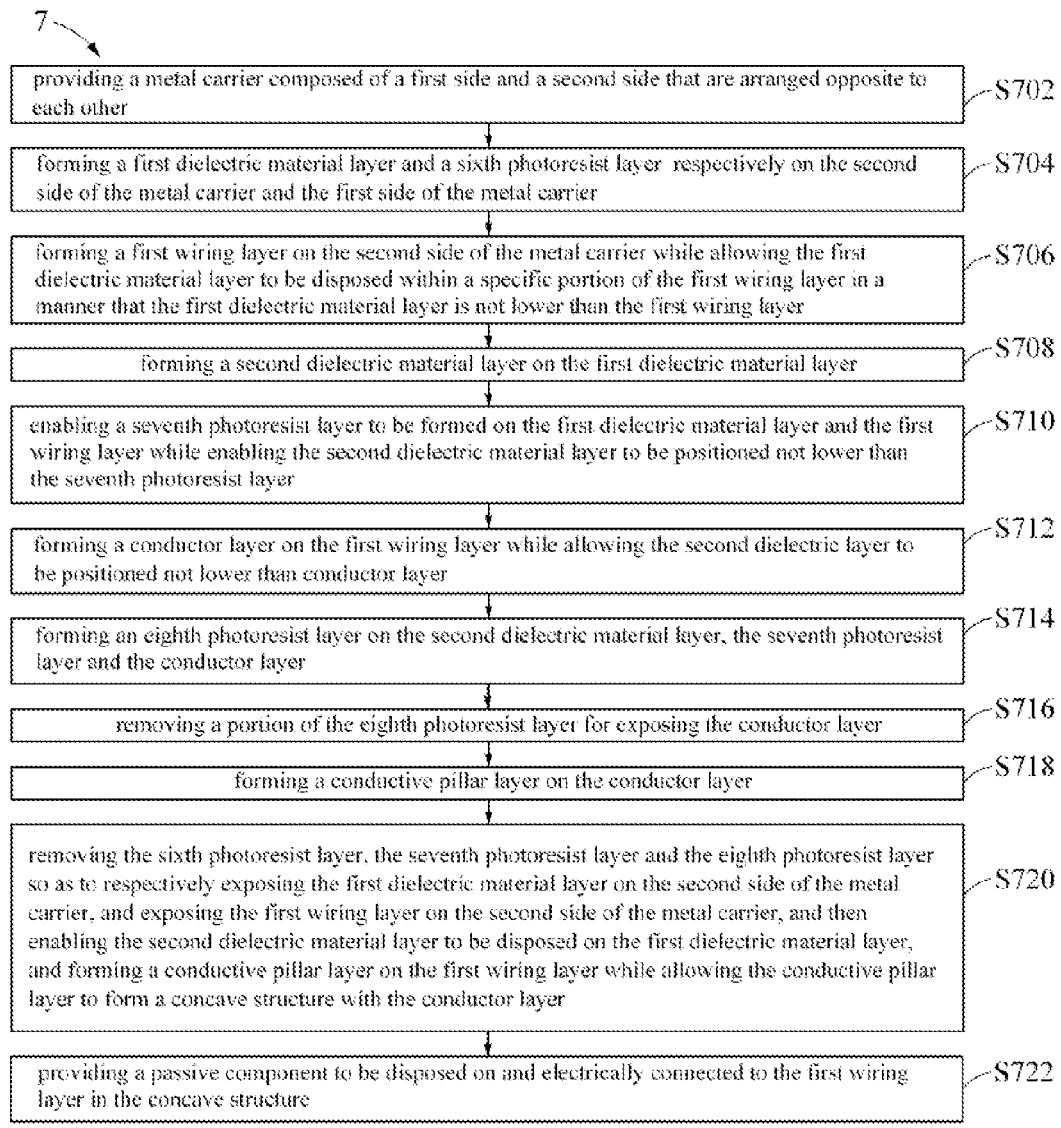
FIG. 9, consisting of 9A and 9B, is a flow chart depicting steps performing in a method for manufacturing a package apparatus of the third embodiment.
Figure 9B:
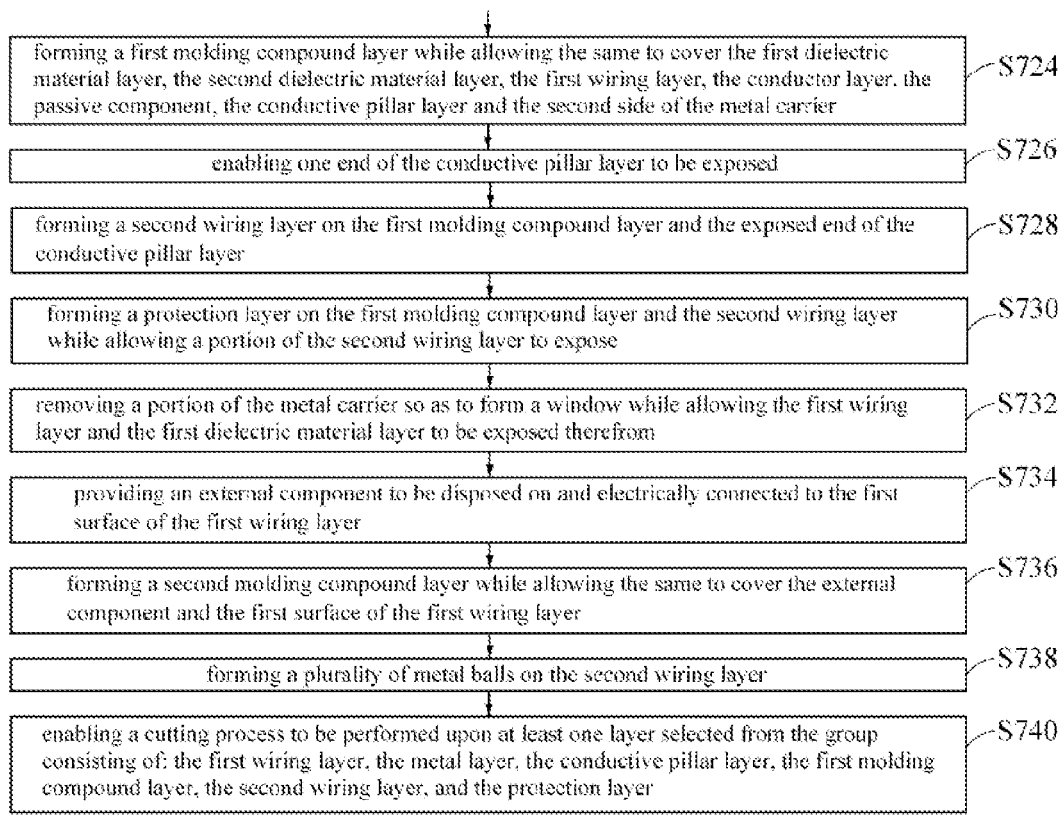
Figure 10A:
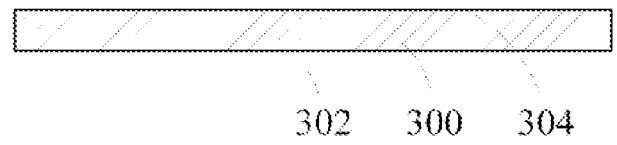
FIG. 10A to FIG. 10T are schematic diagrams illustrating the manufacturing of a package apparatus of the third embodiment.
Figure 10B:
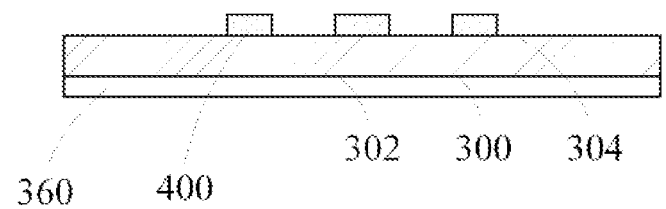
Figure 10C:
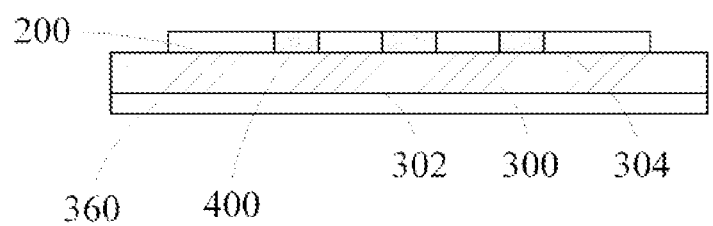
Figure 10D:
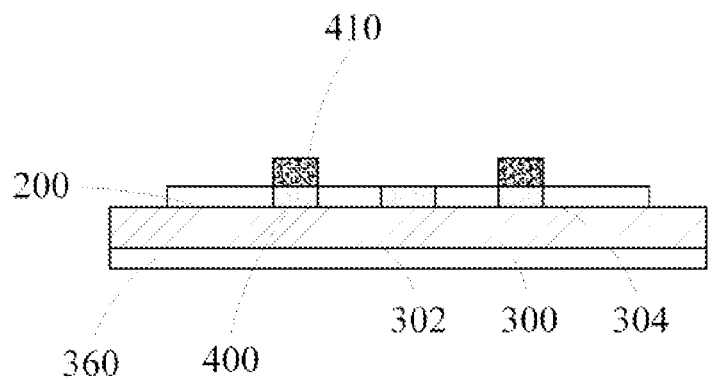
Figure 10E:
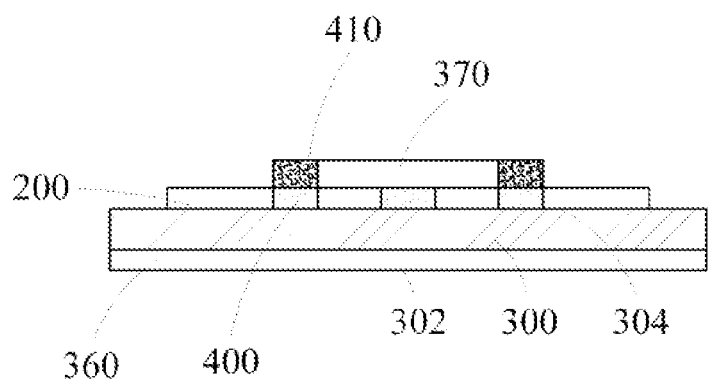
Figure 10F:
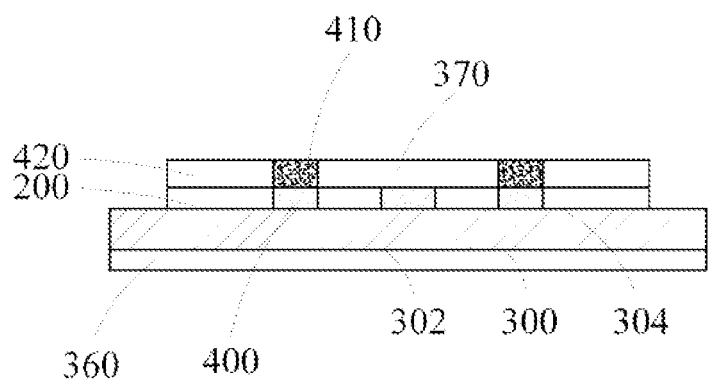
Figure 10G:
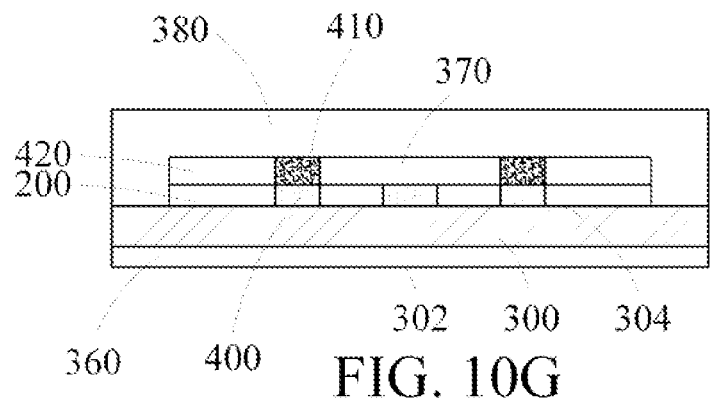
Figure 10H:
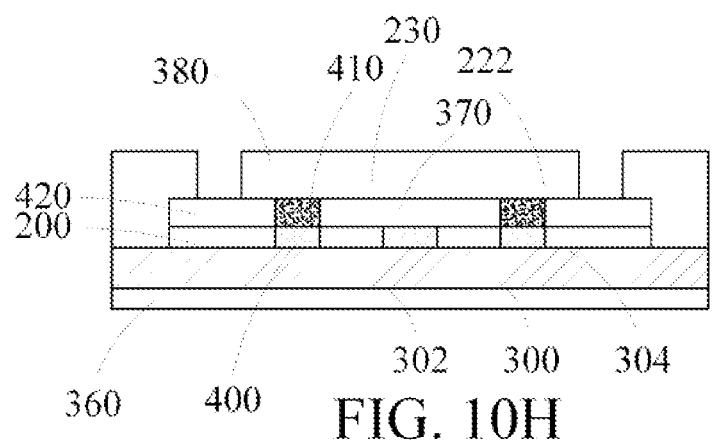
Figure 10I:
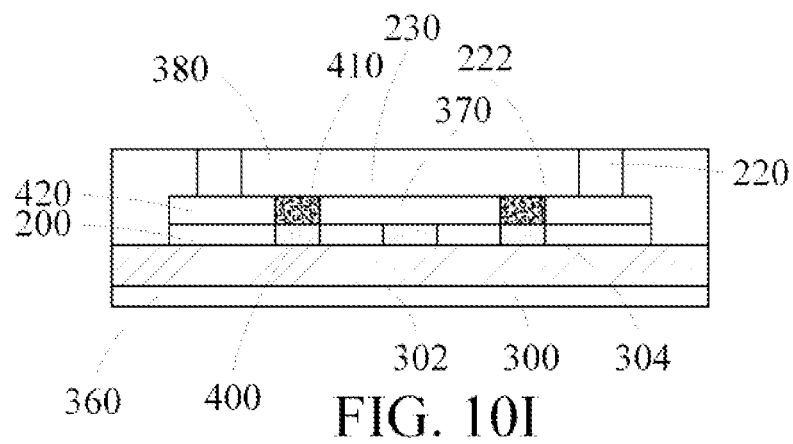
Figure 10J:
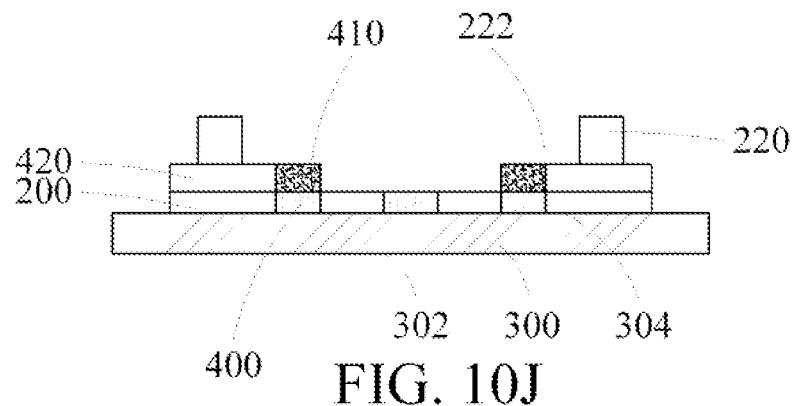
Figure 10K:
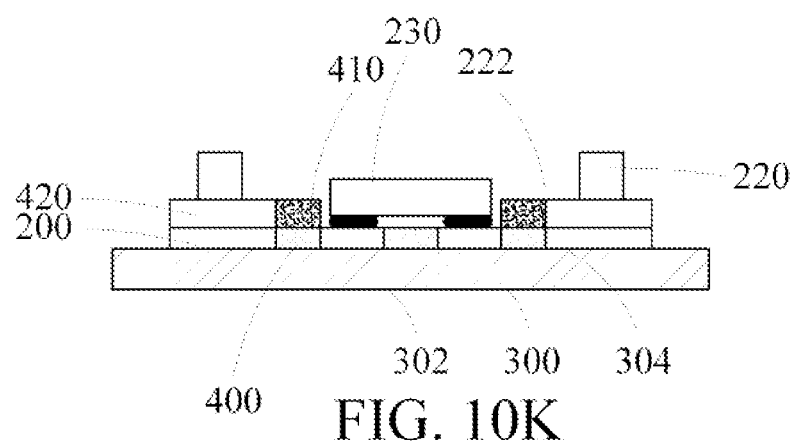
Figure 10L:
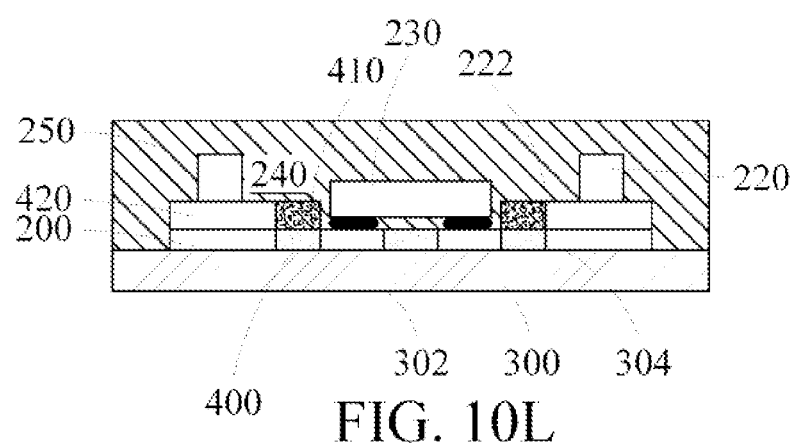
Figure 10M:
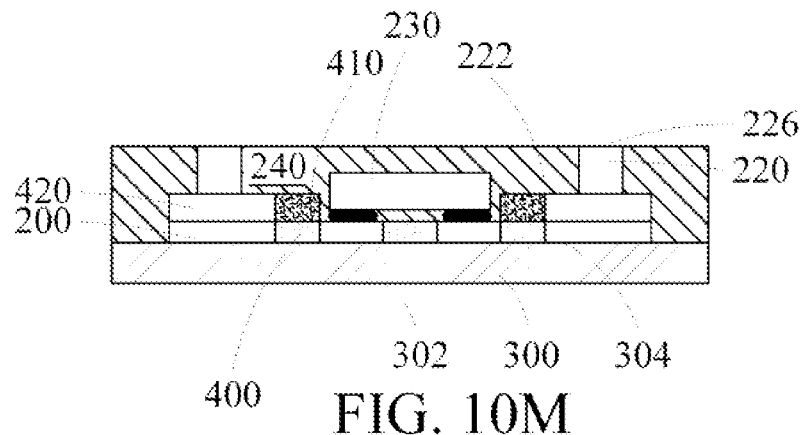
Figure 10N:
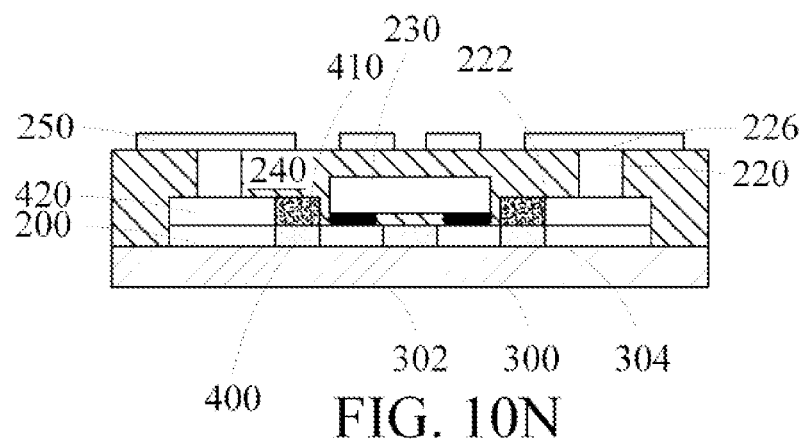
Figure 10O:
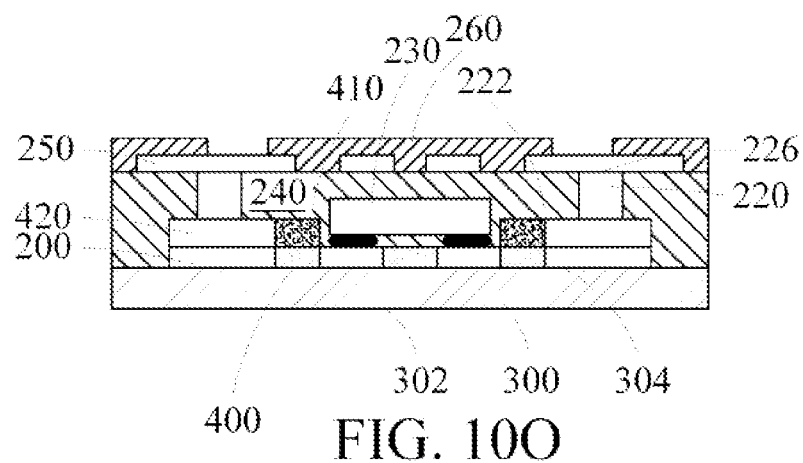
Figure 10P:
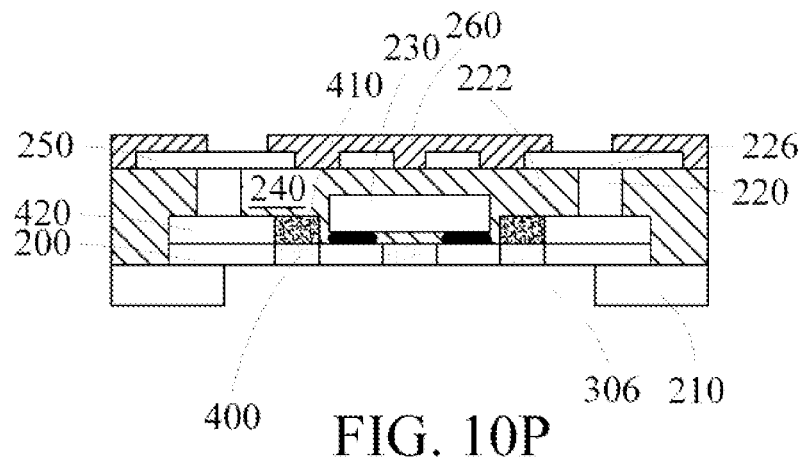
Figure 10Q:
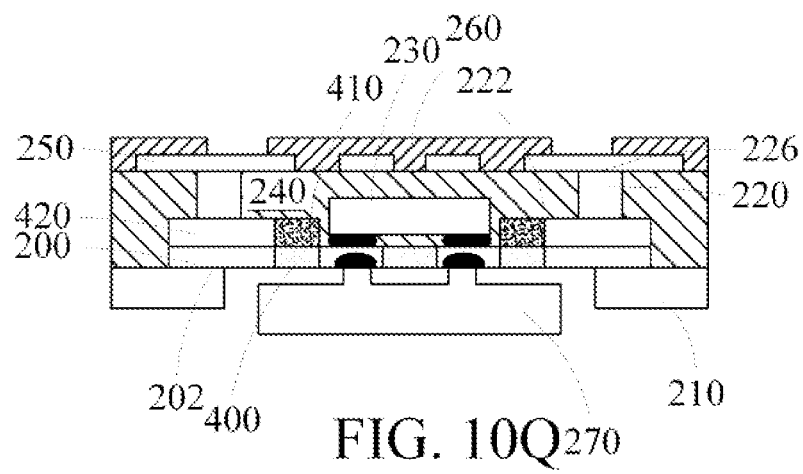
Figure 10R:
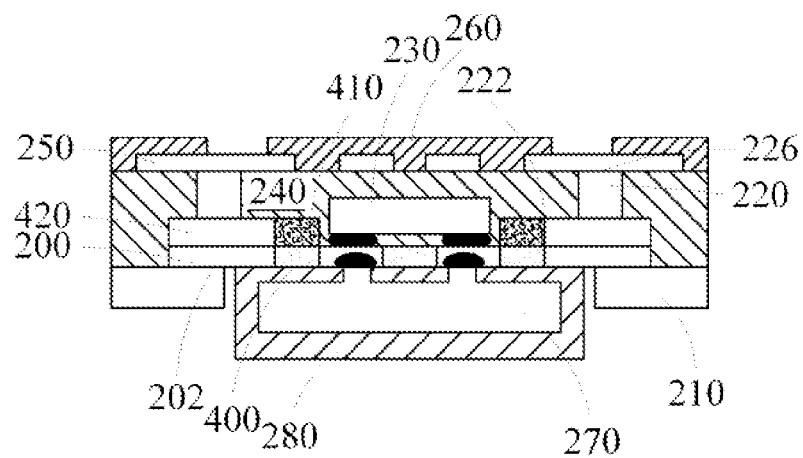
Figure 10S:
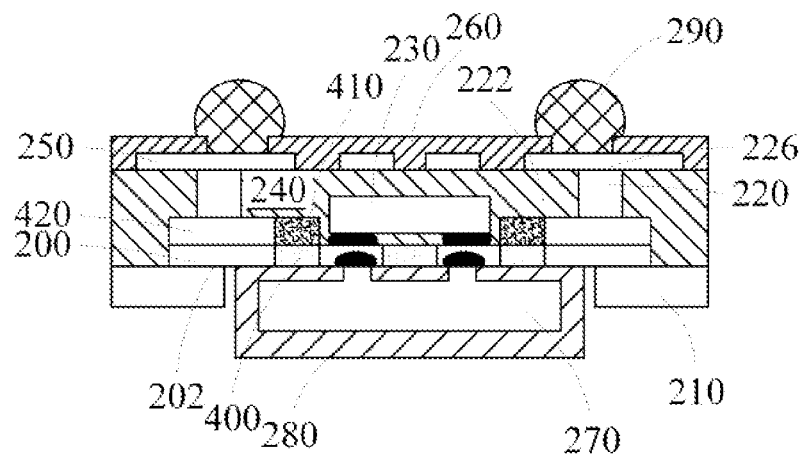
Figure 10T:
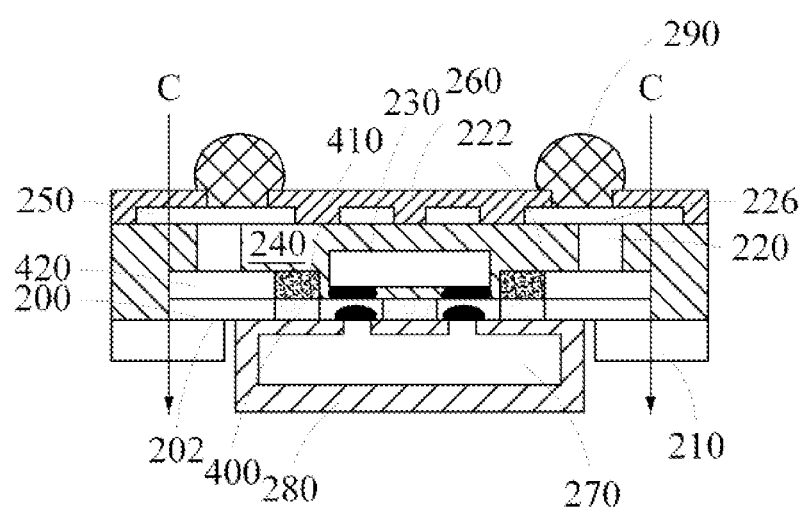

FIG. 9 is a flow chart depicting steps performing in a method for manufacturing a package apparatus of the second embodiment, and FIG. 10A to FIG. 10R are schematic diagrams illustrating the manufacturing of a package apparatus of the first embodiment. As shown in FIG. 9, a method 7 for manufacturing the package apparatus 6 of FIG. 5 comprises the following steps:

step S702: providing a metal carrier 300 composed of a first side 302 and a second side 304 that are arranged opposite to each other, as shown in FIG. 10A;

step S704: forming a first dielectric material layer 400 and a sixth photoresist layer 360 respectively on the second side 304 of the metal carrier 300 and the first side 302 of the metal carrier 304, as shown in FIG. 10B, whereas the first dielectric material layer 400 is formed by first a coating process and then a photolithography and etching process, and the fourth photoresist layer 340 is formed by a dry-film lamination process in this embodiment, but is not limited thereby;

step S706: forming a first wiring layer 200 on the second side 304 of the metal carrier 300 while allowing the first dielectric material layer 400 to be disposed within a specific portion of the first wiring layer 200 in a manner that the first dielectric material layer 400 is not lower than the first wiring layer 200, as shown in FIG. 10C, whereas the first wiring layer 200 is formed using an electrolytic plating process in this embodiment, but is not limited thereby, and moreover, the first wiring layer 200 can be a wiring layer with patterns which includes at least one wire and a chip seat, and the first wiring layer 200 can be made of a metal, such as copper;

step S708: forming a second dielectric material layer 410 on the first dielectric material layer 400, as shown in FIG. 10D, whereas the second wiring layer 610 is formed using first a coating process and then a photolithography and etching process, but is not limited thereby;

step S710: enabling a seventh photoresist layer 370 to be formed on the first dielectric material layer 400 and the first wiring layer 200 while enabling the second dielectric material layer 410 to be positioned not lower than the seventh photoresist layer 370, as shown in FIG. 10E, whereas the seventh photoresist layer 350 is formed by a photography process in this embodiment, but is not limited thereby;

step S712: forming a conductor layer 420 on the first wiring layer 200 while enabling the second dielectric material layer 410 to be positioned not lower tan than the conductor layer 420, as shown in FIG. 10F, whereas the conductor layer 420 is formed by an electrolytic plating process in this embodiment, but is not limited thereby, and the conductor layer can be made from a metal, such as copper;

step S714: forming an eighth photoresist layer 380 on the second dielectric material layer 410, the seventh photoresist layer 370 and the conductor layer 420, as shown in FIG. 10G, whereas the eighth photoresist layer 380 is formed by a dry-film lamination process in this embodiment, but is not limited thereby;

step S716: removing a portion of the eighth photoresist layer 380 for exposing the conductor layer 420, as shown in FIG. 10H, whereas the removal of the eighth photoresist layer 380 is performed using a photography process, but is not limited thereby;

step S718: forming a conductive pillar layer 220 on the conductor layer 420, as shown in FIG. 10I, whereas the conductive pillar layer 220 is formed using an electrolytic plating process in this embodiment, but is not limited thereby, and moreover, the conductive pillar layer 220 includes at least one conductive pillar that can be made of a metal, such as copper and is formed at a position corresponding to the wires and the chip seat of the conductor layer 420;

step S720: removing the sixth photoresist layer 360, the seventh photoresist layer 370 and the eighth photoresist layer 380 so as to respectively exposing the first dielectric material layer 400 on the second side 304 of the metal carrier 300, and exposing the first wiring layer 200 on the second side 304 of the metal carrier 300, and then enabling the second dielectric material layer 410 to be disposed on the first dielectric material layer 400, and forming a conductive pillar layer 200 on the first wiring layer 200 while allowing the conductive pillar layer 220 to form a concave structure 222 with the conductor layer 420, as shown in FIG. 10J, whereas the first dielectric material layer 400 is disposed within a specific portion of the first wiring layer 200 in a manner that the first dielectric material layer 400 is positioned not lower than the first wiring layer 200;

step S722: providing a passive component 230 to be disposed on and electrically connected to the first wiring layer 200 in the concave structure 222, as shown in FIG. 10K;

step S724: forming a first molding compound layer 240 while allowing the same to cover the first dielectric material layer 400, the second dielectric material layer 410, the first wiring layer 200, the conductor layer 420, the passive component 230, the conductive pillar layer 220 and the second side 304 of the metal carrier 300, as shown in FIG. 10L, whereas, in this embodiment, the first molding compound layer 240 is formed by a transfer molding process, and can be made from a material selected from the group consisting of novolac-based resin, epoxy-based resin, silicon-based resign and other molding compounds, whichever can be heated to a liquid state so as to be poured on the second side 304 of the metal carrier 300 for allowing the same to cover the first dielectric material layer 400, the second dielectric material layer 410, the first wiring layer 200, the conductor layer 420, the passive component 230 and the conductive pillar layer 220 under a high-temperature and high-pressure condition, and thereafter, to be cured into the first molding compound layer 240, and moreover the first molding compound layer 240 can be composed of a kind of filler, such as a powder silicon dioxide; and in another embodiment, the first molding compound layer 240 can be formed by the use of an injection molding process or a compression molding process, and the formation of the first molding compound layer 240 can include the steps of: providing a molding compound to be heated to a liquid state, whereas the molding compound is composed of a resin and powder silicon dioxide; pouring the liquefied molding compound on the second side 304 of the metal carrier 300 while allowing the molding compound to cover the first dielectric material layer 400, the second dielectric material layer 410, the first wiring layer 200, the conductor layer 420, the passive component 230 and the conductive pillar layer 220 under a high-temperature and high-pressure condition; and curing the molding compound for enabling the same to form the first molding compound layer 240, but is not limited thereby;

step S726: enabling one end 226 of the conductive pillar layer 220 to be exposed, as shown in FIG. 10M, whereas in this embodiment, the exposing of the end 226 of the conductive pillar layer 220 is enabled by grinding and removing a portion of the first molding compound layer 240, however, under ideal condition, the end 226 of the conductive pillar layer 220 is positioned coplanar with the first molding compound layer 240, by that the exposing of the end 226 of the conductive pillar layer 220 can be achieved simultaneously with the formation of the first molding compound layer 240, and thus the process for grinding and removing of the first molding compound layer 240 can be avoided;

step S728: forming a second wiring layer 250 on the first molding compound layer 240 and the exposed end 226 of the conductive pillar layer 220, as shown in FIG. 10N, whereas the second wiring layer 250 can be formed by the use of an electroless plating process, a sputtering coating process, or a thermal coating process, but is not limited thereby, and moreover, the second wiring layer 250 can be a wiring layer with patterns which includes at least one wire and is a layer formed at a position corresponding to the end 226 of the conductive pillar layer 220, moreover, the second wiring layer 250 can be made of a metal, such as copper;

step S730: forming a protection layer 260 on the first molding compound layer 240 and the second wiring layer 250 while allowing a portion of the second wiring layer 250 to expose, as shown in FIG. 10O, whereas the protection layer 260 is used for insulating wires in the second wiring layer 250;

step S732: removing a portion of the metal carrier 300 so as to form a window 306 while allowing the first wiring layer 200 and the first dielectric material layer 400 to be exposed therefrom, as shown in FIG. 10P, whereas the removal of the metal carrier 300 can be performed using a photolithography and etching process, and moreover, the wires and the chip seat of the first wiring layer 200 is also exposed from the window 306, and thus the portion of the metal carrier 300 that is not removed is substantially being formed into a metal layer 210;

step S734: providing an external component 270 to be disposed on and electrically connected to the first surface 202 of the first wiring layer 200, as shown in FIG. 10Q, whereas, in an embodiment, the external component 270 can be an active component, a passive component, a semiconductor chip or a flexible circuit board, but is not limited thereby;

step S736: forming a second molding compound layer 280 while allowing the same to cover the external component 270 and the first surface 202 of the first wiring layer 200, as shown in FIG. 10R, whereas, in this embodiment, the second molding compound layer 280 is formed by a transfer molding process, and can be made from a material selected from the group consisting of novolac-based resin, epoxy-based resin, silicon-based resign and other molding compounds, whichever can be heated to a liquid state so as to be poured on the second side 304 of the metal carrier 300 for allowing the same to cover the external component 270 and the first surface 202 of the first wiring layer 200, under a high-temperature and high-pressure condition, and thereafter, to be cured into the second molding compound layer 280, and moreover the second molding compound layer 280 can be composed of a kind of filler, such as a powder silicon dioxide; and in another embodiment, the second molding compound layer 280 can be formed by the use of an injection molding process or a compression molding process;

step S738: forming a plurality of metal balls 290 on the second wiring layer 250, as shown in FIG. 10S, whereas each of the metal balls 290 can be made of a metal, such as copper;

step S740: enabling a cutting process C to be performed upon at least one layer selected from the group consisting of: the first wiring layer 200, the metal layer 210, the conductive pillar layer 220, the first molding compound layer 240, the second wiring layer 250, and the protection layer 260, as shown in FIG. 4Q, by that a package apparatus 6 of FIG. 8 can be achieved.

Comparing to the package apparatus 4 of the second embodiment, the package apparatus 6 of the third embodiment is additionally formed with one conductor layer, by that the height of the conductive pillar layer is lowered and then the manufacture difficulty is reduced. Moreover, since the thickness of the corresponding first molding compound layer is also reduced that the work for grinding and removal the first molding compound layer to a thinner layer is minimized, the complexity of the manufacture process is reduced and thus the manufacture cost is lowered.

To sum up, in the first embodiment, the present invention provides a package apparatus, using which a molding compound layer can be used as the major material in the manufacturing of a coreless substrate, and therefore not only a less expensive molding compound substrate can be used for replacing the costly conventional fiberglass substrate, but also the conventional expensive and time consuming laser blind/buried hole formation process on four-layered structure can be replaced by a faster and simpler electroplating conductive pillar process on less costly two-layered structure.

In the second embodiment of the present invention, the package apparatus 4 uses the first dielectric material layer to replace the use of the first photoresist layer in the first embodiment, by that two dry-film lamination processes and one film removal process can be saved and avoided in the method for forming the package apparatus 4 of the second embodiment, and thus the risk of incomplete film removal can be avoided. In addition, since gaps between wires in the first wiring layer can be filled by the first dielectric material layer at the same time when the first molding compound layer is being formed, the risk of having air bubbles in wire gaps due to insufficient filling of the first molding compound layer can also be avoided.

In the third embodiment of the present invention, the package apparatus 6 is additionally formed with one conductor layer, by that the height of the conductive pillar layer is lowered and then the manufacture difficulty is reduced. Moreover, since the thickness of the corresponding first molding compound layer is also reduced that the work for grinding and removal the first molding compound layer to a thinner layer is minimized, the complexity of the manufacture process is reduced and thus the manufacture cost is lowered.

Figure 11:
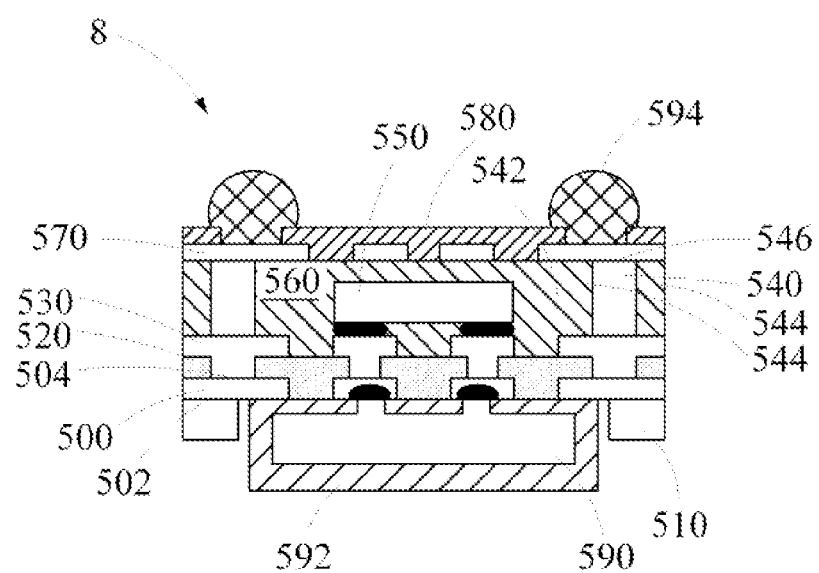
FIG. 11 is a schematic diagram showing a package apparatus according to a fourth embodiment of the present invention.

Please refer to FIG. 11, which is a schematic diagram showing a package apparatus according to a fourth embodiment of the present invention. In the fourth embodiment shown in FIG. 11, the package apparatus 8 comprises: a first wiring layer 500, a metal layer 510, a first dielectric material layer 520, a second wiring layer 530, a conductive pillar layer 540, a passive component 550, a first molding compound layer 560, a third wiring layer 570, and a protection layer 580. The first wiring layer 500 has a first surface 502 and a second surface 504 that are arranged opposite to each other. The first dielectric material layer 520 is disposed on a specific portion of the first wiring layer 500 in a manner that the first dielectric material layer 520 is not to be exposed on the first surface 502 of the first wiring layer 500. The second wiring layer 530 is disposed on the first wiring layer 500 and the first dielectric material layer 520. The metal layer 510 is disposed on the first surface 502 of the first wiring layer 500. The conductive pillar layer 540 is disposed on the second wiring layer 530, forming a concave structure 542 with the second wiring layer 530. The passive component 550 is disposed on and electrically connected to the second wiring layer 530 in the concave structure 542. The first molding compound layer 560 is disposed on a specific portion 544 of the second wiring layer 530 and the conductive pillar layer 540 while allowing the same to cover the passive component 550 in a manner that the first molding compound layer 560 is not exposed on one end 546 of the conductive pillar layer 540. It is noted that although the first molding compound layer 560 is formed covering on every portion of the second wiring layer 530 and the conductive pillar layer 540, but it is not limited thereby. Moreover, the first molding compound layer 560 can be composed of a material selected from the group consisting of novolac-based resin, epoxy-based resin, silicon-based resign and other molding compounds, but it is also not limited thereby. The third wiring layer 570 is disposed on the first molding compound layer 560 and the end 546 of the conductive pillar layer 540. The protection layer 580 is disposed on the first molding compound layer 560 and the third wiring layer 570.

In addition, the package apparatus 8 can further comprises: an external component 590, a second molding compound layer 592 and a plurality of metal balls 594, in which the external component 590 is disposed on and electrically connected to the first surface 502 of the first wiring layer 500; the second molding compound layer 592 is disposed on the external component 590 and the first surface 502 of the first wiring layer 500; and the plural metal balls 594 are disposed on the third wiring layer 570. It is noted that the external component 590 is a unit selected from the group consisting of: an active component, a passive component, a semiconductor chip and a flexible circuit board, but is not limited thereby.

Figure 12:
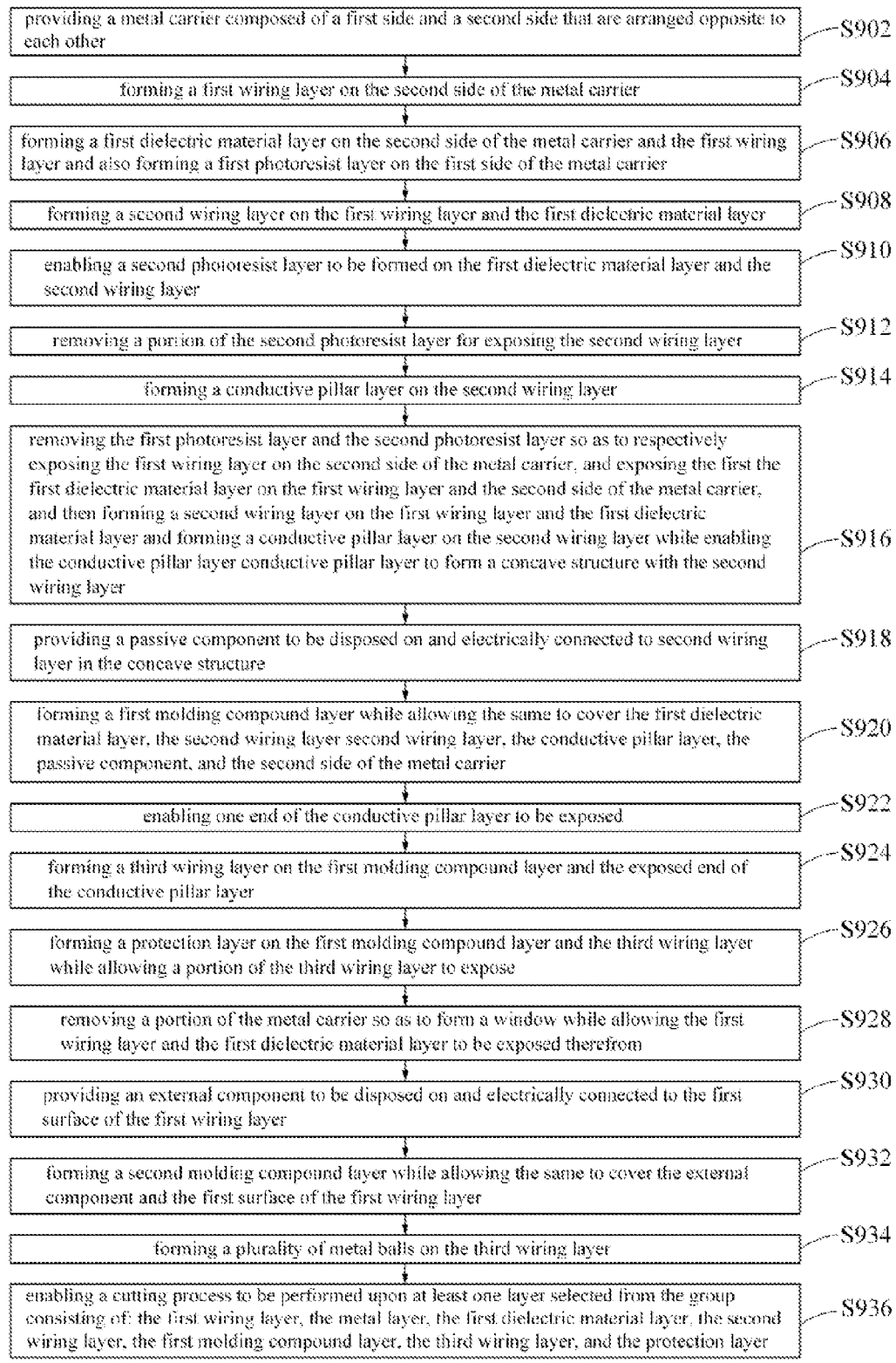
FIG. 12 is a flow chart depicting steps performing in a method for manufacturing a package apparatus of the fourth embodiment.
Figure 13A:
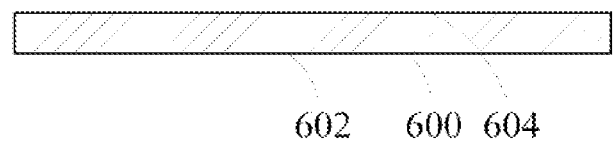
FIG. 13A to FIG. 13R are schematic diagrams illustrating the manufacturing of a package apparatus of the fourth embodiment.
Figure 13B:
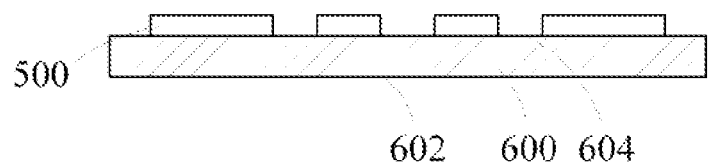
Figure 13C:
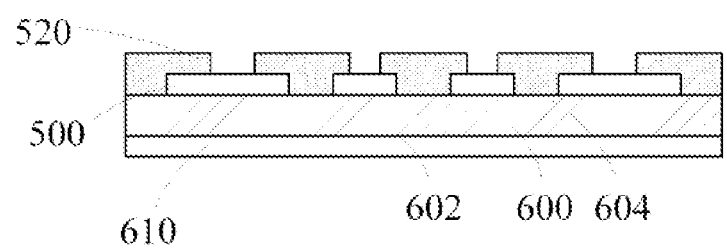
Figure 13D:
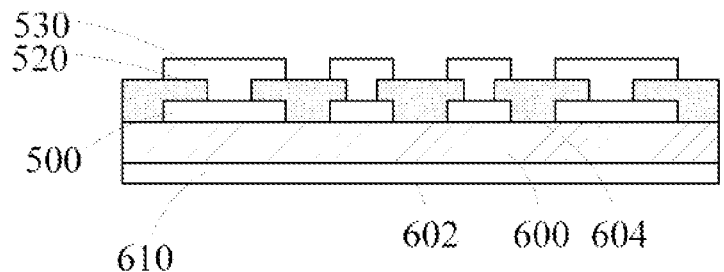
Figure 13E:
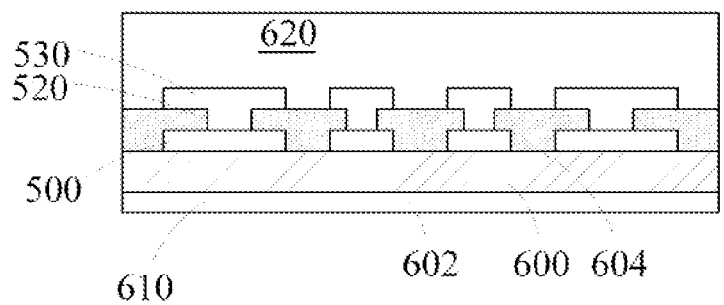
Figure 13F:
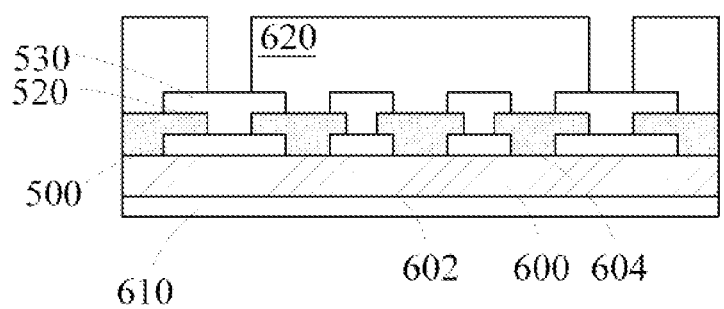
Figure 13G:
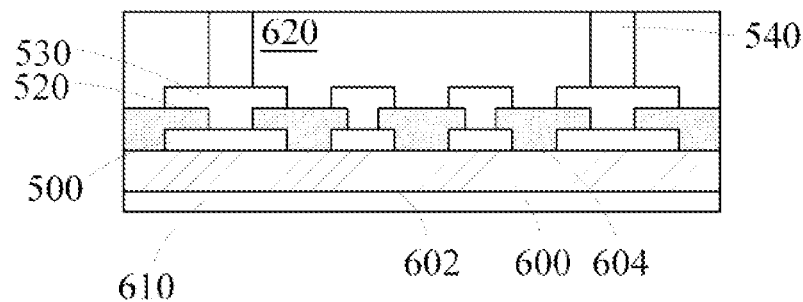
Figure 13H:
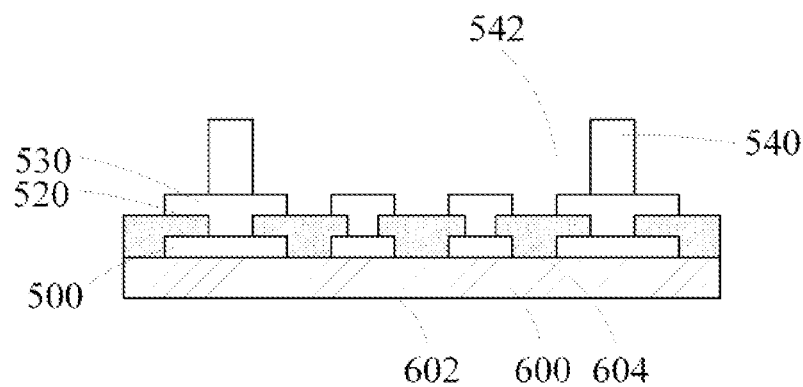
Figure 13I:
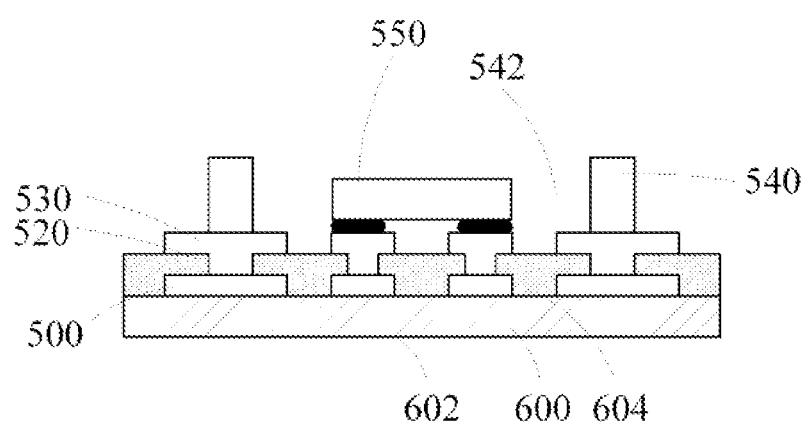
Figure 13J:
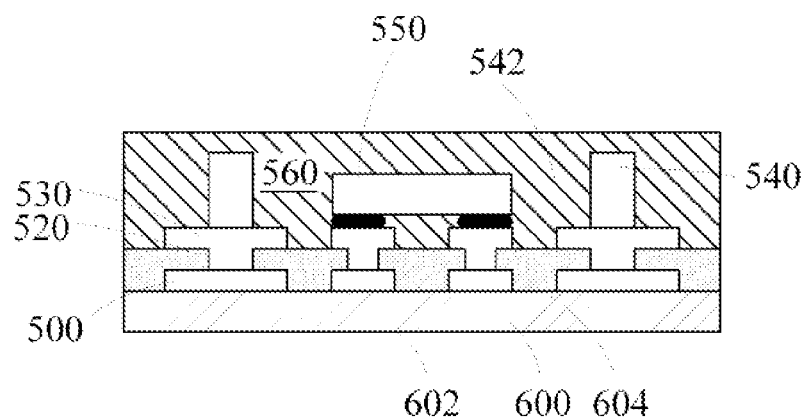
Figure 13K:
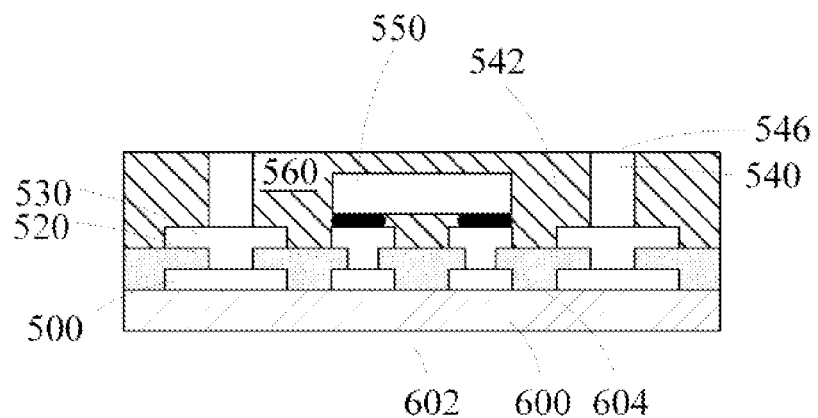
Figure 13L:
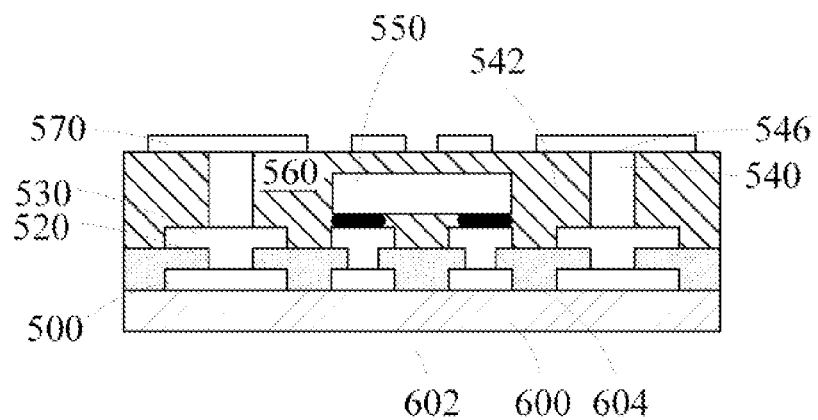
Figure 13M:
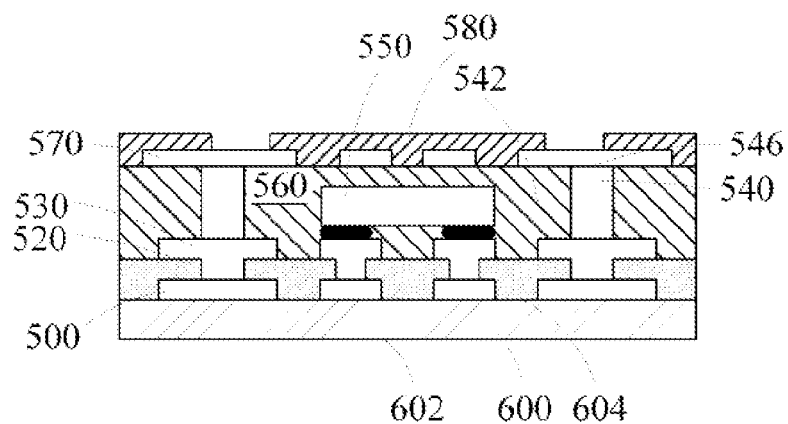
Figure 13N:
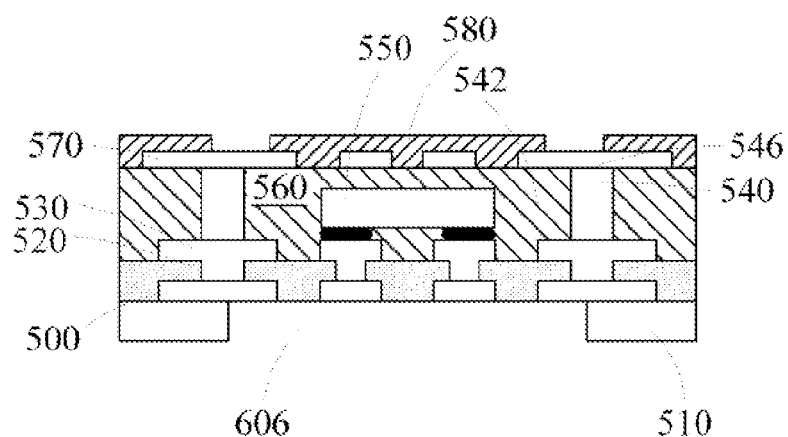
Figure 13O:
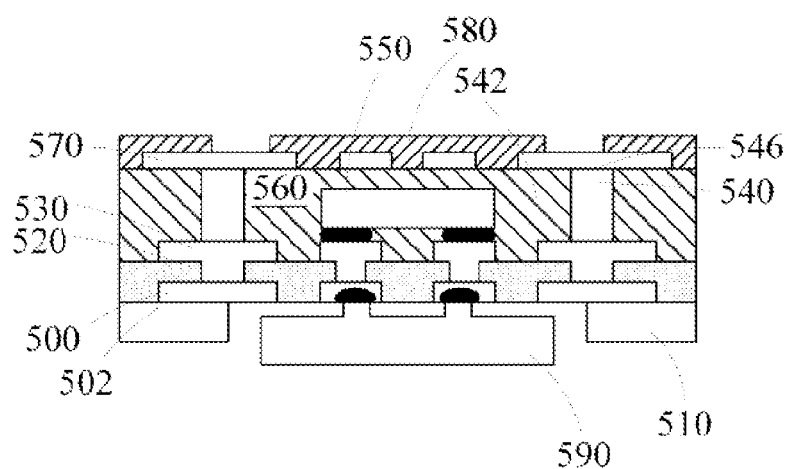
Figure 13P:
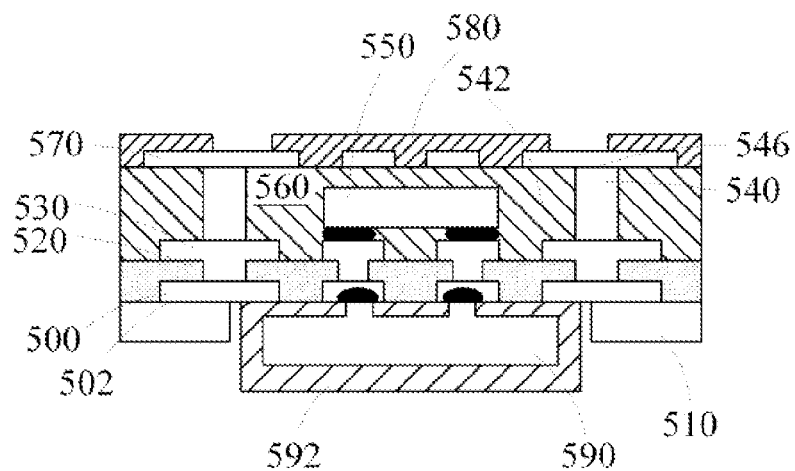
Figure 13Q:
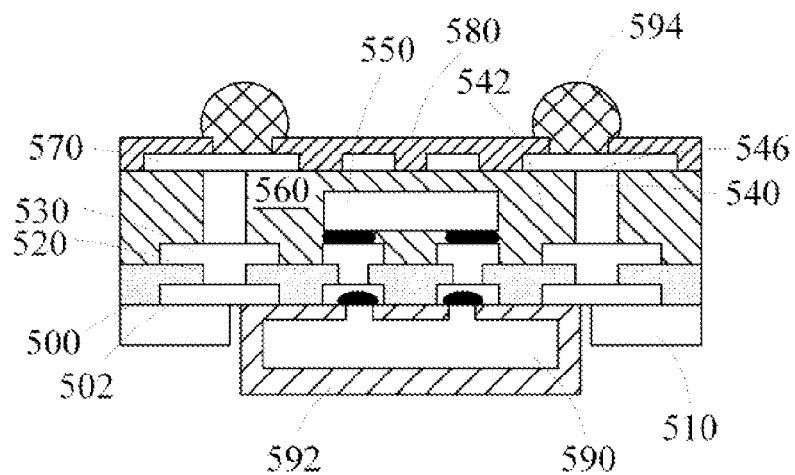
Figure 13R:
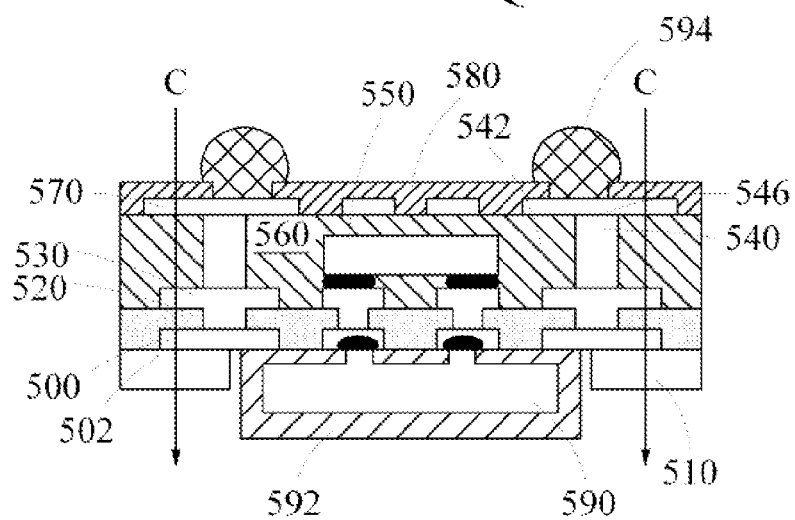

FIG. 12 is a flow chart depicting steps performing in a method for manufacturing a package apparatus of the fourth embodiment, and FIG. 13A to FIG. 13R are schematic diagrams illustrating the manufacturing of a package apparatus of the fourth embodiment. As shown in FIG. 12, a method 9 for manufacturing the package apparatus 8 of FIG. 11 comprises the following steps:

step S902: providing a metal carrier 600 composed of a first side 602 and a second side 604 that are arranged opposite to each other, as shown in FIG. 13A;

step S904: forming a first wiring layer 500 on the second side 604 of the metal carrier 600, as shown in FIG. 13B, whereas the first wiring layer 500 is formed first using an electroless plating process, a sputtering coating process, or a thermal coating process, and then a photography and etching process in this embodiment, but is not limited thereby, and moreover, the first wiring layer 500 can be a wiring layer with patterns which includes at least one wire and at least one chip seat, and the first wiring layer 500 can be made of a metal, such as copper;

step S906: forming a first dielectric material layer 520 on the second side 604 of the metal carrier 600 and the first wiring layer 500 and also forming a first photoresist layer 610 on the first side 602 of the metal carrier 600, as shown in FIG. 13C, whereas the first dielectric material layer 520 is formed by first a coating process and then a photolithography and etching process, and the first photoresist layer 610 is formed by a dry-film lamination process in this embodiment, but is not limited thereby;

step S908: forming a second wiring layer 530 on the first wiring layer 500 and the first dielectric material layer 520, as shown in FIG. 13D, whereas the second wiring layer 530 is formed first using an electroless plating process, a sputtering coating process, or a thermal coating process, and then a photography and etching process in this embodiment, but is not limited thereby, and moreover, the second wiring layer 530 can be a wiring layer with patterns which includes at least one wire, disposed at a position corresponding to the first wiring layer 500 that is exposed;

step S910: enabling a second photoresist layer 620 to be formed on the first dielectric material layer 520 and the second wiring layer 530, as shown in FIG. 13E, whereas the second photoresist layer 620 is formed by a dry-film lamination process in this embodiment, but is not limited thereby;

step S912: removing a portion of the second photoresist layer 620 for exposing the second wiring layer 530, as shown in FIG. 13F, whereas the removal of the second photoresist layer 620 is achieved using a photography process in this embodiment, but it is not limited thereby;

step S914: forming a conductive pillar layer 540 on the second wiring layer 530, as shown in FIG. 13G, whereas the conductive pillar layer 540 is formed using an electrolytic plating process in this embodiment, but is not limited thereby, and moreover, the conductive pillar layer 540 includes at least one conductive pillar that can be made of a metal, such as copper and is formed at a position corresponding to the wires of the second wiring layer 530;

step S916: removing the first photoresist layer 610 and the second photoresist layer 620 so as to respectively exposing the first wiring layer 500 on the second side 604 of the metal carrier 600, and exposing the first the first dielectric material layer 520 on the first wiring layer 500 and the second side 604 of the metal carrier 600, and then forming a second wiring layer 530 on the first wiring layer 500 and the first dielectric material layer 520 and forming a conductive pillar layer 540 on the second wiring layer 530 while enabling the conductive pillar layer 540 conductive pillar layer 540 to form a concave structure 542 with the second wiring layer 530, as shown in FIG. 13H;

step S918: providing a passive component 550 to be disposed on and electrically connected to second wiring layer 530 in the concave structure 542, as shown in FIG. 13I;

step S920: forming a first molding compound layer 560 while allowing the same to cover the first dielectric material layer 520, the second wiring layer 530 second wiring layer 530, the conductive pillar layer 540, the passive component 550, and the second side 604 of the metal carrier 600, as shown in FIG. 13J, whereas, in this embodiment, the first molding compound layer 560 is formed by a transfer molding process, and can be made from a material selected from the group consisting of novolac-based resin, epoxy-based resin, silicon-based resign and other molding compounds, whichever can be heated to a liquid state so as to be poured on the second side 604 of the metal carrier 600 for allowing the same to cover the first dielectric material layer 520, the second wiring layer 530, he conductive pillar layer 540, and the passive component 550 under a high-temperature and high-pressure condition, and thereafter, to be cured into the first molding compound layer 560, and moreover the first molding compound layer 560 can be composed of a kind of filler, such as a powder silicon dioxide; and in another embodiment, the first molding compound layer 560 can be formed by the use of an injection molding process or a compression molding process, and the formation of the first molding compound layer 560 can include the steps of: providing a molding compound to be heated to a liquid state, whereas the molding compound is composed of a resin and powder silicon dioxide; pouring the liquefied molding compound on the second side 604 of the metal carrier 600 while allowing the molding compound to cover the first dielectric material layer 520, the second wiring layer 530, he conductive pillar layer 540, and the passive component 550 under a high-temperature and high-pressure condition; and curing the molding compound for enabling the same to form the first molding compound layer 560, but is not limited thereby;

step S922: enabling one end 546 of the conductive pillar layer 540 to be exposed, as shown in FIG. 13K, whereas in this embodiment, the exposing of the end 546 of the conductive pillar layer 540 is enabled by grinding and removing a portion of the first molding compound layer 560, however, under ideal condition, the end 546 of the conductive pillar layer 540 is positioned coplanar with the first molding compound layer 560, by that the exposing of the end 546 of the conductive pillar layer 540 can be achieved simultaneously with the formation of the first molding compound layer 560, and thus the process for grinding and removing of the first molding compound layer 560 can be avoided;

step S924: forming a third wiring layer 570 on the first molding compound layer 560 and the exposed end 546 of the conductive pillar layer 540, as shown in FIG. 13L, whereas the third wiring layer 570 can be formed by the use of an electroless plating process, a sputtering coating process, or a thermal coating process, but is not limited thereby, and moreover, the third wiring layer 570 can be a wiring layer with patterns which includes at least one wire that is to be formed at a position corresponding to the end 546 of the conductive pillar layer 540, moreover, the third wiring layer 570 can be made of a metal, such as copper;

step S926: forming a protection layer 580 on the first molding compound layer 560 and the third wiring layer 570 while allowing a portion of the third wiring layer 570 to expose, as shown in FIG. 13M, whereas the protection layer 580 is used for insulating wires in the third wiring layer 570;

step S928: removing a portion of the metal carrier 600 so as to form a window 606 while allowing the first wiring layer 500 and the first dielectric material layer 520 to be exposed therefrom, as shown in FIG. 13N, whereas the removal of the metal carrier 600 can be performed using a photolithography and etching process, and moreover, the wires and the chip seat of the first wiring layer 500 is also exposed from the window 606, and thus the portion of the metal carrier 600 that is not removed is substantially being formed into a metal layer 510;

step S930: providing an external component 590 to be disposed on and electrically connected to the first surface 502 of the first wiring layer 500, as shown in FIG. 13O, whereas, in an embodiment, the external component 590 can be an active component, a passive component, a semiconductor chip or a flexible circuit board, but is not limited thereby;

step S932: forming a second molding compound layer 592 while allowing the same to cover the external component 590 and the first surface 502 of the first wiring layer 500, as shown in FIG. 13P, whereas, in this embodiment, the second molding compound layer 592 is formed by a transfer molding process, and can be made from a material selected from the group consisting of novolac-based resin, epoxy-based resin, silicon-based resign and other molding compounds, whichever can be heated to a liquid state so as to be poured on the second side 604 of the metal carrier 600 for allowing the same to cover the external component 590 and the first surface 502 of the first wiring layer 500, under a high-temperature and high-pressure condition, and thereafter, to be cured into the second molding compound layer 592, and moreover the second molding compound layer 592 can be composed of a kind of filler, such as a powder silicon dioxide; and in another embodiment, the second molding compound layer 592 can be formed by the use of an injection molding process or a compression molding process;

step S934: forming a plurality of metal balls 594 on the third wiring layer 570, as shown in FIG. 13Q, whereas each of the metal balls 594 can be made of a metal, such as copper;

step S936: enabling a cutting process C to be performed upon at least one layer selected from the group consisting of: the first wiring layer 500, the metal layer 510, the first dielectric material layer 520, the second wiring layer 530, the first molding compound layer 560, the third wiring layer 570, and the protection layer 580, as shown in FIG. 13R, by that a package apparatus 8 of FIG. 11 can be achieved.

It is noted that the package apparatus 8 in this fourth embodiment uses the first molding compound layer as a coreless substrate so that the conventional expensive fiberglass substrate is not required, and also the conventional expensive and time consuming laser blind/buried hole formation process on four-layered structure can be replaced by a faster and simpler electroplating conductive pillar process on less costly three-layered structure.

Figure 14:
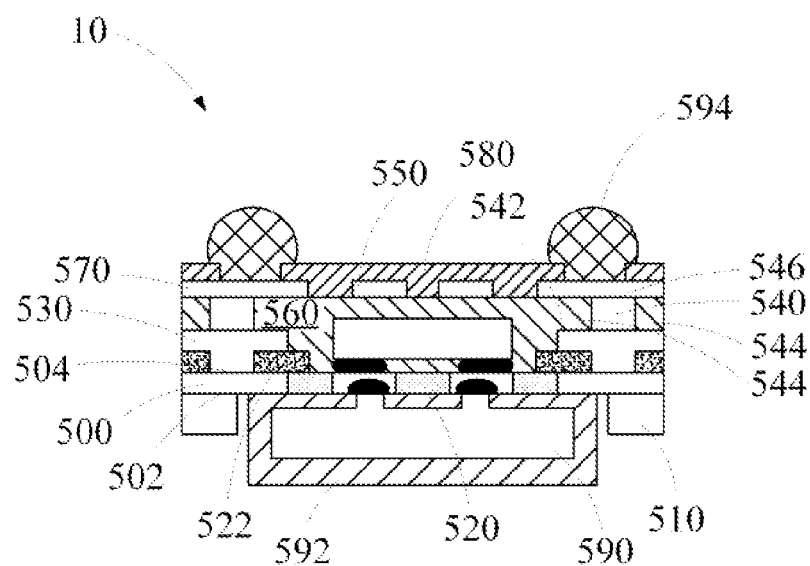
FIG. 14 is a schematic diagram showing a package apparatus according to a fifth embodiment of the present invention.

Please refer to FIG. 14, which is a schematic diagram showing a package apparatus according to a fifth embodiment of the present invention. In the fifth embodiment shown in FIG. 14, the package apparatus 10, that is formed basically the same as the package apparatus 8 shown in the fourth embodiment, comprises: a first wiring layer 500, a metal layer 510, a first dielectric material layer 520, a second dielectric material layer 522, a second wiring layer 530, a conductive pillar layer 540, a passive component 550, a first molding compound layer 560, a third wiring layer 570, and a protection layer 580. The first wiring layer 500 has a first surface 502 and a second surface 504 that are arranged opposite to each other. The metal layer is disposed on the first surface 502 of the first wiring layer 500. The first dielectric material layer 520 is disposed on a specific portion of the first wiring layer 500 in a manner that the first dielectric material layer 520 is not to be exposed on the first surface 502 of the first wiring layer 500 while being positioned not lower than the second surface 504 of the first wiring layer 500. The second dielectric material layer 522 is disposed on the first wiring layer 500 and the first dielectric material layer 520. The second wiring layer 530 is disposed on the first wiring layer 500 and the second dielectric material layer 522. The metal layer 510 is disposed on the first surface 502 of the first wiring layer 500. The conductive pillar layer 540 is disposed on the second wiring layer 530, forming a concave structure 542 with the second wiring layer 530. The passive component 550 is disposed on and electrically connected to the first wiring layer 500 in the concave structure 542. The first molding compound layer 560 is disposed on a specific portion 544 of the first dielectric material layer 520, the second dielectric material layer 522, the second wiring layer 530 and the conductive pillar layer 540 while allowing the same to cover the passive component 550 in a manner that the first molding compound layer 560 is not exposed on one end 546 of the conductive pillar layer 540. It is noted that although the first molding compound layer 560 is formed covering on every portion of the second wiring layer 530 and the conductive pillar layer 540, but it is not limited thereby. Moreover, the first molding compound layer 560 can be composed of a material selected from the group consisting of novolac-based resin, epoxy-based resin, silicon-based resign and other molding compounds, but it is also not limited thereby. The third wiring layer 570 is disposed on the first molding compound layer 560 and the end 546 of the conductive pillar layer 540. The protection layer 580 is disposed on the first molding compound layer 560 and the third wiring layer 570.

Similarly, the package apparatus 10 can further comprises: an external component 590, a second molding compound layer 592 and a plurality of metal balls 594, in which the external component 590 is disposed on and electrically connected to the first surface 502 of the first wiring layer 500; the second molding compound layer 592 is disposed on the external component 590 and the first surface 502 of the first wiring layer 500; and the plural metal balls 594 are disposed on the third wiring layer 570. It is noted that the external component 590 is a unit selected from the group consisting of: an active component, a passive component, a semiconductor chip and a flexible circuit board, but is not limited thereby.

Figure 15A:
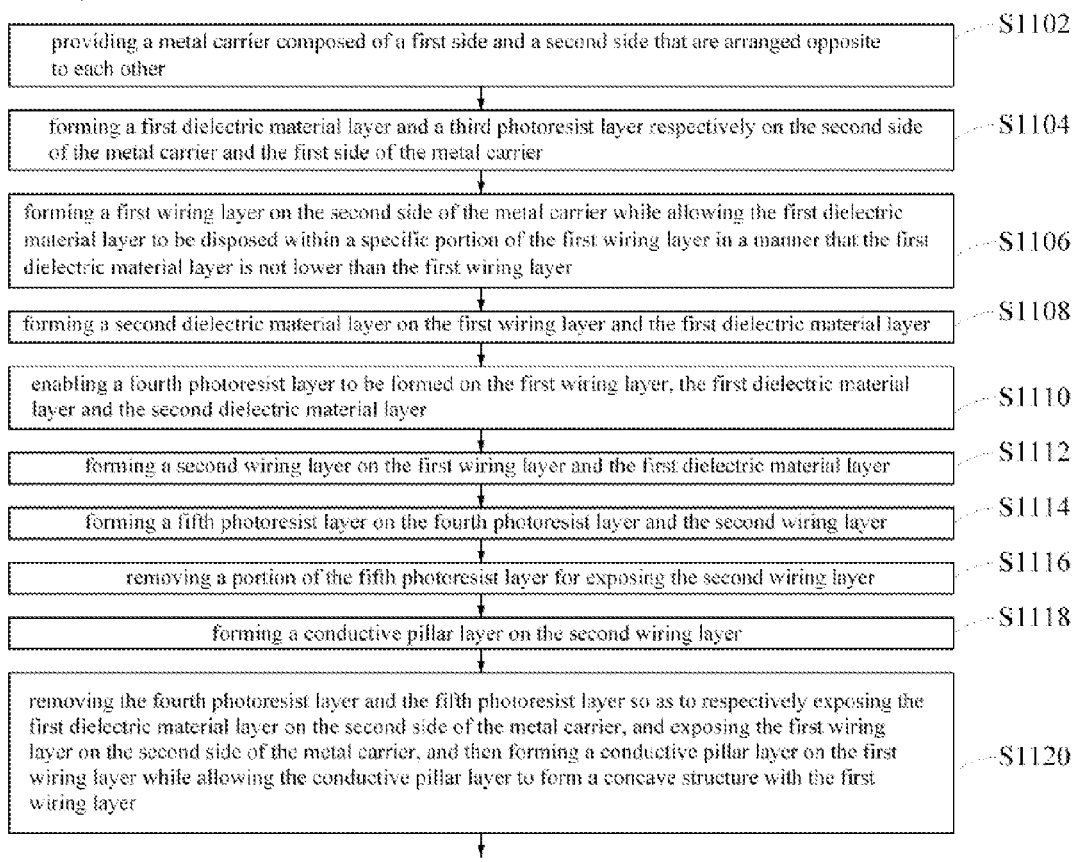
FIG. 15, consisting of 15A and 15B, is a flow chart depicting steps performing in a method for manufacturing a package apparatus of the fifth embodiment.
Figure 15B:
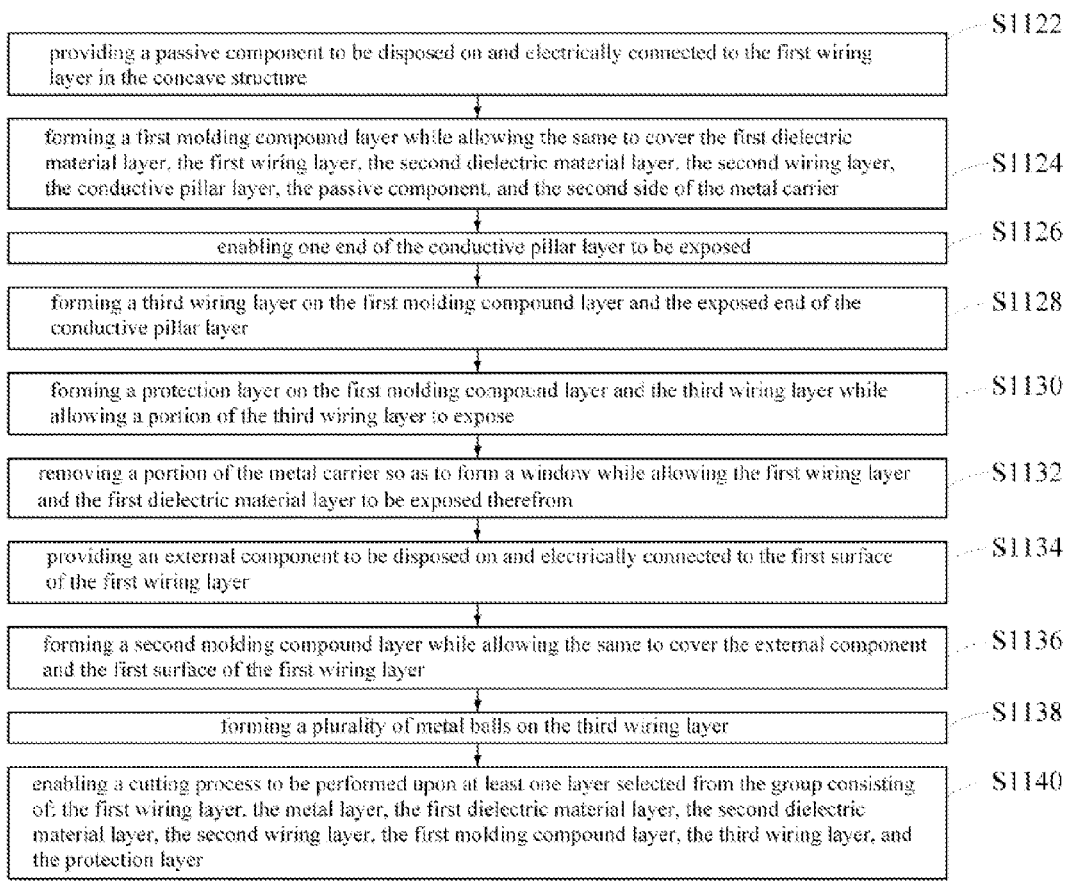
Figure 16A:
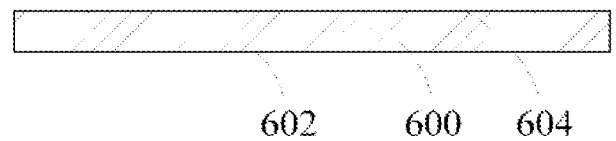
FIG. 16A to FIG. 16T are schematic diagrams illustrating the manufacturing of a package apparatus of the fifth embodiment.
Figure 16B:
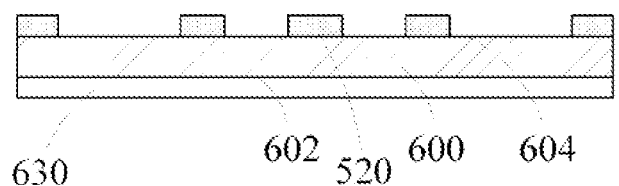
Figure 16C:
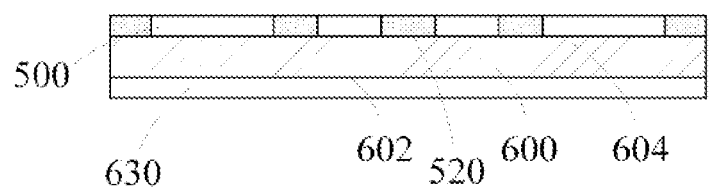
Figure 16D:
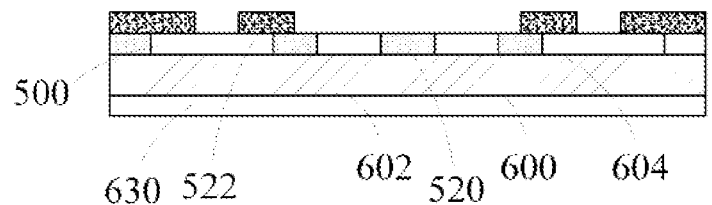
Figure 16E:
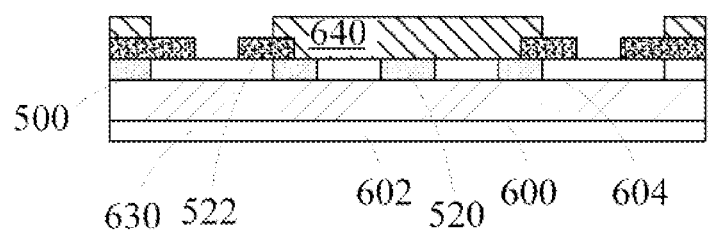
Figure 16F:
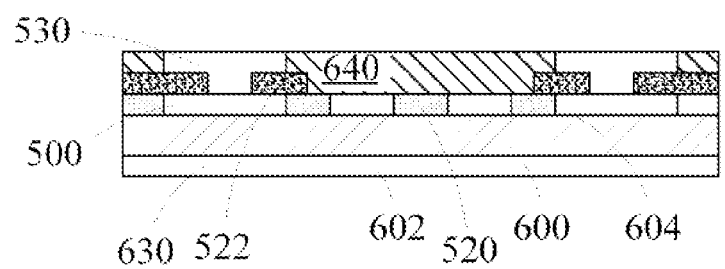
Figure 16G:
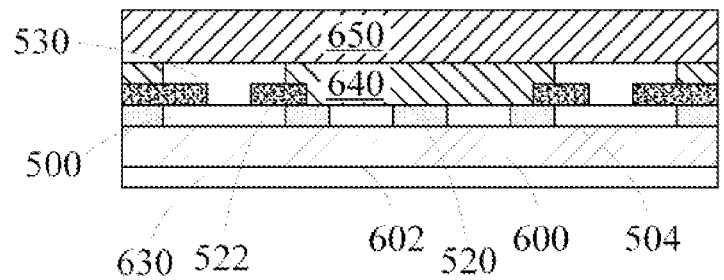
Figure 16H:
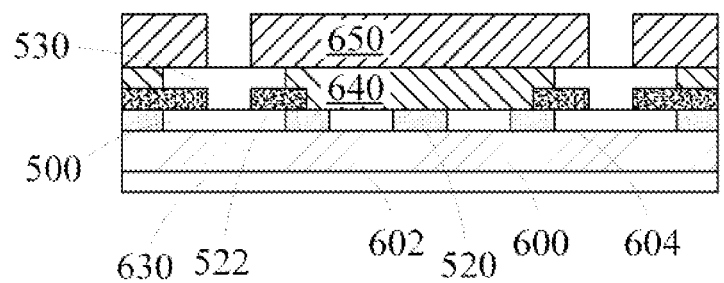
Figure 16I:
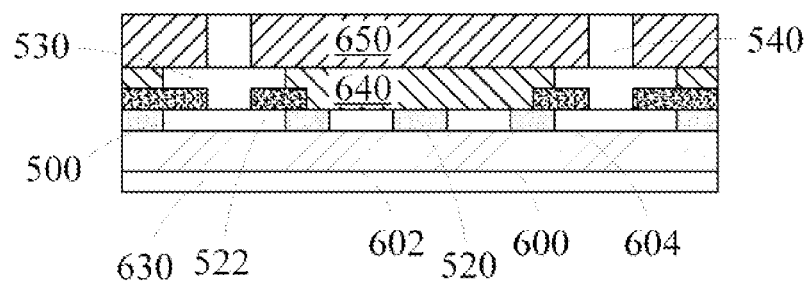
Figure 16J:
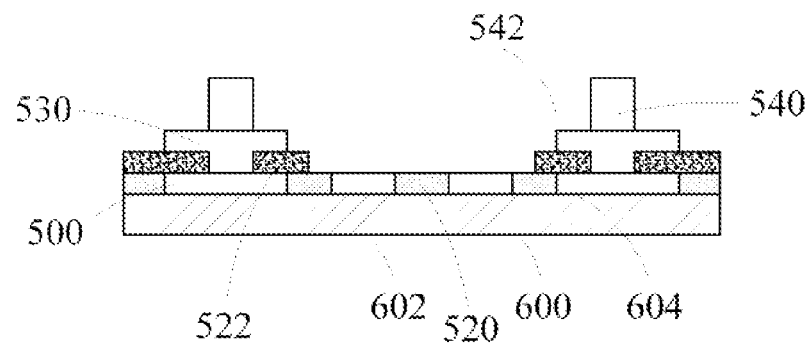
Figure 16K:
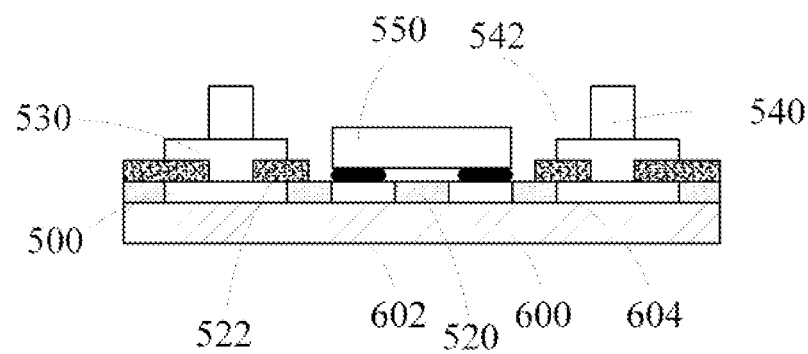
Figure 16L:
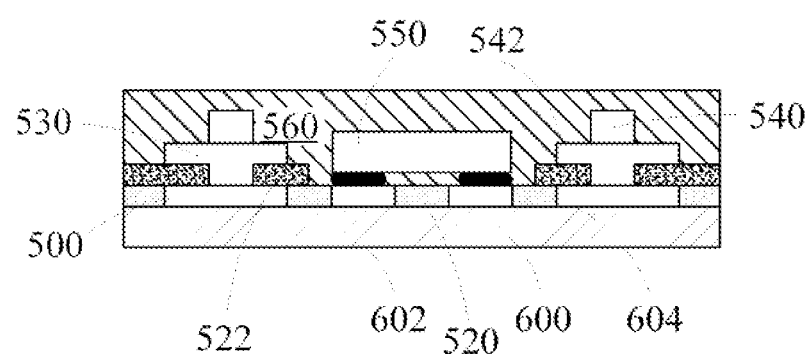
Figure 16M:
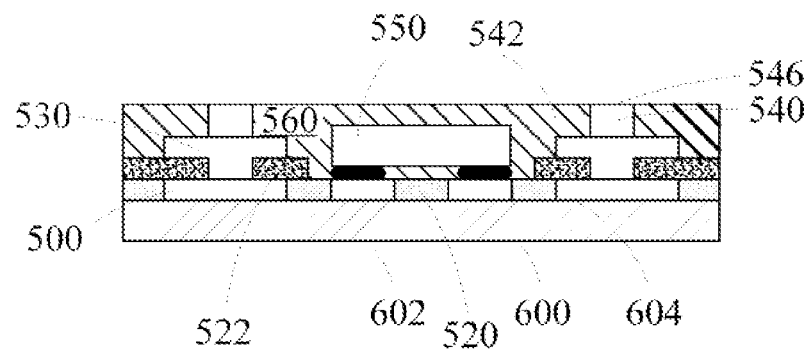
Figure 16N:
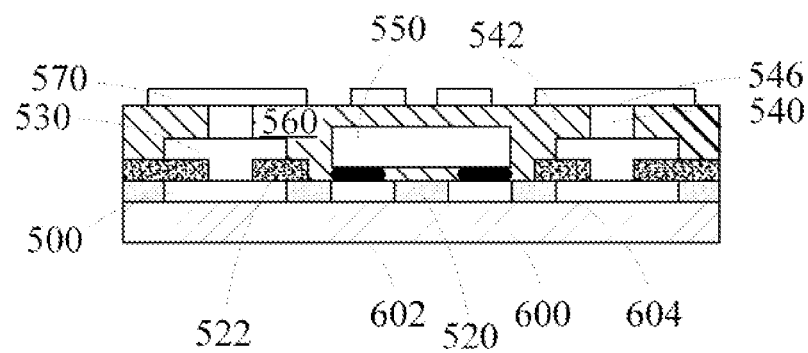
Figure 16O:
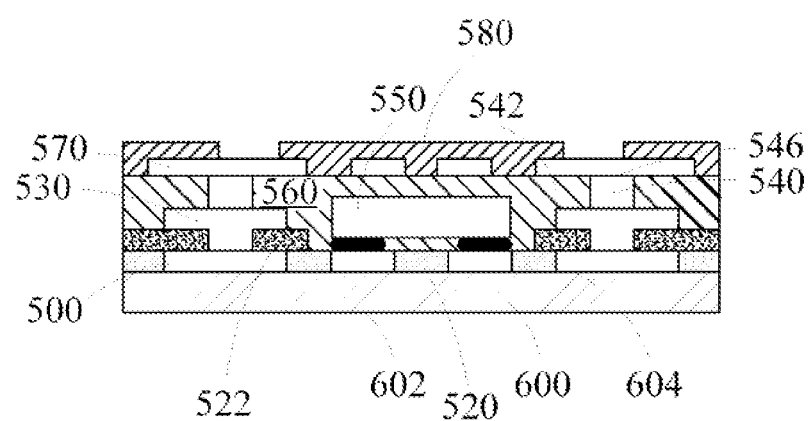
Figure 16P:
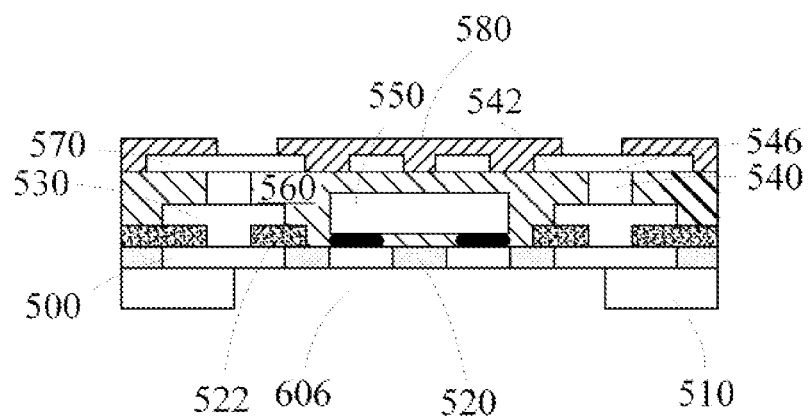
Figure 16Q:
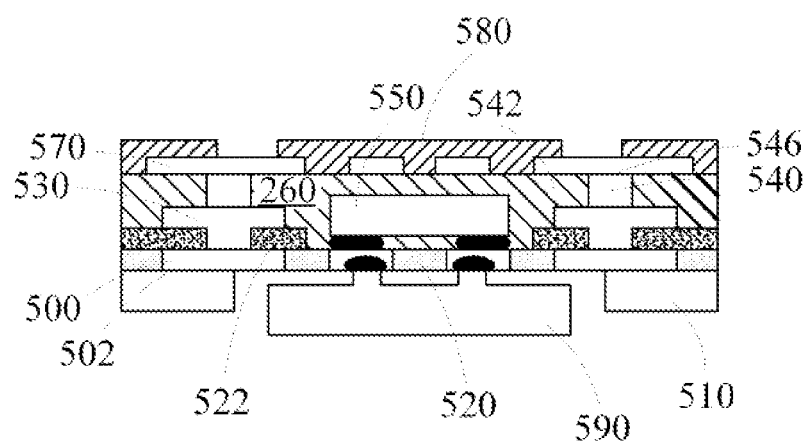
Figure 16R:
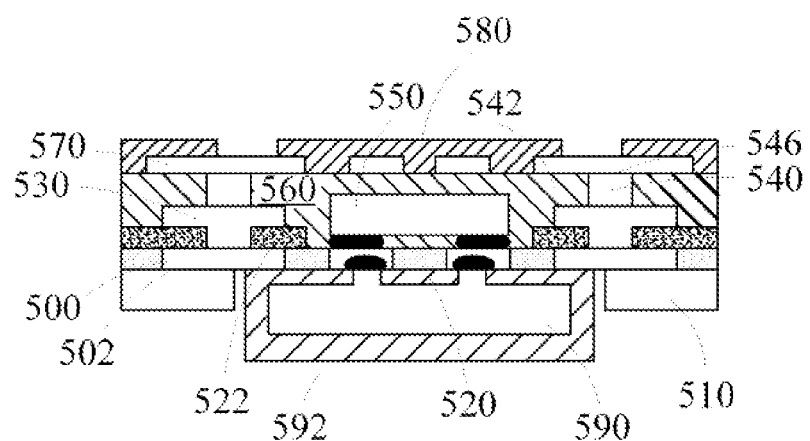
Figure 16S:
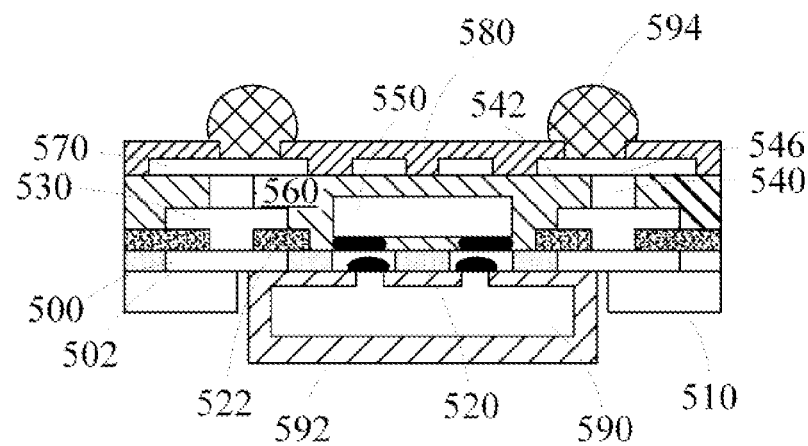
Figure 16T:
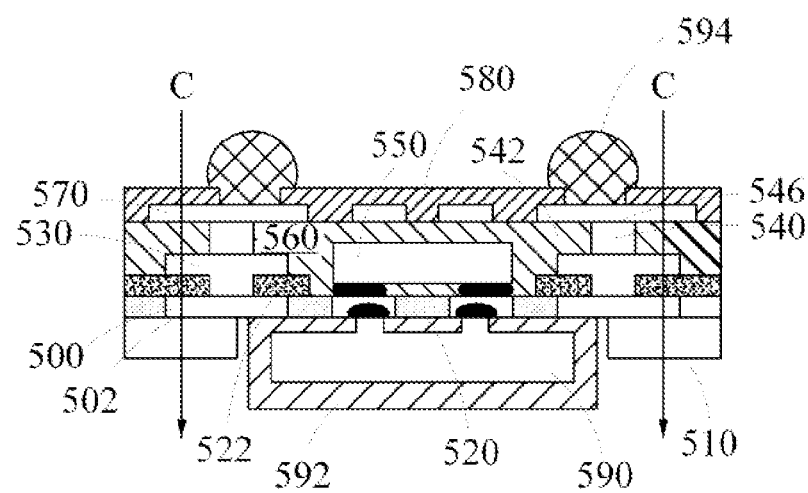

FIG. 15 is a flow chart depicting steps performing in a method for manufacturing a package apparatus of the fifth embodiment, and FIG. 16A to FIG. 16T are schematic diagrams illustrating the manufacturing of a package apparatus of the fifth embodiment. As shown in FIG. 15, a method 11 for manufacturing the package apparatus 10 of FIG. 14 comprises the following steps:

step S1102: providing a metal carrier 600 composed of a first side 602 and a second side 604 that are arranged opposite to each other, as shown in FIG. 16A;

step S1104: forming a first dielectric material layer 520 and a third photoresist layer 630 respectively on the second side 604 of the metal carrier 600 and the first side 602 of the metal carrier 600, as shown in FIG. 16B, whereas the first dielectric material layer 520 is formed by first a coating process, and the third photoresist layer 630 is formed by a dry-film lamination process in this embodiment, but is not limited thereby;

step S1106: forming a first wiring layer 500 on the second side 604 of the metal carrier 600 while allowing the first dielectric material layer 520 to be disposed within a specific portion of the first wiring layer 500 in a manner that the first dielectric material layer 520 is not lower than the first wiring layer 500, as shown in FIG. 16C, whereas the first wiring layer 500 is formed using an electrolytic plating process in this embodiment, but is not limited thereby, and moreover, the first wiring layer 500 can be a wiring layer with patterns which includes at least one wire and a chip seat, and the first wiring layer 500 can be made of a metal, such as copper;

step S1108: forming a second dielectric material layer 522 on the first wiring layer 500 and the first dielectric material layer 520, as shown in FIG. 16D, whereas the second dielectric material layer 522 is formed using a coating process in this embodiment, but is not limited thereby;

step S1110: enabling a fourth photoresist layer 640 to be formed on the first wiring layer 500, the first dielectric material layer 520 and the second dielectric material layer 522, as shown in FIG. 16E, whereas the fourth photoresist layer 640 is formed first by a dry-film lamination process and then a photolithography process in this embodiment, but is not limited thereby;

step S1112: forming a second wiring layer 530 on the first wiring layer 500 and the first dielectric material layer 520, as shown in FIG. 16F, whereas the second wiring layer 530 is formed first using an electroless plating process, but is not limited thereby, and moreover, the second wiring layer 530, that can be made of a metal, such as copper, includes at least one wire, disposed at a position corresponding to the wires of the first wiring layer 500;

step S1114: forming a fifth photoresist layer 650 on the fourth photoresist layer 640 and the second wiring layer 530, as shown in FIG. 16G, whereas the fifth photoresist layer 650 can be formed using a dry-film lamination process in this embodiment, but is not limited thereby;

step S1116: removing a portion of the fifth photoresist layer 650 for exposing the second wiring layer 300, as shown in FIG. 16H, whereas the removal of a portion of the fifth photoresist layer 650 is performed using a photolithography process, but is not limited thereby;

step S1118: forming a conductive pillar layer 540 on the second wiring layer 530, as shown in FIG. 16I, whereas the conductive pillar layer 540 is formed using an electrolytic plating process in this embodiment, but is not limited thereby, and moreover, the conductive pillar layer 540 includes at least one conductive pillar that can be made of a metal, such as copper and is formed at a position corresponding to the wires of the second wiring layer 530;

step S1120: removing the fourth photoresist layer 640 and the fifth photoresist layer 650 so as to respectively exposing the first dielectric material layer 520 on the second side 604 of the metal carrier 600, and exposing the first wiring layer 500 on the second side 604 of the metal carrier 600, and then forming a conductive pillar layer 540 on the first wiring layer 500 while allowing the conductive pillar layer 540 to form a concave structure 542 with the first wiring layer 500, as shown in FIG. 16J, whereas the first dielectric material layer 520 is disposed within a specific portion of the first wiring layer 500 in a manner that the first dielectric material layer 520 is positioned not lower than the first wiring layer 500;

step S1122: providing a passive component 550 to be disposed on and electrically connected to the first wiring layer 500 in the concave structure 542, as shown in FIG. 16K;

step S1124: forming a first molding compound layer 560 while allowing the same to cover the first dielectric material layer 520, the first wiring layer 500, the second dielectric material layer 522, the second wiring layer 530, the conductive pillar layer 540, the passive component 550, and the second side 604 of the metal carrier 600, as shown in FIG. 16L, whereas, in this embodiment, the first molding compound layer 560 is formed by a transfer molding process, and can be made from a material selected from the group consisting of novolac-based resin, epoxy-based resin, silicon-based resign and other molding compounds, whichever can be heated to a liquid state so as to be poured on the second side 604 of the metal carrier 600 for allowing the same to cover the first dielectric material layer 520, the first wiring layer 500, the second dielectric material layer 522, the second wiring layer 530, the conductive pillar layer 540, and the passive component 550 under a high-temperature and high-pressure condition, and thereafter, to be cured into the first molding compound layer 560, and moreover the first molding compound layer 560 can be composed of a kind of filler, such as a powder silicon dioxide; and in another embodiment, the first molding compound layer 560 can be formed by the use of an injection molding process or a compression molding process, and the formation of the first molding compound layer 560 can include the steps of: providing a molding compound to be heated to a liquid state, whereas the molding compound is composed of a resin and powder silicon dioxide; pouring the liquefied molding compound on the second side 604 of the metal carrier 600 while allowing the molding compound to cover the first dielectric material layer 520, the first wiring layer 500, the second dielectric material layer 522, the second wiring layer 530, the conductive pillar layer 540 and the passive component 550 under a high-temperature and high-pressure condition; and curing the molding compound for enabling the same to form the first molding compound layer 560, but is not limited thereby;

step S1126: enabling one end 546 of the conductive pillar layer 540 to be exposed, as shown in FIG. 16M, whereas in this embodiment, the exposing of the end 546 of the conductive pillar layer 540 is enabled by grinding and removing a portion of the first molding compound layer 560, however, under ideal condition, the end 546 of the conductive pillar layer 540 is positioned coplanar with the first molding compound layer 560, by that the exposing of the end 546 of the conductive pillar layer 540 can be achieved simultaneously with the formation of the first molding compound layer 560, and thus the process for grinding and removing of the first molding compound layer 560 can be avoided;

step S1128: forming a third wiring layer 570 on the first molding compound layer 560 and the exposed end 546 of the conductive pillar layer 540, as shown in FIG. 16N, whereas the third wiring layer 570 can be formed by the use of an electroless plating process, a sputtering coating process, or a thermal coating process, but is not limited thereby, and moreover, the third wiring layer 570 can be a wiring layer with patterns which includes at least one wire that is to be formed at a position corresponding to the end 546 of the conductive pillar layer 540, moreover, the third wiring layer 570 can be made of a metal, such as copper;

step S1130: forming a protection layer 580 on the first molding compound layer 560 and the third wiring layer 570 while allowing a portion of the third wiring layer 570 to expose, as shown in FIG. 16O, whereas the protection layer 580 is used for insulating wires in the third wiring layer 570;

step S1132: removing a portion of the metal carrier 600 so as to form a window 606 while allowing the first wiring layer 500 and the first dielectric material layer 520 to be exposed therefrom, as shown in FIG. 16P, whereas the removal of the metal carrier 600 can be performed using a photolithography and etching process, and moreover, the wires and the chip seat of the first wiring layer 500 is also exposed from the window 606, and thus the portion of the metal carrier 600 that is not removed is substantially being formed into a metal layer 510;

step S1134: providing an external component 590 to be disposed on and electrically connected to the first surface 502 of the first wiring layer 500, as shown in FIG. 16Q, whereas, in an embodiment, the external component 590 can be an active component, a passive component, a semiconductor chip or a flexible circuit board, but is not limited thereby;

step S1136: forming a second molding compound layer 592 while allowing the same to cover the external component 590 and the first surface 502 of the first wiring layer 500, as shown in FIG. 16R, whereas, in this embodiment, the second molding compound layer 592 is formed by a transfer molding process, and can be made from a material selected from the group consisting of novolac-based resin, epoxy-based resin, silicon-based resign and other molding compounds, whichever can be heated to a liquid state so as to be poured on the second side 604 of the metal carrier 600 for allowing the same to cover the external component 590 and the first surface 502 of the first wiring layer 500, under a high-temperature and high-pressure condition, and thereafter, to be cured into the second molding compound layer 592, and moreover the second molding compound layer 592 can be composed of a kind of filler, such as a powder silicon dioxide; and in another embodiment, the second molding compound layer 592 can be formed by the use of an injection molding process or a compression molding process;

step S1138: forming a plurality of metal balls 594 on the third wiring layer 570, as shown in FIG. 16S, whereas each of the metal balls 594 can be made of a metal, such as copper;

step S1140: enabling a cutting process C to be performed upon at least one layer selected from the group consisting of: the first wiring layer 500, the metal layer 510, the first dielectric material layer 520, the second dielectric material layer 522, the second wiring layer 530, the first molding compound layer 560, the third wiring layer 570, and the protection layer 580, as shown in FIG. 16T, by that a package apparatus 10 of FIG. 14 can be achieved.

Comparing to the package apparatus 8 of the fourth embodiment, the package apparatus 10 of the fifth embodiment is designed for disposing its passive component on the first wiring layer that is being positioned lower than the second wiring layer, by that the height of the conductive pillar layer is lowered and then the manufacture difficulty is reduced. Moreover, since the thickness of the corresponding first molding compound layer is also reduced that the work for grinding and removal the first molding compound layer to a thinner layer is minimized, the complexity of the manufacture process is reduced and thus the manufacture cost is lowered.

To sum up, in the fourth embodiment, the present invention provides a package apparatus, using which a molding compound layer can be used as the major material in the manufacturing of a coreless substrate, and therefore not only a less expensive molding compound substrate can be used for replacing the costly conventional fiberglass substrate, but also the conventional expensive and time consuming laser blind/buried hole formation process on four-layered structure can be replaced by a faster and simpler electroplating conductive pillar process on less costly three-layered structure.

In the fifth embodiment of the present invention, the package apparatus 10 is designed for disposing its passive component on the first wiring layer that is being positioned lower than the second wiring layer, by that the height of the conductive pillar layer is lowered and then the manufacture difficulty is reduced. Moreover, since the thickness of the corresponding first molding compound layer is also reduced that the work for grinding and removal the first molding compound layer to a thinner layer is minimized, the complexity of the manufacture process is reduced and thus the manufacture cost is lowered.

Figure 17:
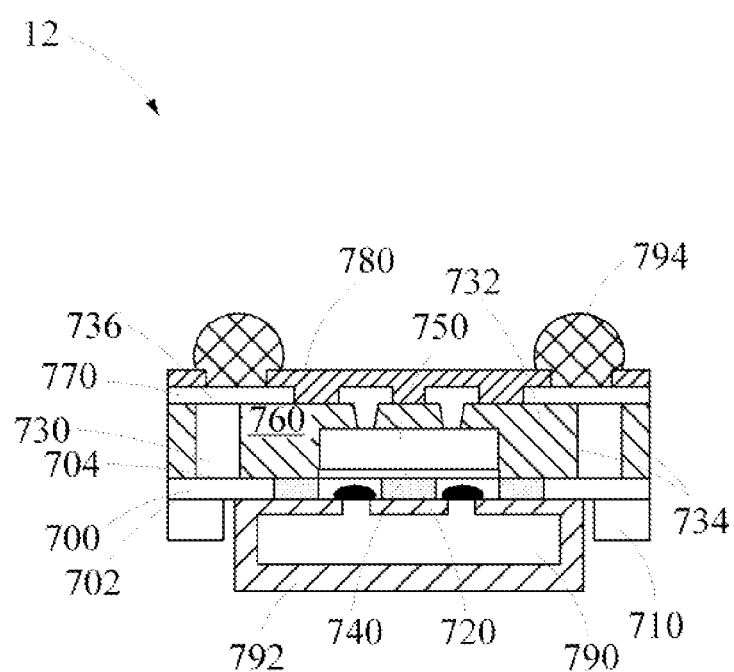
FIG. 17 is a schematic diagram showing a package apparatus according to a sixth embodiment of the present invention.

Please refer to FIG. 17, which is a schematic diagram showing a package apparatus according to a sixth embodiment of the present invention. In the embodiment shown in FIG. 17, the package apparatus 12 comprises: a first wiring layer 700, a metal layer 710, a dielectric material layer 720, a conductive pillar layer 730, an adhesive layer 740, a passive component 750, a first molding compound layer 760, a second wiring layer 770, and a protection layer 780. The first wiring layer 700 has a first surface 702 and a second surface 704 that are arranged opposite to each other. The metal layer 710 is disposed on the first surface 702 of the first wiring layer 700. The dielectric material layer 720 is disposed on a specific portion of the first wiring layer 700 in a manner that the dielectric material layer 720 is not to be exposed on the first surface 702 of the first wiring layer 700 while being positioned not lower than the second surface 704 of the first wiring layer 700. The conductive pillar layer 730 is disposed on the second surface 704 of the first wiring layer 700, forming a concave structure 732 with the first wiring layer 700. The adhesive layer 740 is disposed on the first wiring layer 700 and the dielectric material layer 720 in the concave structure 732. The passive component 750 is disposed on the adhesive layer 740 in the concave structure 732. The first molding compound layer 760 is disposed on a portion 734 of the conductive pillar layer 730 while allowing the same to cover the passive component 750 in a manner that the first molding compound layer 760 is not exposed on one end 736 of the conductive pillar layer 730. It is noted that although the first molding compound layer 760 is formed covering on every portion of the conductive pillar layer 730, but it is not limited thereby. Moreover, the first molding compound layer 760 can be composed of a material selected from the group consisting of novolac-based resin, epoxy-based resin, silicon-based resign and other molding compounds, but it is also not limited thereby. The second wiring layer 770 is disposed on the first molding compound layer 760, the end 736 of the conductive pillar layer 730 and the passive component 750. The protection layer 780 is disposed on the first molding compound layer 760 and the second wiring layer 770.

In addition, the package apparatus 12 can further comprises: an external component 790, a second molding compound layer 792 and a plurality of metal balls 794, in which the external component 790 is disposed on and electrically connected to the first surface 702 of the first wiring layer 700; the second molding compound layer 792 is disposed on the external component 790 and the first surface 702 of the first wiring layer 700; and the plural metal balls 794 are disposed on the second wiring layer 770. It is noted that the external component 790 is a unit selected from the group consisting of: an active component, a passive component, a semiconductor chip and a flexible circuit board, but is not limited thereby.

Figure 18:
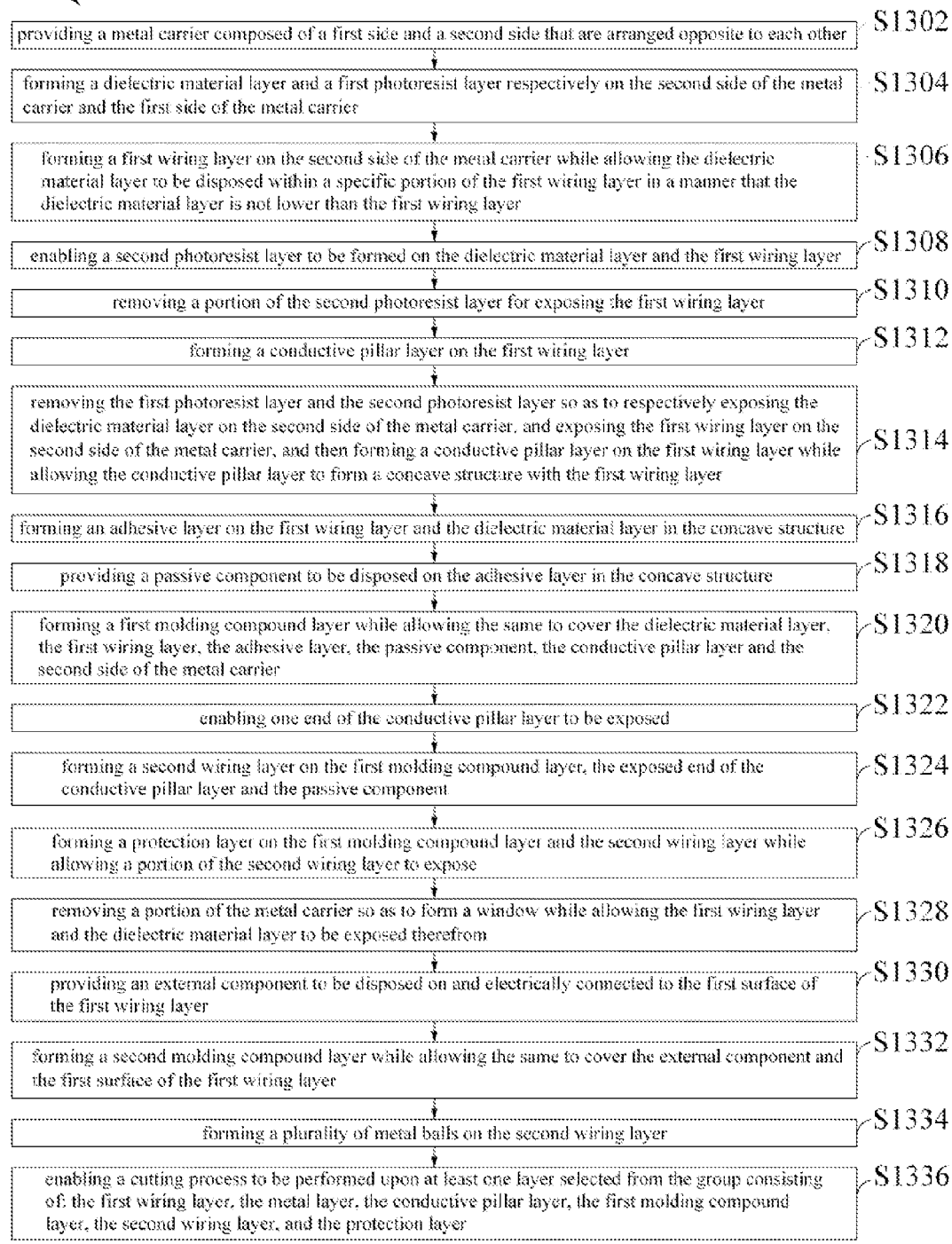
FIG. 18 is a flow chart depicting steps performing in a method for manufacturing a package apparatus according to a sixth embodiment of the present invention.
Figure 19A:
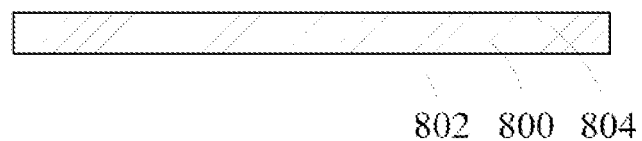
FIG. 19A to FIG. 19R are schematic diagrams illustrating the manufacturing of a package apparatus according to a sixth embodiment of the present invention.
Figure 19B:
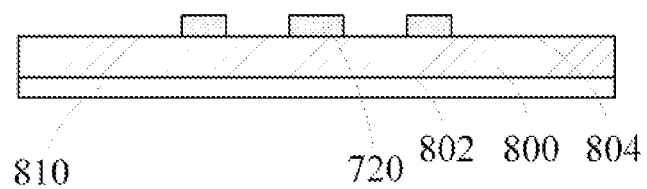
Figure 19C:
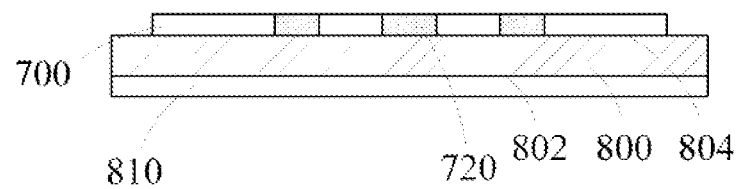
Figure 19D:
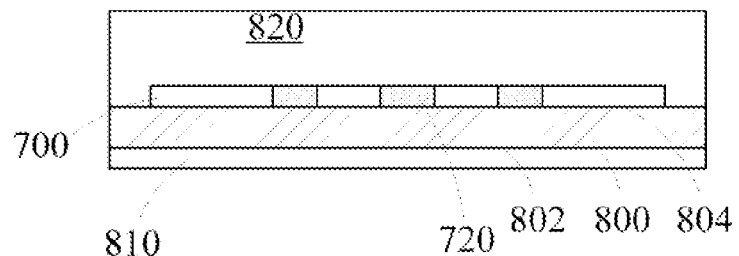
Figure 19E:
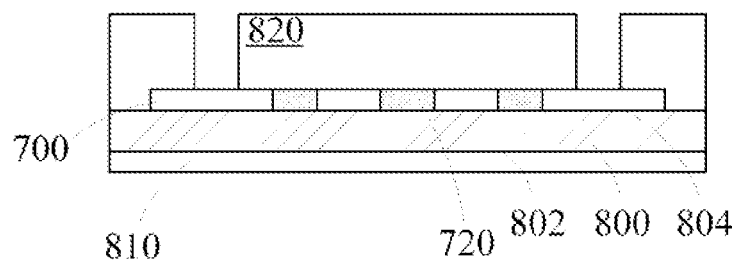
Figure 19F:
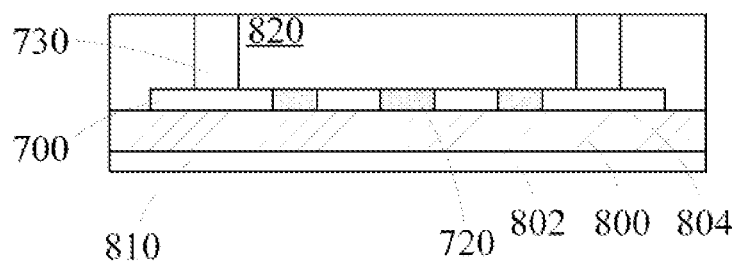
Figure 19G:
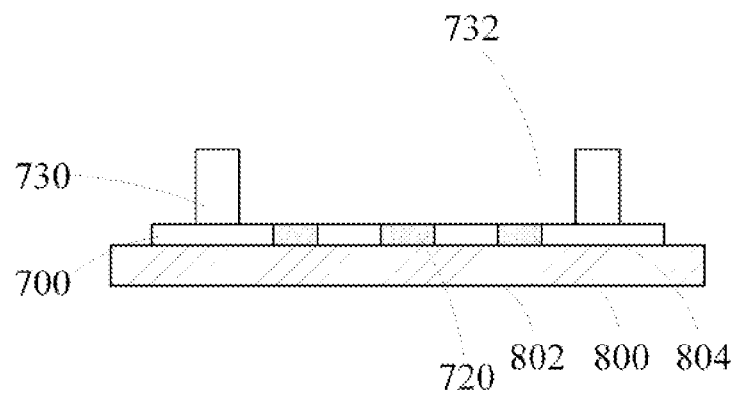
Figure 19H:
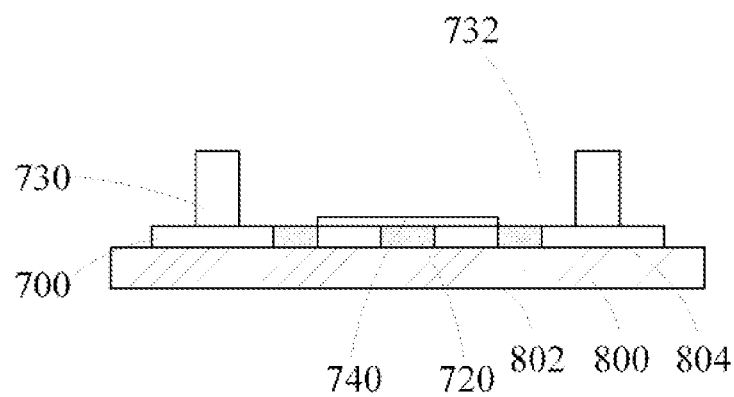
Figure 19I:
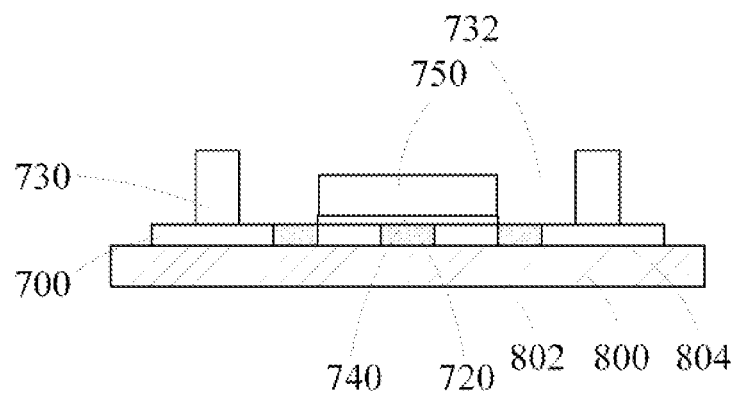
Figure 19J:
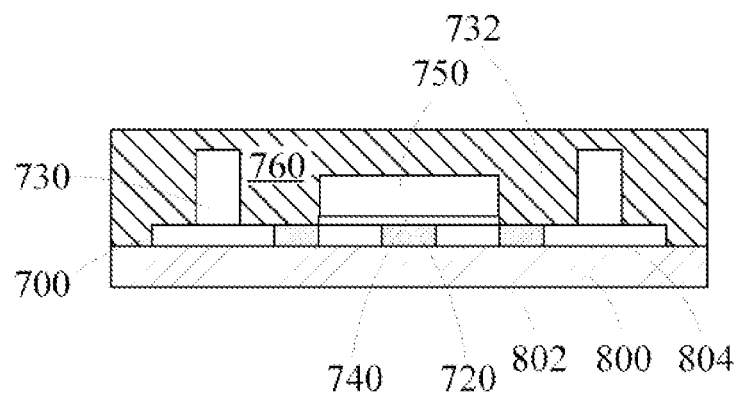
Figure 19K:
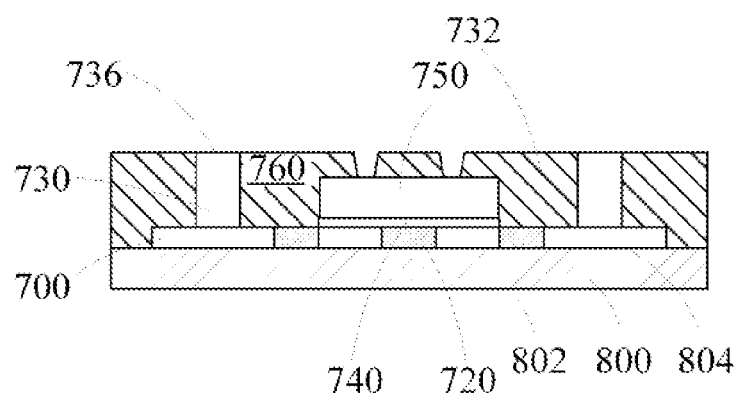
Figure 19L:
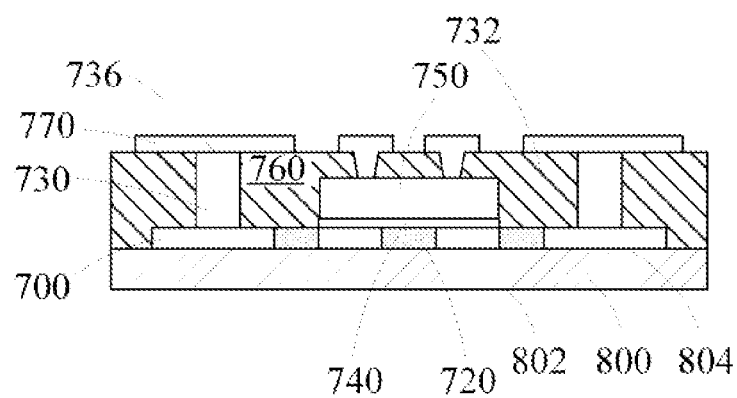
Figure 19M:
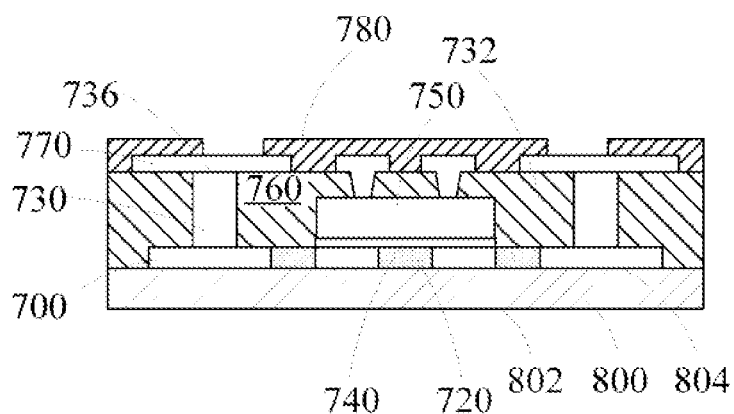
Figure 19N:
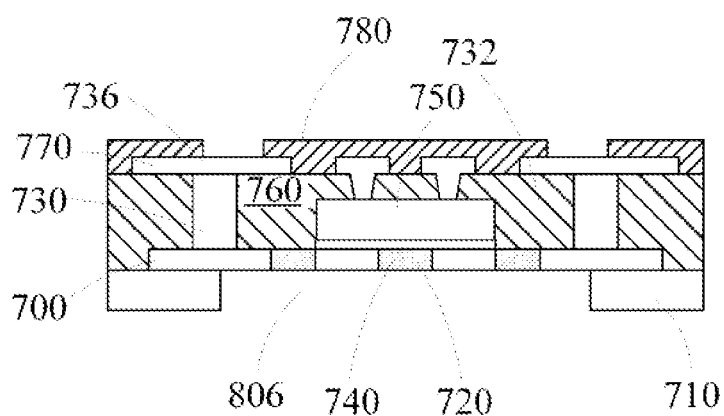
Figure 19O:
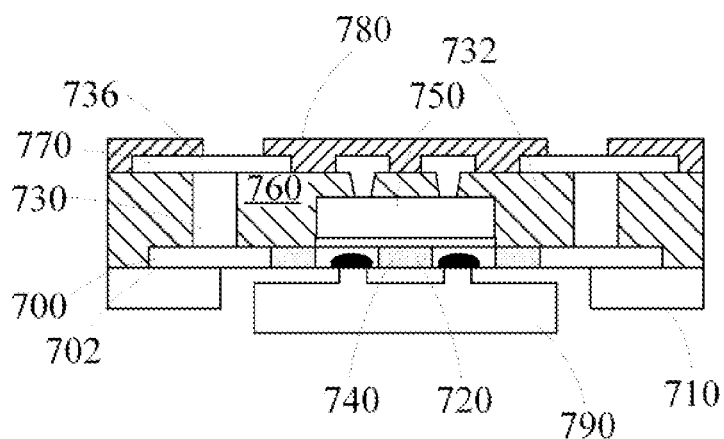
Figure 19P:
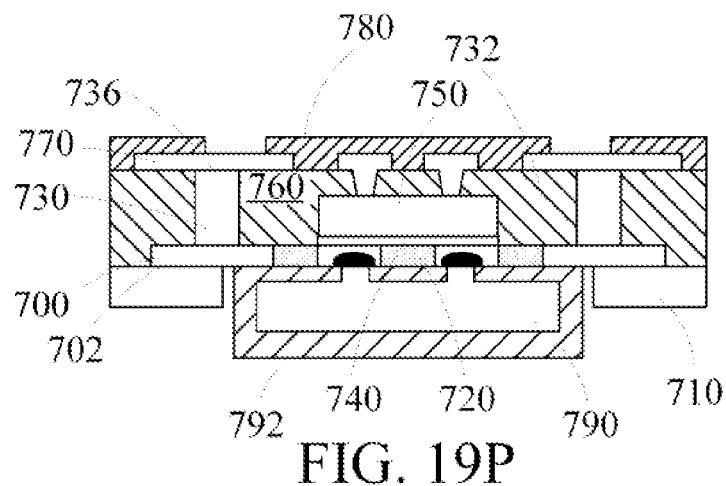
Figure 19Q:
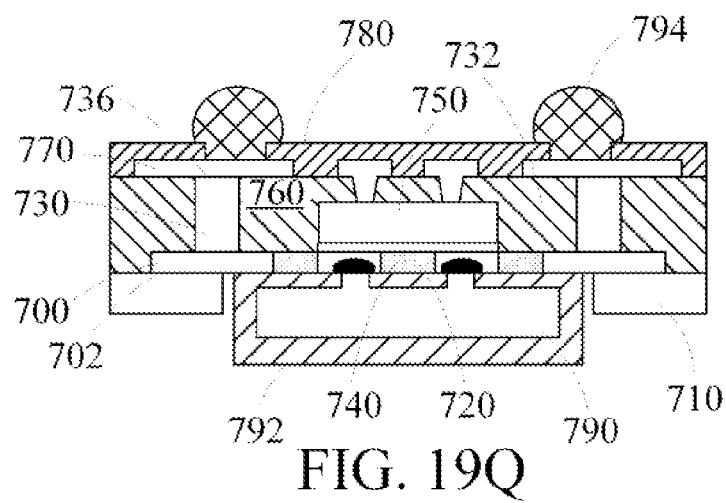
Figure 19R:
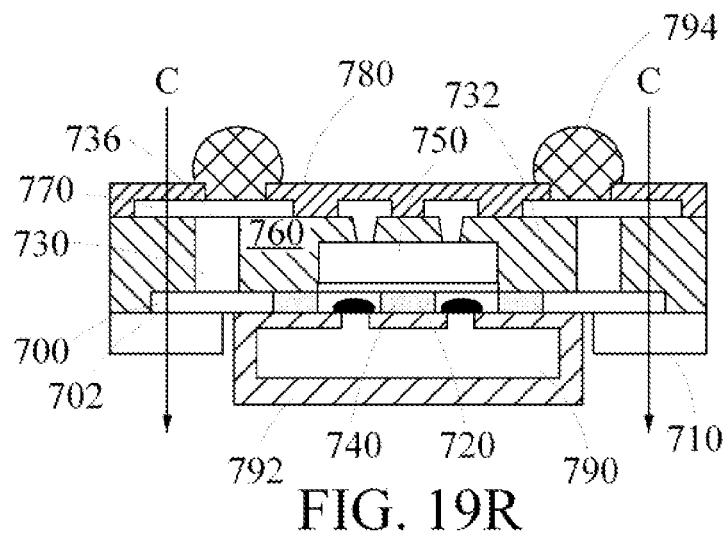

FIG. 18 is a flow chart depicting steps performing in a method for manufacturing a package apparatus according to a sixth embodiment of the present invention, and FIG. 19A to FIG. 19R are schematic diagrams illustrating the manufacturing of a package apparatus of the first embodiment. As shown in FIG. 18, a method 13 for manufacturing the package apparatus 12 of FIG. 17 comprises the following steps:

step S1302: providing a metal carrier 800 composed of a first side 802 and a second side 804 that are arranged opposite to each other, as shown in FIG. 19A;

step S1304: forming a dielectric material layer 720 and a first photoresist layer 810 respectively on the second side 804 of the metal carrier 800 and the first side 802 of the metal carrier 304, as shown in FIG. 19B, whereas the first dielectric material layer 720 is formed by first a coating process and then a photolithography and etching process, and the first photoresist layer 810 is formed by a dry-film lamination process in this embodiment, but is not limited thereby;

step S1306: forming a first wiring layer 700 on the second side 804 of the metal carrier 800 while allowing the dielectric material layer 720 to be disposed within a specific portion of the first wiring layer 700 in a manner that the dielectric material layer 720 is not lower than the first wiring layer 700, as shown in FIG. 19C, whereas the first wiring layer 700 is formed using an electrolytic plating process in this embodiment, but is not limited thereby, and moreover, the first wiring layer 700 can be a wiring layer with patterns which includes at least one wire and a chip seat, and the first wiring layer 700 can be made of a metal, such as copper;

step S1308: enabling a second photoresist layer 820 to be formed on the dielectric material layer 720 and the first wiring layer 700, as shown in FIG. 19D, whereas the second photoresist layer 820 is formed by a dry-film lamination process in this embodiment, but is not limited thereby;

step S1310 removing a portion of the second photoresist layer 820 for exposing the first wiring layer 700, as shown in FIG. 19E, whereas the removal of the second photoresist layer 820 is achieved using a photography process in this embodiment, but it is not limited thereby;

step S1312: forming a conductive pillar layer 730 on the first wiring layer 700, as shown in FIG. 19F, whereas the conductive pillar layer 730 is formed using an electrolytic plating process in this embodiment, but is not limited thereby, and moreover, the conductive pillar layer 730 includes at least one conductive pillar that can be made of a metal, such as copper and is formed at a position corresponding to the wires and the chip seat of the first wiring layer 700;

step S1314: removing the first photoresist layer 810 and the second photoresist layer 820 so as to respectively exposing the dielectric material layer 720 on the second side 804 of the metal carrier 800, and exposing the first wiring layer 700 on the second side 804 of the metal carrier 800, and then forming a conductive pillar layer 730 on the first wiring layer while allowing the conductive pillar layer 730 to form a concave structure 732 with the first wiring layer 700, as shown in FIG. 19G, whereas the dielectric material layer 720 is disposed within a specific portion of the first wiring layer 700 in a manner that the dielectric material layer 720 is positioned not lower than the first wiring layer 700;

step S1316: forming an adhesive layer 740 on the first wiring layer 700 and the dielectric material layer 720 in the concave structure 732, as shown in FIG. 19H, whereas the adhesive layer 740 is used for insulation;

step S1318: providing a passive component 750 to be disposed on the adhesive layer 740 in the concave structure 732, as shown in FIG. 19I;

step S1320: forming a first molding compound layer 760 while allowing the same to cover the dielectric material layer 720, the first wiring layer 700, the adhesive layer 740, the passive component 750, the conductive pillar layer 730 and the second side 804 of the metal carrier 800, as shown in FIG. 19J, whereas, in this embodiment, the first molding compound layer 760 is formed by a transfer molding process, and can be made from a material selected from the group consisting of novolac-based resin, epoxy-based resin, silicon-based resign and other molding compounds, whichever can be heated to a liquid state so as to be poured on the second side 804 of the metal carrier 800 for allowing the same to cover the dielectric material layer 720, the first wiring layer 700, the adhesive layer 740, the passive component 750 and the conductive pillar layer 730 under a high-temperature and high-pressure condition, and thereafter, to be cured into the first molding compound layer 760, and moreover the first molding compound layer 760 can be composed of a kind of filler, such as a powder silicon dioxide; and in another embodiment, the first molding compound layer 760 can be formed by the use of an injection molding process or a compression molding process, and the formation of the first molding compound layer 760 can include the steps of: providing a molding compound to be heated to a liquid state, whereas the molding compound is composed of a resin and powder silicon dioxide; pouring the liquefied molding compound on the second side 804 of the metal carrier 800 while allowing the molding compound to cover the dielectric material layer 720, the first wiring layer 700, the adhesive layer 740, the passive component 750 and the conductive pillar layer 730 under a high-temperature and high-pressure condition; and curing the molding compound for enabling the same to form the first molding compound layer 760, but is not limited thereby;

step S1322: enabling one end 736 of the conductive pillar layer 730 to be exposed, as shown in FIG. 19K, whereas in this embodiment, the exposing of the end 736 of the conductive pillar layer 730 is enabled by grinding and removing a portion of the first molding compound layer 760, however, under ideal condition, the end 736 of the conductive pillar layer 730 is positioned coplanar with the first molding compound layer 760, by that the exposing of the end 736 of the conductive pillar layer 730 can be achieved simultaneously with the formation of the first molding compound layer 760, and thus the process for grinding and removing of the first molding compound layer 760 can be avoided;

step S1324: forming a second wiring layer 770 on the first molding compound layer 760, the exposed end 736 of the conductive pillar layer 730 and the passive component 750, as shown in FIG. 19L, whereas the second wiring layer 770 can be formed by the use of an electroless plating process, a sputtering coating process, or a thermal coating process, but is not limited thereby, and moreover, the second wiring layer 770 can be a wiring layer with patterns which includes at least one wire and is a layer formed at a position corresponding to the end 736 of the conductive pillar layer 730 or the passive component 750, moreover, the second wiring layer 770 can be made of a metal, such as copper;

step S1326: forming a protection layer 780 on the first molding compound layer 760 and the second wiring layer 770 while allowing a portion of the second wiring layer 770 to expose, as shown in FIG. 19M, whereas the protection layer 780 is used for insulating wires in the second wiring layer 770;

step S1328: removing a portion of the metal carrier 800 so as to form a window 806 while allowing the first wiring layer 700 and the dielectric material layer 720 to be exposed therefrom, as shown in FIG. 19N, whereas the removal of the metal carrier 800 can be performed using a photolithography and etching process, and moreover, the wires and the chip seat of the first wiring layer 700 is also exposed from the window 806, and thus the portion of the metal carrier 800 that is not removed is substantially being formed into a metal layer 710;

step S1330: providing an external component 790 to be disposed on and electrically connected to the first surface 702 of the first wiring layer 700, as shown in FIG. 19O, whereas, in a sixth embodiment, the external component 790 can be an active component, a passive component, a semiconductor chip or a flexible circuit board, but is not limited thereby;

step S1332: forming a second molding compound layer 792 while allowing the same to cover the external component 790 and the first surface 702 of the first wiring layer 700, as shown in FIG. 19P, whereas, in this embodiment, the second molding compound layer 792 is formed by a transfer molding process, and can be made from a material selected from the group consisting of novolac-based resin, epoxy-based resin, silicon-based resign and other molding compounds, whichever can be heated to a liquid state so as to be poured on the second side 804 of the metal carrier 800 for allowing the same to cover the external component 790 and the first surface 702 of the first wiring layer 700, under a high-temperature and high-pressure condition, and thereafter, to be cured into the second molding compound layer 792, and moreover the second molding compound layer 792 can be composed of a kind of filler, such as a powder silicon dioxide; and in another embodiment, the second molding compound layer 792 can be formed by the use of an injection molding process or a compression molding process;

step S1334: forming a plurality of metal balls 794 on the second wiring layer 770, as shown in FIG. 19Q, whereas each of the metal balls 794 can be made of a metal, such as copper;

step S1336: enabling a cutting process C to be performed upon at least one layer selected from the group consisting of: the first wiring layer 700, the metal layer 710, the conductive pillar layer 730, the first molding compound layer 760, the second wiring layer 770, and the protection layer 780, as shown in FIG. 19R, by that a package apparatus 12 of FIG. 17 can be achieved.

It is noted that the package apparatus 12 in this sixth embodiment uses the first molding compound layer as a coreless substrate so that the conventional expensive fiberglass substrate is not required. Conventionally, a laser drilling process is required to be performed repetitively for achieving the conventional laser blind/buried hole formation on four-layered metal structure, which can be an expensive, difficult and time-consuming task in addition to the high cost of the four-layered metal structure. Consequently, by the abovementioned apparatus and method of the present invention, the conventional laser blind/buried hole formation process on four-layered structure can be replaced by a faster and simpler electroplating conductive pillar process on less costly two-layered structure which only require the laser drilling process to be performed only once. Thereby, not only the manufacturing time is reduce as the manufacturing process is simplified, but also the manufacturing cost is lowered.

In addition, by the disposition of the adhesive layer in the present invention, the passive component can be insulated from the first wiring layer so that the first wiring layer can be used as a circuit to be engaged directly and electrically to the chips of the external component, leaving the passive component to be electrically conducted via the second wiring layer, and thus saving considerable chips use of space.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A method for manufacturing a package apparatus, comprising the steps of:

providing a metal carrier composed of a first side and a second side that are arranged opposite to each other;

forming a first wiring layer on the second side of the metal carrier;

forming a conductive pillar layer on the first wiring layer while allowing the conductive pillar layer to form a concave structure with the first wiring layer;

providing a passive component to be disposed on and electrically connected to the first wiring layer in the concave structure;

forming a first molding compound layer while allowing the same to cover the first wiring layer, the passive component, the conductive pillar layer and the second side of the metal carrier;

enabling one end of the conductive pillar layer to be exposed;

forming a second wiring layer on the first molding compound layer and the exposed one end of the conductive pillar layer;

forming a protection layer on the first molding compound layer and the second wiring layer; and removing a portion of the metal carrier so as to form a window while allowing the first wiring layer and the first molding compound layer to be exposed therefrom.

2. The manufacturing method of claim 1, further comprising the steps of:

providing an external component to be disposed on and electrically connected to the first surface of the first wiring layer;

enabling a second molding compound layer to be formed covering the external component and the first surface of the first wiring layer; and forming a plurality of metal balls on the second wiring layer.

3. The manufacturing method of claim 1, further comprising the following steps that are to be proceeded before the forming of the conductive pillar layer on the first wiring layer:

forming a first photoresist layer and a second photoresist layer respectively on the second side of the metal carrier and the first side of the metal carrier;

enabling the first wiring layer to be formed on the second side of the metal carrier;

forming a third photoresist layer on the first photoresist layer and the first wiring layer;

removing a portion of the third photoresist layer for exposing the first wiring layer;

forming a conductive pillar layer on the first wiring layer; and removing the first photoresist layer, the second photoresist layer and the third photoresist layer.

4. The manufacturing method of claim 1, wherein the forming of the first molding compound layer further comprises the steps of:

providing a molding compound to be heated to a liquid state, whereas the molding compound is composed of a resin and powder silicon dioxide;

pouring the liquefied molding compound on the second side of the metal carrier while allowing the molding compound to cover the first wiring layer, the passive component and the conductive pillar layer under a high-temperature and high-pressure condition; and curing the molding compound for enabling the same to form the first molding compound layer.

5. The manufacturing method of claim 2, wherein the external component is a unit selected from the group consisting of: an active component, a passive component, a semiconductor chip and a flexible circuit board.

6. The manufacturing method of claim 1, wherein the first molding compound layer is composed of a material selected from the group consisting of novolac-based resin, epoxy-based resin, silicon-based resign and other molding compounds.

7. A method for manufacturing a package apparatus, comprising the steps of:
providing a metal carrier composed of a first side and a second side that are arranged opposite to each other;
forming a first dielectric material layer on the second side of the metal carrier;
forming a first wiring layer on the second side of the metal carrier while allowing the first dielectric material layer to be disposed on a specific portion of the first wiring layer in a manner that the first dielectric material layer is not lower than the first wiring layer;
forming a conductive pillar layer on the first wiring layer while allowing the conductive pillar layer to form a concave structure with the first wiring layer;
providing a passive component to be disposed on and electrically connected to the first wiring layer in the concave structure;
forming a first molding compound layer while allowing the same to cover the first dielectric material layer, the first wiring layer, the passive component, the conductive pillar layer and the second side of the metal carrier;
enabling one end of the conductive pillar layer to be exposed;
forming a second wiring layer on the first molding compound layer and the exposed one end of the conductive pillar layer;
forming a protection layer on the first molding compound layer and the second wiring layer; and
removing a portion of the metal carrier so as to form a window while allowing the first wiring layer and the first dielectric material layer to be exposed therefrom.

8. The manufacturing method of claim 7, further comprising the steps of:
providing an external component to be disposed on and electrically connected to the first surface of the first wiring layer; and
enabling a second molding compound layer to be formed covering the external component and the first surface of the first wiring layer; and
forming a plurality of metal balls on the second wiring layer.

9. The manufacturing method of claim 7, further comprising the following steps that are to be proceeded before the forming of the conductive pillar layer on the first wiring layer:
forming the first dielectric material layer and a fourth photoresist layer respectively on the second side of the metal carrier and the first side of the metal carrier;
forming the first wiring layer on the second side of the metal carrier in a manner that the first dielectric material layer is disposed within a portion of the first wiring layer;
forming a fifth photoresist layer on the first dielectric material layer and the first wiring layer;
removing a portion of the fifth photoresist layer for exposing the first wiring layer;
forming a conductive pillar layer on the first wiring layer; and
removing the fourth photoresist layer and the fifth photoresist layer.

10. The manufacturing method of claim 7, wherein the forming of the first molding compound layer further comprises the steps of:
providing a molding compound to be heated to a liquid state, whereas the molding compound is composed of a resin and powder silicon dioxide;
pouring the liquefied molding compound on the second side of the metal carrier while allowing the molding compound to cover the first wiring layer, the passive component and the conductive pillar layer under a high-temperature and high-pressure condition; and
curing the molding compound for enabling the same to form the first molding compound layer.

11. The manufacturing method of claim 8, wherein the external component is a unit selected from the group consisting of: an active component, a passive component, a semiconductor chip and a flexible circuit board.

12. The manufacturing method of claim 7, wherein the first molding compound layer is composed of a material selected from the group consisting of novolac-based resin, epoxy-based resin, silicon-based resign and other molding compounds.

13. A method for manufacturing a package apparatus, comprising the steps of:
providing a metal carrier composed of a first side and a second side that are arranged opposite to each other;
forming a first dielectric material layer on the second side of the metal carrier;
forming a first wiring layer on the second side of the metal carrier while allowing the first dielectric material layer to be disposed on a specific portion of the first wiring layer in a manner that the first dielectric material layer is not lower than the first wiring layer;
forming a second dielectric material layer on the first dielectric material layer;
forming a conductor layer on the first wiring layer;
forming a conductive pillar layer on the conductor layer while allowing the conductive pillar layer to form a concave structure with the conductor layer;
providing a passive component to be disposed on and electrically connected to the first wiring layer in the concave structure;
forming a first molding compound layer while allowing the same to cover the first dielectric material layer, the second dielectric material layer, the first wiring layer, the conductor layer, the passive component, the conductive pillar layer and the second side of the metal carrier;
enabling one end of the conductive pillar layer to be exposed;
forming a second wiring layer on the first molding compound layer and the exposed end of the conductive pillar layer;
forming a protection layer on the first molding compound layer and the second wiring layer; and
removing a portion of the metal carrier so as to form a window while allowing the first wiring layer and the first dielectric material layer to be exposed therefrom.

14. The manufacturing method of claim 13, further comprising the steps of:
providing an external component to be disposed on and electrically connected to the first surface of the first wiring layer; and
enabling a second molding compound layer to be formed covering the external component and the first surface of the first wiring layer; and forming a plurality of metal balls on the second wiring layer.

15. The manufacturing method of claim 13, wherein the following steps that are to be proceeded before the forming of the conductive pillar layer on the first wiring layer:
    forming the first dielectric material layer and a sixth photoresist layer respectively on the second side of the metal carrier and the first side of the metal carrier;
    forming the first wiring layer on the second side of the metal carrier in a manner that the first dielectric material layer is disposed within a portion of the first wiring layer while allowing the first dielectric material layer to be disposed not lower than the first wiring layer;
    forming a second dielectric material layer on the first dielectric material layer;
    forming a seventh photoresist layer on the first dielectric material layer and the first wiring layer while enabling the second dielectric material layer to be disposed not lower than the seventh photoresist layer;
    forming a conductor layer on the first wiring layer while allowing the second dielectric material layer to be disposed not lower than the conductor layer;
    forming an eighth photoresist layer on the second dielectric material layer, the seventh photoresist layer and the conductor layer;
    removing a portion of the eighth photoresist layer for exposing the conductor layer;
    forming a conductive pillar layer on the conductor layer; and
    removing the sixth photoresist layer, the seventh photoresist layer and the eighth photoresist layer.

16. The manufacturing method of claim 13, wherein the forming of the first molding compound layer further comprises the steps of:
    providing a molding compound to be heated to a liquid state, whereas the molding compound is composed of a resin and powder silicon dioxide;
    pouring the liquefied molding compound on the second side of the metal carrier while allowing the molding compound to cover the first wiring layer, the passive component and the conductive pillar layer under a high-temperature and high-pressure condition; and
    curing the molding compound for enabling the same to form the first molding compound layer.

17. The manufacturing method of claim 14, wherein the external component is a unit selected from the group consisting of: an active component, a passive component, a semiconductor chip and a flexible circuit board.

18. The manufacturing method of claim 13, wherein the first molding compound layer is composed of a material selected from the group consisting of novolac-based resin, epoxy-based resin, silicon-based resign and other molding compounds.

19. A method for manufacturing a package apparatus, comprising the steps of:
    providing a metal carrier composed of a first side and a second side that are arranged opposite to each other;
    forming a first wiring layer on the second side of the metal carrier;
    forming a first dielectric material layer on the second side of the metal carrier and the first wiring layer;
    forming a second wiring layer on the first wiring layer and the first dielectric material layer;
    forming a conductive pillar layer on the second wiring layer while allowing the conductive pillar layer to form a concave structure with the second wiring layer;
    providing a passive component to be disposed on and electrically connected to second wiring layer in the concave structure;
    forming a first molding compound layer while allowing the same to cover the first dielectric material layer, the second wiring layer, the passive component, the conductive pillar layer and the second side of the metal carrier;
    enabling one end of the conductive pillar layer to be exposed;
    forming a third wiring layer on the first molding compound layer and the exposed end of the conductive pillar layer;
    forming a protection layer on the first molding compound layer and the third wiring layer; and
    removing a portion of the metal carrier so as to form a window while allowing the first wiring layer and the first dielectric material layer to be exposed therefrom.

20. The manufacturing method of claim 19, further comprising the steps of:
    providing an external component to be disposed on and electrically connected to the first surface of the first wiring layer;
    enabling a second molding compound layer to be formed covering the external component and the first surface of the first wiring layer; and
    forming a plurality of metal balls on the third wiring layer.

21. The manufacturing method of claim 19, wherein the forming of the first molding compound layer further comprises the steps of:
    providing a molding compound to be heated to a liquid state, whereas the molding compound is composed of a resin and powder silicon dioxide;
    pouring the liquefied molding compound on the second side of the metal carrier while allowing the molding compound to cover the first dielectric material layer, the second wiring layer, the passive component and the conductive pillar layer under a high-temperature and high-pressure condition; and
    curing the molding compound for enabling the same to form the first molding compound layer.

22. The manufacturing method of claim 20, wherein the external component is a unit selected from the group consisting of: an active component, a passive component, a semiconductor chip and a flexible circuit board.

23. The manufacturing method of claim 19, wherein the first molding compound layer is composed of a material selected from the group consisting of novolac-based resin, epoxy-based resin, silicon-based resign and other molding compounds.

24. A method for manufacturing a package apparatus, comprising the steps of:
    providing a metal carrier composed of a first side and a second side that are arranged opposite to each other;
    forming a first dielectric material layer on the second side of the metal carrier;
    forming a first wiring layer on the second side of the metal carrier while allowing the first dielectric material layer to be disposed on a specific portion of the first wiring layer in a manner that the first dielectric material layer is positioned not lower than the first wiring layer;
    forming a second dielectric material layer on the first wiring layer and the first dielectric material layer;
    forming a second wiring layer on the first wiring layer and the second dielectric material layer;

forming a conductive pillar layer on the second wiring layer while allowing the conductive pillar layer to form a concave structure with the second wiring layer;

providing a passive component to be disposed on and electrically connected to the first wiring layer in the concave structure;

forming a first molding compound layer while allowing the same to cover the first dielectric material layer, the first wiring layer, the second dielectric material layer, the second wiring layer, the passive component, the conductive pillar layer and the second side of the metal carrier;

enabling one end of the conductive pillar layer to be exposed;

forming a third wiring layer on the first molding compound layer and the exposed end of the conductive pillar layer;

forming a protection layer on the first molding compound layer and the third wiring layer; and removing a portion of the metal carrier so as to form a window while allowing the first wiring layer and the first dielectric material layer to be exposed therefrom.

25. The manufacturing method of claim 24, further comprising the steps of:

providing an external component to be disposed on and electrically connected to the first surface of the first wiring layer;

enabling a second molding compound layer to be formed covering the external component and the first surface of the first wiring layer; and forming a plurality of metal balls on the third wiring layer.

26. The manufacturing method of claim 24, wherein the forming of the first molding compound layer further comprises the steps of:

providing a molding compound to be heated to a liquid state, whereas the molding compound is composed of a resin and powder silicon dioxide;

pouring the liquefied molding compound on the second side of the metal carrier while allowing the molding compound to cover the first dielectric material layer, the second wiring layer, the passive component and the conductive pillar layer under a high-temperature and high-pressure condition; and curing the molding compound for enabling the same to form the first molding compound layer.

27. The manufacturing method of claim 25, wherein the external component is a unit selected from the group consisting of: an active component, a passive component, a semiconductor chip and a flexible circuit board.

28. The manufacturing method of claim 24, wherein the first molding compound layer is composed of a material selected from the group consisting of novolac-based resin, epoxy-based resin, silicon-based resign and other molding compounds.

29. A method for manufacturing a package apparatus, comprising the steps of:

providing a metal carrier composed of a first side and a second side that are arranged opposite to each other;

forming a dielectric material layer on the second side of the metal carrier;

forming a first wiring layer on the second side of the metal carrier while allowing the dielectric material layer to be disposed on a specific portion of the first wiring layer in a manner that the dielectric material layer is not lower than the first wiring layer;

forming a conductive pillar layer on the first wiring layer while allowing the conductive pillar layer to form a concave structure with the first wiring layer;

forming an adhesive layer on the first wiring layer and the dielectric material layer in the concave structure;

providing a passive component to be disposed on the adhesive layer in the concave structure;

forming a first molding compound layer while allowing the same to cover the dielectric material layer, the first wiring layer, the adhesive layer, the passive component, the conductive pillar layer and the second side of the metal carrier;

enabling one end of the conductive pillar layer and the passive component to be exposed;

forming a second wiring layer on the first molding compound layer, the exposed end of the conductive pillar layer and the passive component;

forming a protection layer on the first molding compound layer and the second wiring layer; and removing a portion of the metal carrier so as to form a window while allowing the first wiring layer and the dielectric material layer to be exposed therefrom.

30. The manufacturing method of claim 29, further comprising the steps of:

providing an external component to be disposed on and electrically connected to the first surface of the first wiring layer;

enabling a second molding compound layer to be formed covering the external component and the first surface of the first wiring layer; and forming a plurality of metal balls on the second wiring layer.

31. The manufacturing method of claim 29, further comprising the following steps that are to be proceeded before the forming of the conductive pillar layer on the first wiring layer:

forming the dielectric material layer and a first photoresist layer respectively on the second side of the metal carrier and the first side of the metal carrier;

forming the first wiring layer on the second side of the metal carrier in a manner that the dielectric material layer is disposed within a portion of the first wiring layer;

forming a second photoresist layer on the dielectric material layer and the first wiring layer;

removing a portion of the second photoresist layer for exposing the first wiring layer;

forming a conductive pillar layer on the first wiring layer; and removing the first photoresist layer and the second photoresist layer.

32. The manufacturing method of claim 29, wherein the forming of the first molding compound layer further comprises the steps of:

providing a molding compound to be heated to a liquid state, whereas the molding compound is composed of a resin and powder silicon dioxide;

pouring the liquefied molding compound on the second side of the metal carrier while allowing the molding compound to cover the dielectric material layer, the first wiring layer, the passive component and the conductive pillar layer under a high-temperature and high-pressure condition; and curing the molding compound for enabling the same to form the first molding compound layer.

33. The manufacturing method of claim 30, wherein the external component is a unit selected from the group consisting of: an active component, a passive component, a semiconductor chip and a flexible circuit board.

34. The manufacturing method of claim 29, wherein the first molding compound layer is composed of a material selected from the group consisting of novolac-based resin, epoxy-based resin, silicon-based resign and other molding compounds.

* * * * *